US009892908B2

(12) United States Patent
Pettinger et al.

(10) Patent No.: US 9,892,908 B2
(45) Date of Patent: Feb. 13, 2018

(54) PROCESS FEED MANAGEMENT FOR SEMICONDUCTOR SUBSTRATE PROCESSING

(71) Applicant: ASM America, Inc., Phoenix, AZ (US)

(72) Inventors: Fred Pettinger, Phoenix, AZ (US); Carl White, Gilbert, AZ (US); Dave Marquardt, Scottsdale, AZ (US); Sokol Ibrani, Scottsdale, AZ (US); Eric Shero, Phoenix, AZ (US); Todd Dunn, Cave Creek, AZ (US); Kyle Fondurulia, Phoenix, AZ (US); Mike Halpin, Scottsdale, AZ (US)

(73) Assignee: ASM America, Inc., Phoenix, AZ (US)

( * ) Notice: Subject to any disclaimer, the term of this patent is extended or adjusted under 35 U.S.C. 154(b) by 478 days.

(21) Appl. No.: 14/660,755

(22) Filed: Mar. 17, 2015

(65) Prior Publication Data
US 2015/0187568 A1     Jul. 2, 2015

Related U.S. Application Data

(63) Continuation of application No. 13/284,642, filed on Oct. 28, 2011, now Pat. No. 9,017,481.

(51) Int. Cl.
*H01L 21/02*    (2006.01)
*C23C 16/455*   (2006.01)
(Continued)

(52) U.S. Cl.
CPC .... *H01L 21/02104* (2013.01); *C23C 16/4409* (2013.01); *C23C 16/4411* (2013.01);
(Continued)

(58) Field of Classification Search
CPC ........... H01L 21/02104; C23C 16/4557; C23C 16/45565; C23C 16/4409; C23C 16/4411;
(Continued)

(56) References Cited

U.S. PATENT DOCUMENTS

D56,051 S    8/1920  Cohn
2,161,626 A  6/1939  Loughner et al.
(Continued)

FOREIGN PATENT DOCUMENTS

CN   1563483 A    1/2005
CN   101330015 A  12/2008
(Continued)

OTHER PUBLICATIONS

USPTO; Notice of Allowance dated Aug. 4, 2015 in U.S. Appl. No. 13/677,133.
(Continued)

*Primary Examiner* — Jeffrie R Lund
(74) *Attorney, Agent, or Firm* — Snell & Wilmer LLP

(57) ABSTRACT

Embodiments related to managing the process feed conditions for a semiconductor process module are provided. In one example, a gas channel plate for a semiconductor process module is provided. The example gas channel plate includes a heat exchange surface including a plurality of heat exchange structures separated from one another by intervening gaps. The example gas channel plate also includes a heat exchange fluid director plate support surface for supporting a heat exchange fluid director plate above the plurality of heat exchange structures so that at least a portion of the plurality of heat exchange structures are spaced from the heat exchange fluid director plate.

17 Claims, 12 Drawing Sheets

(51) Int. Cl.
*C23C 16/44* (2006.01)
*H01J 37/32* (2006.01)

(52) U.S. Cl.
CPC .... *C23C 16/4557* (2013.01); *C23C 16/45565* (2013.01); *C23C 16/45572* (2013.01); *H01J 37/3244* (2013.01); *H01J 37/32449* (2013.01); *H01J 37/32522* (2013.01); *H01J 37/32532* (2013.01)

(58) Field of Classification Search
CPC .......... C23C 16/45572; H01J 37/32449; H01J 37/3244; H01J 37/32532; H01J 37/32522
USPC ........................................ 118/715, 724, 733
See application file for complete search history.

(56) References Cited

U.S. PATENT DOCUMENTS

| | | | |
|---|---|---|---|
| 2,745,640 | A | 5/1956 | Cushman |
| 2,990,045 | A | 9/1959 | Root |
| 3,089,507 | A | 5/1963 | Drake et al. |
| 3,833,492 | A | 9/1974 | Bollyky |
| 3,854,443 | A | 12/1974 | Baerg |
| 3,862,397 | A | 1/1975 | Anderson et al. |
| 3,887,790 | A | 6/1975 | Ferguson |
| 4,054,071 | A | 10/1977 | Patejak |
| 4,058,430 | A | 11/1977 | Suntola et al. |
| 4,134,425 | A | 1/1979 | Gussefeld et al. |
| 4,145,699 | A | 3/1979 | Hu et al. |
| 4,176,630 | A | 12/1979 | Elmer |
| 4,181,330 | A | 1/1980 | Kojima |
| 4,194,536 | A | 3/1980 | Stine et al. |
| 4,322,592 | A | 3/1982 | Martin |
| 4,389,973 | A | 6/1983 | Suntola et al. |
| 4,393,013 | A | 7/1983 | McMenamin |
| 4,401,507 | A | 8/1983 | Engle |
| 4,414,492 | A | 11/1983 | Hanlet |
| 4,436,674 | A | 3/1984 | McMenamin |
| 4,499,354 | A | 2/1985 | Hill et al. |
| 4,512,113 | A | 4/1985 | Budinger |
| 4,570,328 | A | 2/1986 | Price et al. |
| 4,579,623 | A | 4/1986 | Suzuki et al. |
| D288,556 | S | 3/1987 | Wallgren |
| 4,653,541 | A | 3/1987 | Oehlschlaeger et al. |
| 4,654,226 | A | 3/1987 | Jackson et al. |
| 4,681,134 | A | 7/1987 | Paris |
| 4,718,637 | A | 1/1988 | Contin |
| 4,722,298 | A | 2/1988 | Rubin et al. |
| 4,735,259 | A | 4/1988 | Vincent |
| 4,753,192 | A | 6/1988 | Goldsmith et al. |
| 4,780,169 | A | 10/1988 | Stark et al. |
| 4,789,294 | A | 12/1988 | Sato et al. |
| 4,821,674 | A | 4/1989 | deBoer et al. |
| 4,827,430 | A | 5/1989 | Aid et al. |
| 4,837,185 | A | 6/1989 | Yau et al. |
| 4,854,263 | A | 8/1989 | Chang et al. |
| 4,857,137 | A | 8/1989 | Tashiro et al. |
| 4,857,382 | A | 8/1989 | Sheng et al. |
| 4,882,199 | A | 11/1989 | Sadoway et al. |
| 4,985,114 | A | 1/1991 | Okudaira |
| 4,986,215 | A | 1/1991 | Yamada |
| 4,987,856 | A | 1/1991 | Hey |
| 4,991,614 | A | 2/1991 | Hammel |
| 5,013,691 | A | 5/1991 | Lory et al. |
| 5,028,366 | A | 7/1991 | Harakal et al. |
| 5,060,322 | A | 10/1991 | Delepine |
| 5,062,386 | A * | 11/1991 | Christensen ........ C23C 16/4411 118/715 |
| 5,074,017 | A | 12/1991 | Toya et al. |
| 5,116,018 | A | 5/1992 | Friemoth et al. |
| D327,534 | S | 6/1992 | Manville |
| 5,119,760 | A | 6/1992 | McMillan et al. |
| 5,167,716 | A | 12/1992 | Boitnott et al. |
| 5,178,682 | A | 1/1993 | Tsukamoto et al. |
| 5,183,511 | A | 2/1993 | Yamazaki et al. |
| 5,192,717 | A | 3/1993 | Kawakami |
| 5,194,401 | A | 3/1993 | Adams et al. |
| 5,199,603 | A | 4/1993 | Prescott |
| 5,221,556 | A | 6/1993 | Hawkins et al. |
| 5,242,539 | A | 9/1993 | Kumihashi et al. |
| 5,243,195 | A | 9/1993 | Nishi |
| 5,288,684 | A | 2/1994 | Yamazaki et al. |
| 5,306,946 | A | 4/1994 | Yamamoto |
| 5,326,427 | A | 7/1994 | Jerbic |
| 5,354,580 | A | 10/1994 | Goela et al. |
| 5,356,478 | A | 10/1994 | Chen et al. |
| 5,380,367 | A | 1/1995 | Bertone |
| 5,382,311 | A | 1/1995 | Ishikawa et al. |
| 5,404,082 | A | 4/1995 | Hernandez et al. |
| 5,415,753 | A | 5/1995 | Hurwitt et al. |
| 5,421,893 | A | 6/1995 | Perlov |
| 5,422,139 | A | 6/1995 | Shinriki et al. |
| 5,430,011 | A | 7/1995 | Tanaka et al. |
| 5,447,570 | A * | 9/1995 | Schmitz ................ C23C 16/04 118/715 |
| 5,494,494 | A | 2/1996 | Mizuno et al. |
| 5,496,408 | A | 3/1996 | Motoda et al. |
| 5,504,042 | A | 4/1996 | Cho et al. |
| 5,518,549 | A | 5/1996 | Hellwig |
| 5,527,417 | A | 6/1996 | Iida et al. |
| 5,531,835 | A | 7/1996 | Fodor et al. |
| 5,574,247 | A | 11/1996 | Nishitani et al. |
| 5,589,002 | A | 12/1996 | Su |
| 5,589,110 | A | 12/1996 | Motoda et al. |
| 5,595,606 | A | 1/1997 | Fujikawa et al. |
| 5,601,641 | A | 2/1997 | Stephens |
| 5,604,410 | A | 2/1997 | Vollkommer et al. |
| 5,616,947 | A | 4/1997 | Tamura |
| 5,632,919 | A | 5/1997 | MacCracken et al. |
| D380,527 | S | 7/1997 | Velez |
| 5,679,215 | A | 10/1997 | Barnes et al. |
| 5,681,779 | A | 10/1997 | Pasch et al. |
| 5,683,517 | A | 11/1997 | Shan |
| 5,695,567 | A | 12/1997 | Kordina |
| 5,718,574 | A | 2/1998 | Shimazu |
| 5,728,223 | A | 3/1998 | Murakarni et al. |
| 5,730,801 | A | 3/1998 | Tepman et al. |
| 5,732,744 | A | 3/1998 | Barr et al. |
| 5,736,314 | A | 4/1998 | Hayes et al. |
| 5,781,693 | A | 7/1998 | Balance et al. |
| 5,796,074 | A | 8/1998 | Edelstein et al. |
| 5,801,104 | A | 9/1998 | Schuegraf et al. |
| 5,819,434 | A | 10/1998 | Herchen et al. |
| 5,827,757 | A | 10/1998 | Robinson, Jr. et al. |
| 5,836,483 | A | 11/1998 | Disel |
| 5,837,320 | A | 11/1998 | Hampden-Smith et al. |
| 5,853,484 | A | 12/1998 | Jeong |
| 5,855,680 | A | 1/1999 | Soininen et al. |
| 5,855,681 | A | 1/1999 | Maydan et al. |
| 5,873,942 | A | 2/1999 | Park |
| 5,877,095 | A | 3/1999 | Tamura et al. |
| 5,908,672 | A | 6/1999 | Ryu |
| 5,916,365 | A | 6/1999 | Sherman |
| 5,920,798 | A | 7/1999 | Higuchi et al. |
| 5,968,275 | A | 10/1999 | Lee et al. |
| 5,975,492 | A | 11/1999 | Brenes |
| 5,979,506 | A | 11/1999 | Aarseth |
| 5,997,588 | A | 12/1999 | Goodwin |
| D419,652 | S | 1/2000 | Hall et al. |
| 6,013,553 | A | 1/2000 | Wallace |
| 6,015,465 | A | 1/2000 | Kholodenko et al. |
| 6,017,779 | A | 1/2000 | Miyasaka |
| 6,024,799 | A | 2/2000 | Chen |
| 6,035,101 | A | 3/2000 | Sajoto et al. |
| 6,042,652 | A | 3/2000 | Hyun |
| 6,044,860 | A | 4/2000 | Nue |
| 6,050,506 | A | 4/2000 | Guo et al. |
| 6,060,691 | A | 5/2000 | Minami et al. |
| 6,074,443 | A | 6/2000 | Venkatesh |
| 6,083,321 | A | 7/2000 | Lei et al. |
| 6,086,677 | A | 7/2000 | Umotoy et al. |
| 6,099,302 | A | 8/2000 | Hong et al. |
| 6,122,036 | A | 9/2000 | Yamasaki et al. |
| 6,124,600 | A | 9/2000 | Moroishi et al. |

(56) References Cited

U.S. PATENT DOCUMENTS

| | | | |
|---|---|---|---|
| 6,125,789 A | 10/2000 | Gupta et al. |
| 6,129,044 A | 10/2000 | Zhao et al. |
| 6,129,046 A * | 10/2000 | Mizuno | C23C 16/45521 |
| | | | 118/725 |
| 6,137,240 A | 10/2000 | Bogdan et al. |
| 6,140,252 A | 10/2000 | Cho et al. |
| 6,148,761 A | 11/2000 | Majewski et al. |
| 6,160,244 A | 12/2000 | Ohashi |
| 6,161,500 A | 12/2000 | Kopacz et al. |
| 6,162,323 A | 12/2000 | Koshimizu et al. |
| 6,180,979 B1 | 1/2001 | Hofman et al. |
| 6,187,691 B1 | 2/2001 | Fukuda |
| 6,194,037 B1 | 2/2001 | Terasaki et al. |
| 6,201,999 B1 | 3/2001 | Jevtic |
| 6,207,932 B1 | 3/2001 | Yoo |
| 6,250,250 B1 | 6/2001 | Maishev et al. |
| 6,271,148 B1 | 8/2001 | Kao |
| 6,274,878 B1 | 8/2001 | Li et al. |
| 6,287,965 B1 | 9/2001 | Kang et al. |
| D449,873 S | 10/2001 | Bronson |
| 6,296,909 B1 | 10/2001 | Spitsberg |
| 6,299,133 B2 | 10/2001 | Waragai et al. |
| 6,302,964 B1 | 10/2001 | Umotoy et al. |
| 6,303,523 B2 | 10/2001 | Cheung |
| 6,305,898 B1 | 10/2001 | Yamagishi et al. |
| 6,312,525 B1 | 11/2001 | Bright et al. |
| 6,315,512 B1 | 11/2001 | Tabrizi et al. |
| D451,893 S | 12/2001 | Robson |
| D452,220 S | 12/2001 | Robson |
| 6,326,597 B1 | 12/2001 | Lubomirsky et al. |
| 6,329,297 B1 | 12/2001 | Balish |
| 6,342,427 B1 | 1/2002 | Choi et al. |
| 6,347,636 B1 | 2/2002 | Xia |
| 6,350,320 B1 * | 2/2002 | Sherstinsky | H01J 37/3244 |
| | | | 118/500 |
| 6,352,945 B1 | 3/2002 | Matsuki |
| 6,367,410 B1 | 4/2002 | Leahey et al. |
| 6,368,987 B1 | 4/2002 | Kopacz et al. |
| 6,370,796 B1 | 4/2002 | Zucker |
| 6,372,583 B1 | 4/2002 | Tyagi |
| 6,374,831 B1 | 4/2002 | Chandran |
| 6,375,312 B1 | 4/2002 | Ikeda et al. |
| D457,609 S | 5/2002 | Piano |
| 6,383,566 B1 | 5/2002 | Zagdoun |
| 6,383,955 B1 | 5/2002 | Matsuki |
| 6,387,207 B1 | 5/2002 | Janakiraman |
| 6,391,803 B1 | 5/2002 | Kim et al. |
| 6,398,184 B1 | 6/2002 | Sowada et al. |
| 6,410,459 B2 | 6/2002 | Blalock et al. |
| 6,413,321 B1 | 7/2002 | Kim et al. |
| 6,413,583 B1 | 7/2002 | Moghadam et al. |
| 6,420,279 B1 | 7/2002 | Ono et al. |
| D461,233 S | 8/2002 | Whalen |
| D461,882 S | 8/2002 | Piano |
| 6,435,798 B1 | 8/2002 | Satoh |
| 6,436,819 B1 | 8/2002 | Zhang |
| 6,437,444 B2 | 8/2002 | Andideh |
| 6,446,573 B2 | 9/2002 | Hirayama et al. |
| 6,450,757 B1 | 9/2002 | Saeki |
| 6,454,860 B2 | 9/2002 | Metzner et al. |
| 6,455,445 B2 | 9/2002 | Matsuki |
| 6,461,435 B1 * | 10/2002 | Littau | C23C 16/455 |
| | | | 118/715 |
| 6,468,924 B2 | 10/2002 | Lee |
| 6,472,266 B1 | 10/2002 | Yu et al. |
| 6,475,930 B1 | 11/2002 | Junker et al. |
| 6,478,872 B1 | 11/2002 | Chae et al. |
| 6,482,331 B2 | 11/2002 | Lu et al. |
| 6,482,663 B1 | 11/2002 | Buckland |
| 6,483,989 B1 | 11/2002 | Okada et al. |
| 6,499,533 B2 | 12/2002 | Yamada |
| 6,503,562 B1 | 1/2003 | Saito et al. |
| 6,503,826 B1 | 1/2003 | Oda |
| 6,511,539 B1 | 1/2003 | Raaijmakers |
| 6,521,295 B1 | 2/2003 | Remington |
| 6,521,547 B1 | 2/2003 | Chang et al. |
| 6,528,430 B2 | 3/2003 | Kwan |
| 6,528,767 B2 | 3/2003 | Bagley et al. |
| 6,531,193 B2 | 3/2003 | Fonash et al. |
| 6,531,412 B2 | 3/2003 | Conti et al. |
| 6,534,395 B2 | 3/2003 | Werkhoven et al. |
| 6,569,239 B2 | 5/2003 | Arai et al. |
| 6,573,030 B1 | 6/2003 | Fairbairn et al. |
| 6,576,062 B2 | 6/2003 | Matsuse |
| 6,576,064 B2 | 6/2003 | Griffiths et al. |
| 6,576,300 B1 | 6/2003 | Berry et al. |
| 6,579,372 B2 * | 6/2003 | Park | C23C 16/45544 |
| | | | 118/715 |
| 6,579,833 B1 | 6/2003 | McNallan et al. |
| 6,583,048 B1 | 6/2003 | Vincent et al. |
| 6,590,251 B2 | 7/2003 | Kang et al. |
| 6,594,550 B1 | 7/2003 | Okrah |
| 6,598,559 B1 | 7/2003 | Vellore et al. |
| 6,602,346 B1 * | 8/2003 | Gochberg | H01L 21/67126 |
| | | | 118/715 |
| 6,627,503 B2 | 9/2003 | Ma et al. |
| 6,632,478 B2 | 10/2003 | Gaillard et al. |
| 6,633,364 B2 | 10/2003 | Hayashi |
| 6,635,117 B1 | 10/2003 | Kinnard et al. |
| 6,638,839 B2 | 10/2003 | Deng et al. |
| 6,645,304 B2 | 11/2003 | Yamaguchi |
| 6,648,974 B1 | 11/2003 | Ogliari et al. |
| 6,649,921 B1 | 11/2003 | Cekic et al. |
| 6,652,924 B2 | 11/2003 | Sherman |
| 6,673,196 B1 | 1/2004 | Oyabu |
| 6,682,973 B1 | 1/2004 | Paton et al. |
| D486,891 S | 2/2004 | Cronce |
| 6,688,784 B1 | 2/2004 | Templeton |
| 6,689,220 B1 | 2/2004 | Nguyen |
| 6,692,575 B1 | 2/2004 | Omstead et al. |
| 6,692,576 B2 | 2/2004 | Halpin et al. |
| 6,699,003 B2 | 3/2004 | Saeki |
| 6,709,989 B2 | 3/2004 | Ramdani et al. |
| 6,710,364 B2 | 3/2004 | Guldi et al. |
| 6,712,909 B2 * | 3/2004 | Tometsuka | C23C 16/4401 |
| | | | 118/725 |
| 6,716,571 B2 | 4/2004 | Gabriel |
| 6,730,614 B1 | 5/2004 | Lim et al. |
| 6,734,090 B2 | 5/2004 | Agarwala et al. |
| 6,740,853 B1 | 5/2004 | Kitayama et al. |
| 6,743,475 B2 | 6/2004 | Skarp et al. |
| 6,743,738 B2 | 6/2004 | Todd et al. |
| 6,753,507 B2 | 6/2004 | Fure et al. |
| 6,756,318 B2 | 6/2004 | Nguyen et al. |
| 6,759,098 B2 | 7/2004 | Han |
| 6,784,108 B1 | 8/2004 | Donohoe et al. |
| 6,815,350 B2 | 11/2004 | Kim et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,825,134 B2 | 11/2004 | Law et al. |
| 6,846,515 B2 | 1/2005 | Vrtis |
| 6,847,014 B1 | 1/2005 | Benjamin et al. |
| 6,858,524 B2 | 2/2005 | Haukka et al. |
| 6,858,547 B2 | 2/2005 | Metzner |
| 6,863,019 B2 | 3/2005 | Shamouilian |
| 6,864,041 B2 | 3/2005 | Brown |
| 6,872,258 B2 | 3/2005 | Park et al. |
| 6,872,259 B2 | 3/2005 | Strang |
| 6,874,480 B1 | 4/2005 | Ismailov |
| 6,875,677 B1 | 4/2005 | Conley, Jr. et al. |
| 6,876,017 B2 | 4/2005 | Goodner |
| 6,884,066 B2 | 4/2005 | Nguyen et al. |
| 6,884,319 B2 | 4/2005 | Kim |
| 6,889,864 B2 | 5/2005 | Lindfors et al. |
| 6,895,158 B2 | 5/2005 | Alyward et al. |
| 6,899,507 B2 | 5/2005 | Yamagishi et al. |
| 6,909,839 B2 | 6/2005 | Wang et al. |
| 6,911,092 B2 | 6/2005 | Sneh |
| 6,913,796 B2 | 7/2005 | Albano et al. |
| 6,930,059 B2 | 8/2005 | Conley, Jr. et al. |
| 6,935,269 B2 | 8/2005 | Lee et al. |
| 6,939,817 B2 | 9/2005 | Sandhu et al. |
| 6,951,587 B1 | 10/2005 | Narushima |

(56) References Cited

U.S. PATENT DOCUMENTS

| | | |
|---|---|---|
| 6,953,609 B2 | 10/2005 | Carollo |
| 6,955,836 B2 | 10/2005 | Kumagai et al. |
| 6,972,478 B1 | 12/2005 | Waite et al. |
| 6,974,781 B2 | 12/2005 | Timmermans et al. |
| 6,976,822 B2 | 12/2005 | Woodruff |
| 6,984,595 B1 | 1/2006 | Yamazaki |
| 6,990,430 B2 | 1/2006 | Hosek |
| 7,021,881 B2 | 4/2006 | Yamagishi |
| 7,045,430 B2 | 5/2006 | Ahn et al. |
| 7,049,247 B2 | 5/2006 | Gates et al. |
| 7,053,009 B2 | 5/2006 | Conley, Jr. et al. |
| 7,055,875 B2 | 6/2006 | Bonora |
| 7,071,051 B1 | 7/2006 | Jeon et al. |
| 7,084,079 B2 | 8/2006 | Conti et al. |
| 7,088,003 B2 | 8/2006 | Gates et al. |
| 7,092,287 B2 | 8/2006 | Beulens et al. |
| 7,098,149 B2 | 8/2006 | Lukas |
| 7,109,098 B1 | 9/2006 | Ramaswamy et al. |
| 7,115,838 B2 | 10/2006 | Kurara et al. |
| 7,122,085 B2 | 10/2006 | Shero et al. |
| 7,122,222 B2 | 10/2006 | Xiao et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,143,897 B1 | 12/2006 | Guzman et al. |
| 7,147,766 B2 | 12/2006 | Uzoh et al. |
| 7,153,542 B2 | 12/2006 | Nguyen et al. |
| 7,163,721 B2 | 1/2007 | Zhang et al. |
| 7,163,900 B2 | 1/2007 | Weber |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,246 B2 | 4/2007 | MacNeil et al. |
| 7,205,247 B2 | 4/2007 | Lee et al. |
| 7,207,763 B2 | 4/2007 | Lee |
| 7,208,389 B1 | 4/2007 | Tipton et al. |
| 7,211,524 B2 | 5/2007 | Ryu et al. |
| 7,234,476 B2 | 6/2007 | Arai |
| 7,235,137 B2 | 6/2007 | Kitayama et al. |
| 7,235,482 B2 | 6/2007 | Wu |
| 7,235,501 B2 | 6/2007 | Ahn et al. |
| 7,238,596 B2 | 7/2007 | Kouvetakis et al. |
| 7,265,061 B1 | 9/2007 | Cho et al. |
| D553,104 S | 10/2007 | Oohashi et al. |
| 7,290,813 B2 | 11/2007 | Bonora |
| 7,294,581 B2 | 11/2007 | Haverkort et al. |
| 7,297,641 B2 | 11/2007 | Todd et al. |
| 7,298,009 B2 | 11/2007 | Yan et al. |
| D557,226 S | 12/2007 | Uchino et al. |
| 7,307,178 B2 | 12/2007 | Kiyomori et al. |
| 7,312,148 B2 | 12/2007 | Ramaswamy et al. |
| 7,312,162 B2 | 12/2007 | Ramaswamy et al. |
| 7,312,494 B2 | 12/2007 | Ahn et al. |
| 7,323,401 B2 | 1/2008 | Ramaswamy et al. |
| 7,326,657 B2 | 2/2008 | Xia et al. |
| 7,327,948 B1 | 2/2008 | Shrinivasan |
| 7,329,947 B2 | 2/2008 | Adachi et al. |
| 7,335,611 B2 | 2/2008 | Ramaswamy et al. |
| 7,354,847 B2 | 4/2008 | Chan et al. |
| 7,357,138 B2 | 4/2008 | Ji et al. |
| 7,393,418 B2 | 7/2008 | Yokogawa |
| 7,393,736 B2 | 7/2008 | Ahn et al. |
| 7,393,765 B2 | 7/2008 | Hanawa et al. |
| 7,396,491 B2 | 7/2008 | Marking et al. |
| 7,399,388 B2 | 7/2008 | Moghadam et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow |
| 7,422,775 B2 | 9/2008 | Ramaswamy et al. |
| 7,429,532 B2 | 9/2008 | Ramaswamy et al. |
| 7,431,966 B2 | 10/2008 | Derderian et al. |
| 7,437,060 B2 | 10/2008 | Wang et al. |
| 7,442,275 B2 | 10/2008 | Cowans |
| 7,476,291 B2 | 1/2009 | Wang et al. |
| 7,479,198 B2 | 1/2009 | Guffrey |
| D585,968 S | 2/2009 | Elkins et al. |
| 7,489,389 B2 | 2/2009 | Shibazaki et al. |
| 7,498,242 B2 | 3/2009 | Kumar et al. |
| 7,501,292 B2 | 3/2009 | Matsushita et al. |
| 7,503,980 B2 | 3/2009 | Kido et al. |
| 7,514,375 B1 | 4/2009 | Shanker et al. |
| 7,541,297 B2 | 4/2009 | Mallick et al. |
| D593,969 S | 6/2009 | Li |
| 7,547,363 B2 | 6/2009 | Tomiyasu et al. |
| 7,566,891 B2 | 7/2009 | Rocha-Alvarez et al. |
| 7,575,968 B2 | 8/2009 | Sadaka et al. |
| 7,579,785 B2 | 8/2009 | DeVincentis et al. |
| 7,582,555 B1 | 9/2009 | Lang |
| 7,589,003 B2 | 9/2009 | Kouvetakis et al. |
| 7,589,029 B2 | 9/2009 | Derderian et al. |
| D602,575 S | 10/2009 | Breda |
| 7,601,223 B2 | 10/2009 | Lindfors et al. |
| 7,601,225 B2 | 10/2009 | Tuominen et al. |
| 7,611,980 B2 | 11/2009 | Wells et al. |
| 7,618,226 B2 | 11/2009 | Takizawa |
| 7,618,493 B2 * | 11/2009 | Yamada ............... C23C 16/4401 118/715 |
| 7,629,277 B2 | 12/2009 | Ghatnagar |
| 7,632,549 B2 | 12/2009 | Goundar |
| 7,640,142 B2 | 12/2009 | Tachikawa et al. |
| 7,651,568 B2 * | 1/2010 | Ishizaka ............... C23C 16/4404 118/715 |
| 7,651,583 B2 | 1/2010 | Kent et al. |
| 7,651,961 B2 | 1/2010 | Clark |
| D609,655 S | 2/2010 | Sugimoto |
| 7,678,197 B2 | 3/2010 | Maki |
| 7,682,657 B2 | 3/2010 | Sherman |
| D613,829 S | 4/2010 | Griffin et al. |
| D614,153 S | 4/2010 | Fondurulia et al. |
| D614,267 S | 4/2010 | Breda |
| D614,268 S | 4/2010 | Breda |
| 7,690,881 B2 | 4/2010 | Yamagishi |
| 7,691,205 B2 | 4/2010 | Ikedo |
| 7,713,874 B2 | 5/2010 | Milligan |
| 7,720,560 B2 | 5/2010 | Menser et al. |
| 7,723,648 B2 | 5/2010 | Tsukamoto et al. |
| 7,727,864 B2 | 6/2010 | Elers |
| 7,732,343 B2 | 6/2010 | Niroomand et al. |
| 7,740,705 B2 | 6/2010 | Li |
| 7,767,262 B2 | 8/2010 | Clark |
| 7,780,440 B2 | 8/2010 | Shibagaki et al. |
| 7,789,965 B2 | 9/2010 | Matsushita et al. |
| 7,790,633 B1 | 9/2010 | Tarafdar et al. |
| 7,803,722 B2 | 9/2010 | Liang |
| 7,807,578 B2 | 10/2010 | Bencher et al. |
| 7,816,278 B2 | 10/2010 | Reed et al. |
| 7,824,492 B2 | 11/2010 | Tois et al. |
| 7,825,040 B1 | 11/2010 | Fukazawa et al. |
| 7,833,353 B2 | 11/2010 | Furukawahara et al. |
| 7,838,084 B2 | 11/2010 | Derderian et al. |
| 7,842,518 B2 | 11/2010 | Miyajima |
| 7,842,622 B1 | 11/2010 | Lee et al. |
| D629,874 S | 12/2010 | Hermans |
| 7,851,019 B2 | 12/2010 | Tuominen et al. |
| 7,851,232 B2 | 12/2010 | van Schravendijk et al. |
| 7,865,070 B2 | 1/2011 | Nakamura |
| 7,884,918 B2 | 2/2011 | Hattori |
| 7,888,233 B1 | 2/2011 | Gauri |
| D634,719 S | 3/2011 | Yasuda et al. |
| 7,897,215 B2 | 3/2011 | Fair et al. |
| 7,902,582 B2 | 3/2011 | Forbes et al. |
| 7,910,288 B2 | 3/2011 | Abatchev et al. |
| 7,915,139 B1 | 3/2011 | Lang |
| 7,919,416 B2 | 4/2011 | Lee et al. |
| 7,925,378 B2 | 4/2011 | Gilchrist et al. |
| 7,935,940 B1 | 5/2011 | Smargiassi |
| 7,963,736 B2 | 6/2011 | Takizawa et al. |
| 7,972,980 B2 | 7/2011 | Lee et al. |
| 7,981,751 B2 | 7/2011 | Zhu et al. |
| D643,055 S | 8/2011 | Takahashi |
| 7,994,721 B2 | 8/2011 | Espiau et al. |

(56) References Cited

U.S. PATENT DOCUMENTS

| | | |
|---|---|---|
| 8,003,174 B2 | 8/2011 | Fukazawa |
| 8,004,198 B2 | 8/2011 | Bakre et al. |
| 8,038,835 B2 | 10/2011 | Hayashi et al. |
| 8,041,197 B2 | 10/2011 | Kasai et al. |
| 8,041,450 B2 | 10/2011 | Takizawa et al. |
| 8,055,378 B2 | 11/2011 | Numakura |
| 8,060,252 B2 | 11/2011 | Gage et al. |
| 8,071,451 B2 | 12/2011 | Uzoh |
| 8,071,452 B2 | 12/2011 | Raisanen |
| 8,072,578 B2 | 12/2011 | Yasuda et al. |
| 8,076,230 B2 | 12/2011 | Wei |
| 8,076,237 B2 | 12/2011 | Uzoh |
| 8,082,946 B2 | 12/2011 | Laverdiere et al. |
| D652,896 S | 1/2012 | Gether |
| 8,092,604 B2 | 1/2012 | Tomiyasu et al. |
| D653,734 S | 2/2012 | Sisk |
| D655,055 S | 2/2012 | Toll |
| 8,137,462 B2 | 3/2012 | Fondurulia et al. |
| 8,137,465 B1 | 3/2012 | Shrinivasan et al. |
| 8,138,676 B2 | 3/2012 | Mills |
| 8,142,862 B2 | 3/2012 | Lee et al. |
| 8,143,174 B2 | 3/2012 | Xia et al. |
| 8,147,242 B2 | 4/2012 | Shibagaki et al. |
| 8,173,554 B2 | 5/2012 | Lee et al. |
| 8,187,951 B1 | 5/2012 | Wang |
| 8,192,901 B2 | 6/2012 | Kageyama |
| 8,196,234 B2 | 6/2012 | Glunk |
| 8,197,915 B2 | 6/2012 | Oka et al. |
| 8,216,380 B2 | 7/2012 | White et al. |
| 8,231,799 B2 | 7/2012 | Bera et al. |
| D665,055 S | 8/2012 | Yanagisawa et al. |
| 8,241,991 B2 | 8/2012 | Hsieh et al. |
| 8,242,031 B2 | 8/2012 | Mallick et al. |
| 8,252,114 B2 | 8/2012 | Vukovic |
| 8,252,116 B2 * | 8/2012 | Sneh .................. C23C 14/566 118/50 |
| 8,252,659 B2 | 8/2012 | Huyghabaert et al. |
| 8,252,691 B2 | 8/2012 | Beynet et al. |
| 8,278,176 B2 | 10/2012 | Bauer et al. |
| 8,282,769 B2 * | 10/2012 | Iizuka ................. H01J 37/3244 118/715 |
| 8,287,648 B2 | 10/2012 | Reed et al. |
| 8,293,016 B2 | 10/2012 | Bahng et al. |
| 8,298,951 B1 | 10/2012 | Nakano |
| 8,307,472 B1 | 11/2012 | Saxon et al. |
| 8,309,173 B2 | 11/2012 | Tuominen et al. |
| 8,323,413 B2 | 12/2012 | Son |
| 8,329,599 B2 | 12/2012 | Fukazawa et al. |
| 8,334,219 B2 | 12/2012 | Lee et al. |
| 8,367,528 B2 | 2/2013 | Bauer et al. |
| 8,372,204 B2 | 2/2013 | Nakamura |
| 8,394,466 B2 | 3/2013 | Hong et al. |
| 8,415,259 B2 | 4/2013 | Lee et al. |
| 8,440,259 B2 | 5/2013 | Chiang et al. |
| 8,444,120 B2 | 5/2013 | Gregg et al. |
| 8,454,749 B2 * | 6/2013 | Li ...................... C23C 16/4401 118/715 |
| 8,465,811 B2 | 6/2013 | Ueda |
| 8,466,411 B2 | 6/2013 | Arai |
| 8,470,187 B2 | 6/2013 | Ha |
| 8,484,846 B2 | 7/2013 | Dhindsa |
| 8,496,756 B2 | 7/2013 | Cruse et al. |
| 8,506,713 B2 | 8/2013 | Takagi |
| 8,535,767 B1 | 9/2013 | Kimura |
| D691,974 S | 10/2013 | Osada et al. |
| 8,551,892 B2 | 10/2013 | Nakano |
| 8,563,443 B2 | 10/2013 | Fukazawa |
| 8,569,184 B2 | 10/2013 | Oka |
| 8,591,659 B1 | 11/2013 | Fang et al. |
| 8,592,005 B2 | 11/2013 | Ueda |
| 8,608,885 B2 | 11/2013 | Goto et al. |
| 8,647,722 B2 | 2/2014 | Kobayashi et al. |
| 8,664,627 B1 | 3/2014 | Ishikawa et al. |
| 8,669,185 B2 | 3/2014 | Onizawa |
| 8,683,943 B2 | 4/2014 | Onodera et al. |
| 8,711,338 B2 | 4/2014 | Liu et al. |
| D705,745 S | 5/2014 | Kurs et al. |
| 8,720,965 B2 | 5/2014 | Hino et al. |
| 8,722,546 B2 | 5/2014 | Fukazawa et al. |
| 8,726,837 B2 | 5/2014 | Patalay et al. |
| 8,728,832 B2 | 5/2014 | Raisanen et al. |
| 8,742,668 B2 | 6/2014 | Nakano et al. |
| 8,764,085 B2 | 7/2014 | Urabe |
| 8,784,950 B2 | 7/2014 | Fukazawa et al. |
| 8,784,951 B2 | 7/2014 | Fukazawa et al. |
| 8,785,215 B2 | 7/2014 | Kobayashi et al. |
| 8,790,749 B2 | 7/2014 | Omori et al. |
| 8,802,201 B2 | 8/2014 | Raisanen et al. |
| 8,820,809 B2 | 9/2014 | Ando et al. |
| 8,821,640 B2 | 9/2014 | Cleary et al. |
| 8,845,806 B2 | 9/2014 | Aida et al. |
| D715,410 S | 10/2014 | Lohmann |
| 8,864,202 B1 | 10/2014 | Schrameyer |
| D716,742 S | 11/2014 | Jang et al. |
| 8,877,655 B2 | 11/2014 | Shero et al. |
| 8,883,270 B2 | 11/2014 | Shero et al. |
| 8,901,016 B2 | 12/2014 | Ha et al. |
| 8,911,826 B2 | 12/2014 | Adachi et al. |
| 8,912,101 B2 | 12/2014 | Tsuji et al. |
| D720,838 S | 1/2015 | Yamagishi et al. |
| 8,933,375 B2 | 1/2015 | Dunn et al. |
| 8,940,646 B1 | 1/2015 | Chandrasekharan |
| 8,946,830 B2 | 2/2015 | Jung et al. |
| D724,701 S | 3/2015 | Yamagishi et al. |
| 8,967,608 B2 | 3/2015 | Mitsumori et al. |
| 8,986,456 B2 | 3/2015 | Fondurulia et al. |
| 8,991,887 B2 | 3/2015 | Shin et al. |
| 8,993,054 B2 | 3/2015 | Jung et al. |
| D726,884 S | 4/2015 | Yamagishi et al. |
| 9,005,539 B2 | 4/2015 | Halpin et al. |
| 9,017,481 B1 * | 4/2015 | Pettinger ............ H01J 37/3244 118/715 |
| 9,018,093 B2 | 4/2015 | Tsuji et al. |
| 9,018,111 B2 | 4/2015 | Milligan et al. |
| 9,021,985 B2 | 5/2015 | Alokozai et al. |
| 9,023,737 B2 | 5/2015 | Beynet et al. |
| 9,029,253 B2 | 5/2015 | Milligan et al. |
| 9,029,272 B1 | 5/2015 | Nakano |
| D732,644 S | 6/2015 | Yamagishi et al. |
| D733,261 S | 6/2015 | Yamagishi et al. |
| D733,843 S | 7/2015 | Yamagishi et al. |
| 9,096,931 B2 | 8/2015 | Yednak et al. |
| 9,117,657 B2 | 8/2015 | Nakano et al. |
| 9,123,510 B2 | 9/2015 | Nakano et al. |
| 9,136,108 B2 | 9/2015 | Matsushita et al. |
| 9,142,393 B2 | 9/2015 | Okabe et al. |
| 9,171,716 B2 | 10/2015 | Fukuda |
| 9,190,263 B2 | 11/2015 | Ishikawa et al. |
| 9,202,727 B2 | 12/2015 | Dunn et al. |
| 2001/0017103 A1 | 8/2001 | Takeshita et al. |
| 2001/0018267 A1 | 8/2001 | Shinriki et al. |
| 2001/0019777 A1 | 9/2001 | Tanaka et al. |
| 2001/0019900 A1 | 9/2001 | Hasegawa |
| 2001/0028924 A1 | 10/2001 | Sherman |
| 2001/0046765 A1 | 11/2001 | Cappellani et al. |
| 2001/0049202 A1 | 12/2001 | Maeda et al. |
| 2002/0001974 A1 | 1/2002 | Chan |
| 2002/0011210 A1 | 1/2002 | Satoh et al. |
| 2002/0014204 A1 | 2/2002 | Pyo |
| 2002/0064592 A1 | 5/2002 | Datta et al. |
| 2002/0076490 A1 * | 6/2002 | Chiang ............... C23C 16/0227 427/248.1 |
| 2002/0076507 A1 | 6/2002 | Chiang et al. |
| 2002/0079714 A1 | 6/2002 | Soucy et al. |
| 2002/0088542 A1 | 7/2002 | Nishikawa et al. |
| 2002/0098627 A1 | 7/2002 | Pomarede et al. |
| 2002/0108670 A1 | 8/2002 | Baker et al. |
| 2002/0110991 A1 | 8/2002 | Li |
| 2002/0114886 A1 | 8/2002 | Chou et al. |
| 2002/0115252 A1 | 8/2002 | Haukka et al. |
| 2002/0172768 A1 | 11/2002 | Endo et al. |
| 2002/0179011 A1 * | 12/2002 | Jonnalagadda ....... C23C 16/455 118/715 |
| 2002/0187650 A1 | 12/2002 | Blalock et al. |

(56) References Cited

U.S. PATENT DOCUMENTS

| | | |
|---|---|---|
| 2002/0197849 A1 | 12/2002 | Mandal |
| 2003/0003635 A1 | 1/2003 | Paranjpe et al. |
| 2003/0010452 A1 | 1/2003 | Park et al. |
| 2003/0012632 A1 | 1/2003 | Saeki |
| 2003/0019428 A1 | 1/2003 | Ku et al. |
| 2003/0019580 A1 | 1/2003 | Strang |
| 2003/0025146 A1 | 2/2003 | Narwankar et al. |
| 2003/0040158 A1 | 2/2003 | Saitoh |
| 2003/0042419 A1 | 3/2003 | Katsumata et al. |
| 2003/0049375 A1 | 3/2003 | Nguyen et al. |
| 2003/0054670 A1 | 3/2003 | Wang et al. |
| 2003/0059535 A1 | 3/2003 | Luo et al. |
| 2003/0059980 A1 | 3/2003 | Chen et al. |
| 2003/0066826 A1 | 4/2003 | Lee et al. |
| 2003/0075925 A1 | 4/2003 | Lindfors et al. |
| 2003/0091938 A1 | 5/2003 | Fairbairn et al. |
| 2003/0094133 A1 | 5/2003 | Yoshidome et al. |
| 2003/0111963 A1 | 6/2003 | Tolmachev et al. |
| 2003/0134038 A1 | 7/2003 | Paranjpe |
| 2003/0141820 A1 | 7/2003 | White et al. |
| 2003/0157436 A1 | 8/2003 | Manger et al. |
| 2003/0168001 A1 | 9/2003 | Sneh |
| 2003/0170583 A1 | 9/2003 | Nakashima |
| 2003/0180458 A1 | 9/2003 | Sneh |
| 2003/0183156 A1 | 10/2003 | Dando |
| 2003/0198587 A1 | 10/2003 | Kaloyeros |
| 2003/0209323 A1 | 11/2003 | Yokogaki |
| 2003/0228772 A1* | 12/2003 | Cowans ............ H01J 37/32724 438/795 |
| 2003/0232138 A1 | 12/2003 | Tuominen et al. |
| 2004/0009679 A1 | 1/2004 | Yeo et al. |
| 2004/0013577 A1 | 1/2004 | Ganguli et al. |
| 2004/0013818 A1 | 1/2004 | Moon et al. |
| 2004/0018307 A1 | 1/2004 | Park et al. |
| 2004/0018750 A1 | 1/2004 | Sophie et al. |
| 2004/0023516 A1 | 2/2004 | Londergan et al. |
| 2004/0029052 A1 | 2/2004 | Park et al. |
| 2004/0036129 A1 | 2/2004 | Forbes et al. |
| 2004/0106249 A1 | 2/2004 | Huotari |
| 2004/0063289 A1 | 4/2004 | Ohta |
| 2004/0071897 A1 | 4/2004 | Verplancken |
| 2004/0077182 A1 | 4/2004 | Lim et al. |
| 2004/0079960 A1 | 4/2004 | Shakuda |
| 2004/0080697 A1 | 4/2004 | Song |
| 2004/0082171 A1 | 4/2004 | Shin et al. |
| 2004/0101622 A1 | 5/2004 | Park et al. |
| 2004/0103914 A1 | 6/2004 | Cheng et al. |
| 2004/0124549 A1 | 7/2004 | Curran |
| 2004/0134429 A1 | 7/2004 | Yamanaka |
| 2004/0144980 A1 | 7/2004 | Ahn et al. |
| 2004/0146644 A1 | 7/2004 | Xia et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0209477 A1 | 10/2004 | Buxbaum et al. |
| 2004/0212947 A1 | 10/2004 | Nguyen |
| 2004/0219793 A1 | 11/2004 | Hishiya et al. |
| 2004/0221807 A1 | 11/2004 | Verghese et al. |
| 2004/0247779 A1 | 12/2004 | Selvamanickam et al. |
| 2004/0261712 A1 | 12/2004 | Hayashi et al. |
| 2004/0266011 A1 | 12/2004 | Lee et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0034674 A1 | 2/2005 | Ono |
| 2005/0037154 A1 | 2/2005 | Koh et al. |
| 2005/0051093 A1 | 3/2005 | Makino et al. |
| 2005/0054228 A1 | 3/2005 | March |
| 2005/0059262 A1 | 3/2005 | Yin et al. |
| 2005/0064207 A1 | 3/2005 | Senzaki et al. |
| 2005/0064719 A1 | 3/2005 | Liu |
| 2005/0066893 A1 | 3/2005 | Soininen |
| 2005/0069651 A1 | 3/2005 | Miyoshi |
| 2005/0070123 A1 | 3/2005 | Hirano |
| 2005/0070729 A1 | 3/2005 | Kiyomori et al. |
| 2005/0072357 A1 | 4/2005 | Shero et al. |
| 2005/0074983 A1 | 4/2005 | Shinriki et al. |
| 2005/0092249 A1 | 5/2005 | Kilpela et al. |
| 2005/0095770 A1 | 5/2005 | Kumagai et al. |
| 2005/0100669 A1 | 5/2005 | Kools et al. |
| 2005/0101154 A1 | 5/2005 | Huang |
| 2005/0106893 A1 | 5/2005 | Wilk |
| 2005/0110069 A1 | 5/2005 | Kil et al. |
| 2005/0120962 A1 | 6/2005 | Ushioda et al. |
| 2005/0123690 A1 | 6/2005 | Derderian et al. |
| 2005/0133161 A1 | 6/2005 | Carpenter et al. |
| 2005/0142361 A1 | 6/2005 | Nakanishi |
| 2005/0145338 A1 | 7/2005 | Park et al. |
| 2005/0153571 A1 | 7/2005 | Senzaki |
| 2005/0173003 A1 | 8/2005 | Laverdiere et al. |
| 2005/0181535 A1 | 8/2005 | Yun et al. |
| 2005/0187647 A1 | 8/2005 | Wang et al. |
| 2005/0191828 A1 | 9/2005 | Al-Bayati et al. |
| 2005/0208718 A1 | 9/2005 | Lim et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0221618 A1 | 10/2005 | AmRhein et al. |
| 2005/0223994 A1 | 10/2005 | Blomiley et al. |
| 2005/0227502 A1 | 10/2005 | Schmitt et al. |
| 2005/0229848 A1 | 10/2005 | Shinriki |
| 2005/0229972 A1 | 10/2005 | Hoshi et al. |
| 2005/0241176 A1 | 11/2005 | Shero et al. |
| 2005/0241763 A1 | 11/2005 | Huang et al. |
| 2005/0255257 A1 | 11/2005 | Choi et al. |
| 2005/0258280 A1 | 11/2005 | Goto et al. |
| 2005/0260347 A1 | 11/2005 | Narwankar et al. |
| 2005/0260850 A1 | 11/2005 | Loke |
| 2005/0263075 A1 | 12/2005 | Wang et al. |
| 2005/0263932 A1 | 12/2005 | Heugel |
| 2005/0271813 A1 | 12/2005 | Kher et al. |
| 2005/0274323 A1 | 12/2005 | Seidel et al. |
| 2005/0282101 A1 | 12/2005 | Adachi |
| 2005/0287725 A1 | 12/2005 | Kitagawa |
| 2005/0287771 A1 | 12/2005 | Seamons et al. |
| 2006/0013946 A1 | 1/2006 | Park et al. |
| 2006/0014384 A1 | 1/2006 | Lee et al. |
| 2006/0014397 A1 | 1/2006 | Seamons et al. |
| 2006/0016783 A1 | 1/2006 | Wu et al. |
| 2006/0019033 A1 | 1/2006 | Muthukrishnan et al. |
| 2006/0019502 A1 | 1/2006 | Park et al. |
| 2006/0021703 A1 | 2/2006 | Umotoy et al. |
| 2006/0024439 A2 | 2/2006 | Tuominen et al. |
| 2006/0046518 A1 | 3/2006 | Hill et al. |
| 2006/0051520 A1 | 3/2006 | Behle et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068121 A1 | 3/2006 | Lee et al. |
| 2006/0068125 A1 | 3/2006 | Radhakrshnan |
| 2006/0105566 A1 | 5/2006 | Waldfried et al. |
| 2006/0110934 A1 | 5/2006 | Fukuchi |
| 2006/0113675 A1 | 6/2006 | Chang et al. |
| 2006/0113806 A1 | 6/2006 | Tsuji et al. |
| 2006/0128168 A1 | 6/2006 | Ahn et al. |
| 2006/0130767 A1 | 6/2006 | Herchen |
| 2006/0137609 A1 | 6/2006 | Puchacz et al. |
| 2006/0147626 A1 | 7/2006 | Blomberg |
| 2006/0148180 A1 | 7/2006 | Ahn et al. |
| 2006/0163612 A1 | 7/2006 | Kouvetakis et al. |
| 2006/0172531 A1 | 8/2006 | Lin et al. |
| 2006/0191555 A1 | 8/2006 | Yoshida et al. |
| 2006/0193979 A1 | 8/2006 | Meiere et al. |
| 2006/0199357 A1 | 9/2006 | Wan et al. |
| 2006/0205223 A1 | 9/2006 | Smayling |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |

(56) References Cited

U.S. PATENT DOCUMENTS

| | | |
|---|---|---|
| 2006/0236934 A1 | 10/2006 | Choi et al. |
| 2006/0240574 A1 | 10/2006 | Yoshie |
| 2006/0240662 A1 | 10/2006 | Conley et al. |
| 2006/0251827 A1 | 11/2006 | Nowak |
| 2006/0257563 A1 | 11/2006 | Doh et al. |
| 2006/0257584 A1 | 11/2006 | Derderian et al. |
| 2006/0258078 A1 | 11/2006 | Lee et al. |
| 2006/0258173 A1 | 11/2006 | Xiao et al. |
| 2006/0260545 A1 | 11/2006 | Ramaswamy et al. |
| 2006/0264060 A1 | 11/2006 | Ramaswamy et al. |
| 2006/0264066 A1 | 11/2006 | Bartholomew |
| 2006/0266289 A1 | 11/2006 | Verghese et al. |
| 2006/0269692 A1 | 11/2006 | Balseanu |
| 2006/0278162 A1* | 12/2006 | Ohmi ............... C23C 14/564 118/715 |
| 2006/0278524 A1 | 12/2006 | Stowell |
| 2007/0006806 A1 | 1/2007 | Imai |
| 2007/0010072 A1 | 1/2007 | Bailey et al. |
| 2007/0020953 A1 | 1/2007 | Tsai et al. |
| 2007/0022954 A1* | 2/2007 | Iizuka ............... C23C 16/455 118/724 |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0032082 A1 | 2/2007 | Ramaswamy et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0054499 A1 | 3/2007 | Jang |
| 2007/0059948 A1 | 3/2007 | Metzner et al. |
| 2007/0062453 A1 | 3/2007 | Ishikawa |
| 2007/0065578 A1 | 3/2007 | McDougall |
| 2007/0066010 A1 | 3/2007 | Ando |
| 2007/0077355 A1 | 4/2007 | Chacin et al. |
| 2007/0084405 A1 | 4/2007 | Kim |
| 2007/0096194 A1 | 5/2007 | Streck et al. |
| 2007/0098527 A1 | 5/2007 | Hall et al. |
| 2007/0107845 A1 | 5/2007 | Ishizawa et al. |
| 2007/0111545 A1 | 5/2007 | Lee et al. |
| 2007/0116873 A1 | 5/2007 | Li et al. |
| 2007/0119370 A1* | 5/2007 | Ma .................... C23C 16/18 118/723 E |
| 2007/0123037 A1 | 5/2007 | Lee et al. |
| 2007/0125762 A1 | 6/2007 | Cui et al. |
| 2007/0128538 A1 | 6/2007 | Fairbairn et al. |
| 2007/0134942 A1 | 6/2007 | Ahn et al. |
| 2007/0146621 A1 | 6/2007 | Yeom |
| 2007/0148990 A1 | 6/2007 | Deboer et al. |
| 2007/0155138 A1 | 7/2007 | Tomasini et al. |
| 2007/0158026 A1 | 7/2007 | Amikura |
| 2007/0163440 A1 | 7/2007 | Kim et al. |
| 2007/0166457 A1 | 7/2007 | Yamoto et al. |
| 2007/0166966 A1 | 7/2007 | Todd et al. |
| 2007/0166999 A1 | 7/2007 | Vaarstra |
| 2007/0173071 A1 | 7/2007 | Afzali-Aldakani et al. |
| 2007/0175393 A1 | 8/2007 | Nishimura et al. |
| 2007/0175397 A1 | 8/2007 | Tomiyasu et al. |
| 2007/0186952 A1 | 8/2007 | Honda et al. |
| 2007/0207275 A1 | 9/2007 | Nowak et al. |
| 2007/0209590 A1 | 9/2007 | Li |
| 2007/0210890 A1 | 9/2007 | Hsu et al. |
| 2007/0215048 A1 | 9/2007 | Suzuki et al. |
| 2007/0218200 A1 | 9/2007 | Suzuki et al. |
| 2007/0218705 A1 | 9/2007 | Matsuki et al. |
| 2007/0224777 A1 | 9/2007 | Hamelin |
| 2007/0224833 A1 | 9/2007 | Morisada et al. |
| 2007/0232031 A1 | 10/2007 | Singh et al. |
| 2007/0232071 A1 | 10/2007 | Balseanu et al. |
| 2007/0232501 A1 | 10/2007 | Tonomura |
| 2007/0234955 A1 | 10/2007 | Suzuki et al. |
| 2007/0237697 A1 | 10/2007 | Clark |
| 2007/0241688 A1 | 10/2007 | DeVancentis et al. |
| 2007/0248767 A1 | 10/2007 | Okura |
| 2007/0249131 A1 | 10/2007 | Allen et al. |
| 2007/0252532 A1 | 10/2007 | DeVancentis et al. |
| 2007/0251444 A1 | 11/2007 | Gros-Jean et al. |
| 2007/0252244 A1 | 11/2007 | Srividya et al. |
| 2007/0264807 A1 | 11/2007 | Leone et al. |
| 2007/0275166 A1 | 11/2007 | Thridandam et al. |
| 2007/0277735 A1 | 12/2007 | Mokhesi et al. |
| 2007/0281496 A1 | 12/2007 | Ingle et al. |
| 2007/0298362 A1 | 12/2007 | Rocha-Alvarez et al. |
| 2008/0003824 A1 | 1/2008 | Padhi et al. |
| 2008/0003838 A1 | 1/2008 | Haukka et al. |
| 2008/0006208 A1 | 1/2008 | Ueno et al. |
| 2008/0023436 A1 | 1/2008 | Gros-Jean et al. |
| 2008/0026574 A1 | 1/2008 | Brcka |
| 2008/0026597 A1 | 1/2008 | Munro et al. |
| 2008/0029790 A1 | 2/2008 | Ahn et al. |
| 2008/0036354 A1 | 2/2008 | Letz et al. |
| 2008/0038485 A1 | 2/2008 | Lukas |
| 2008/0054332 A1 | 3/2008 | Kim et al. |
| 2008/0054813 A1 | 3/2008 | Espiau et al. |
| 2008/0057659 A1 | 3/2008 | Forbes et al. |
| 2008/0061667 A1 | 3/2008 | Gaertner et al. |
| 2008/0066778 A1 | 3/2008 | Matsushita et al. |
| 2008/0069955 A1 | 3/2008 | Hong et al. |
| 2008/0075881 A1 | 3/2008 | Won et al. |
| 2008/0076266 A1 | 3/2008 | Fukazawa et al. |
| 2008/0081104 A1 | 4/2008 | Hasebe et al. |
| 2008/0081113 A1 | 4/2008 | Clark |
| 2008/0081121 A1 | 4/2008 | Morita et al. |
| 2008/0085226 A1 | 4/2008 | Fondurulia et al. |
| 2008/0092815 A1 | 4/2008 | Chen et al. |
| 2008/0113094 A1 | 5/2008 | Casper |
| 2008/0113096 A1 | 5/2008 | Mahajani |
| 2008/0113097 A1 | 5/2008 | Mahajani et al. |
| 2008/0124197 A1 | 5/2008 | van der Meulen |
| 2008/0124908 A1 | 5/2008 | Forbes et al. |
| 2008/0133154 A1 | 6/2008 | Krauss et al. |
| 2008/0149031 A1 | 6/2008 | Chu et al. |
| 2008/0152463 A1 | 6/2008 | Chidambaram et al. |
| 2008/0153311 A1 | 6/2008 | Padhi et al. |
| 2008/0173240 A1 | 7/2008 | Furukawahara |
| 2008/0173326 A1 | 7/2008 | Gu et al. |
| 2008/0176375 A1 | 7/2008 | Erben et al. |
| 2008/0182075 A1 | 7/2008 | Chopra |
| 2008/0182390 A1 | 7/2008 | Lemmi et al. |
| 2008/0191193 A1 | 8/2008 | Li et al. |
| 2008/0199977 A1 | 8/2008 | Weigel et al. |
| 2008/0203487 A1 | 8/2008 | Hohage et al. |
| 2008/0211423 A1 | 9/2008 | Shinmen et al. |
| 2008/0211526 A1 | 9/2008 | Shinma |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0237572 A1 | 10/2008 | Chui et al. |
| 2008/0241384 A1 | 10/2008 | Jeong |
| 2008/0242116 A1 | 10/2008 | Clark |
| 2008/0248310 A1 | 10/2008 | Kim et al. |
| 2008/0261413 A1 | 10/2008 | Mahajani |
| 2008/0264337 A1 | 10/2008 | Sano et al. |
| 2008/0267598 A1 | 10/2008 | Nakamura |
| 2008/0277715 A1 | 11/2008 | Ohmi et al. |
| 2008/0282970 A1 | 11/2008 | Heys et al. |
| 2008/0295872 A1 | 12/2008 | Riker et al. |
| 2008/0299326 A1 | 12/2008 | Fukazawa |
| 2008/0302303 A1 | 12/2008 | Choi et al. |
| 2008/0305246 A1 | 12/2008 | Choi et al. |
| 2008/0305443 A1 | 12/2008 | Nakamura |
| 2008/0315292 A1 | 12/2008 | Ji et al. |
| 2008/0317972 A1 | 12/2008 | Hendriks |
| 2009/0000550 A1 | 1/2009 | Tran et al. |
| 2009/0000551 A1 | 1/2009 | Choi et al. |
| 2009/0011608 A1 | 1/2009 | Nabatame |
| 2009/0020072 A1 | 1/2009 | Mizunaga et al. |
| 2009/0023229 A1 | 1/2009 | Matsushita |
| 2009/0029528 A1 | 1/2009 | Sanchez et al. |
| 2009/0029564 A1 | 1/2009 | Yamashita et al. |
| 2009/0033907 A1 | 2/2009 | Watson |
| 2009/0035947 A1 | 2/2009 | Horii |
| 2009/0041952 A1 | 2/2009 | Yoon et al. |
| 2009/0041984 A1 | 2/2009 | Mayers et al. |
| 2009/0045829 A1 | 2/2009 | Awazu |

(56) References Cited

U.S. PATENT DOCUMENTS

| | | |
|---|---|---|
| 2009/0050621 A1 | 2/2009 | Awazu |
| 2009/0061644 A1 | 3/2009 | Chiang et al. |
| 2009/0061647 A1 | 3/2009 | Mallick et al. |
| 2009/0085156 A1 | 4/2009 | Dewey et al. |
| 2009/0090382 A1 | 4/2009 | Morisada |
| 2009/0093094 A1 | 4/2009 | Ye et al. |
| 2009/0095221 A1 | 4/2009 | Tam et al. |
| 2009/0107404 A1 | 4/2009 | Ogliari et al. |
| 2009/0122293 A1 | 5/2009 | Shibazaki |
| 2009/0136668 A1 | 5/2009 | Gregg et al. |
| 2009/0136683 A1 | 5/2009 | Fukasawa et al. |
| 2009/0139657 A1 | 6/2009 | Lee et al. |
| 2009/0142935 A1 | 6/2009 | Fukazawa et al. |
| 2009/0146322 A1 | 6/2009 | Weling et al. |
| 2009/0156015 A1 | 6/2009 | Park |
| 2009/0169744 A1* | 7/2009 | Byun ............... C23C 16/40 427/255.28 |
| 2009/0209081 A1 | 8/2009 | Matero |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0246399 A1 | 10/2009 | Goundar |
| 2009/0250955 A1 | 10/2009 | Aoki |
| 2009/0261331 A1 | 10/2009 | Yang et al. |
| 2009/0269506 A1 | 10/2009 | Okura et al. |
| 2009/0275205 A1 | 11/2009 | Kiehlbauch et al. |
| 2009/0277510 A1 | 11/2009 | Shikata |
| 2009/0283041 A1 | 11/2009 | Tomiyasu et al. |
| 2009/0283217 A1 | 11/2009 | Lubomirsky et al. |
| 2009/0286400 A1 | 11/2009 | Heo et al. |
| 2009/0286402 A1 | 11/2009 | Xia et al. |
| 2009/0289300 A1 | 11/2009 | Sasaki et al. |
| 2009/0304558 A1 | 12/2009 | Patton |
| 2009/0311857 A1 | 12/2009 | Todd et al. |
| 2010/0001409 A1 | 1/2010 | Humbert et al. |
| 2010/0006031 A1 | 1/2010 | Choi et al. |
| 2010/0014479 A1 | 1/2010 | Kim |
| 2010/0015813 A1 | 1/2010 | McGinnis et al. |
| 2010/0024727 A1 | 2/2010 | Kim et al. |
| 2010/0025796 A1 | 2/2010 | Dabiran |
| 2010/0041179 A1 | 2/2010 | Lee |
| 2010/0041243 A1 | 2/2010 | Cheng et al. |
| 2010/0055312 A1 | 3/2010 | Kato et al. |
| 2010/0055317 A1* | 3/2010 | Kato ............... C23C 16/45544 427/255.28 |
| 2010/0055347 A1* | 3/2010 | Kato ............... C23C 16/452 427/569 |
| 2010/0055442 A1 | 3/2010 | Kellock |
| 2010/0075507 A1 | 3/2010 | Chang et al. |
| 2010/0089320 A1 | 4/2010 | Kim |
| 2010/0093187 A1 | 4/2010 | Lee et al. |
| 2010/0102417 A1 | 4/2010 | Ganguli et al. |
| 2010/0116209 A1 | 5/2010 | Kato |
| 2010/0124610 A1 | 5/2010 | Aikawa et al. |
| 2010/0124618 A1 | 5/2010 | Kobayashi et al. |
| 2010/0124621 A1 | 5/2010 | Kobayashi et al. |
| 2010/0126605 A1 | 5/2010 | Stones |
| 2010/0130017 A1 | 5/2010 | Luo et al. |
| 2010/0134023 A1 | 6/2010 | Mills |
| 2010/0136216 A1 | 6/2010 | Tsuei et al. |
| 2010/0140221 A1 | 6/2010 | Kikuchi et al. |
| 2010/0144162 A1 | 6/2010 | Lee et al. |
| 2010/0151206 A1 | 6/2010 | Wu et al. |
| 2010/0162752 A1 | 7/2010 | Tabata et al. |
| 2010/0170441 A1 | 7/2010 | Won et al. |
| 2010/0178137 A1 | 7/2010 | Chintalapati et al. |
| 2010/0178423 A1 | 7/2010 | Shimizu et al. |
| 2010/0184302 A1 | 7/2010 | Lee et al. |
| 2010/0193501 A1 | 8/2010 | Zucker et al. |
| 2010/0195392 A1 | 8/2010 | Freeman |
| 2010/0221452 A1 | 9/2010 | Kang |
| 2010/0230051 A1* | 9/2010 | Iizuka ............... H01J 37/3244 156/345.34 |
| 2010/0233886 A1 | 9/2010 | Yang et al. |
| 2010/0243166 A1 | 9/2010 | Hayashi et al. |
| 2010/0244688 A1 | 9/2010 | Braun et al. |
| 2010/0255198 A1 | 10/2010 | Cleary et al. |
| 2010/0255625 A1 | 10/2010 | De Vries |
| 2010/0259152 A1 | 10/2010 | Yasuda et al. |
| 2010/0270675 A1 | 10/2010 | Harada |
| 2010/0275846 A1 | 11/2010 | Kitagawa |
| 2010/0285319 A1 | 11/2010 | Kwak et al. |
| 2010/0294199 A1 | 11/2010 | Tran et al. |
| 2010/0301752 A1 | 12/2010 | Bakre et al. |
| 2010/0304047 A1 | 12/2010 | Yang et al. |
| 2010/0307415 A1 | 12/2010 | Shero et al. |
| 2010/0317198 A1 | 12/2010 | Antonelli |
| 2010/0322604 A1 | 12/2010 | Fondurulia et al. |
| 2011/0000619 A1 | 1/2011 | Suh |
| 2011/0006402 A1 | 1/2011 | Zhou |
| 2011/0006406 A1 | 1/2011 | Urbanowicz et al. |
| 2011/0014795 A1 | 1/2011 | Lee |
| 2011/0034039 A1 | 2/2011 | Liang et al. |
| 2011/0048642 A1 | 3/2011 | Mihara et al. |
| 2011/0052833 A1 | 3/2011 | Flanawa et al. |
| 2011/0056513 A1 | 3/2011 | Hombach et al. |
| 2011/0056626 A1 | 3/2011 | Brown et al. |
| 2011/0061810 A1 | 3/2011 | Ganguly et al. |
| 2011/0070380 A1 | 3/2011 | Shero et al. |
| 2011/0081519 A1 | 4/2011 | Dillingh |
| 2011/0086516 A1 | 4/2011 | Lee et al. |
| 2011/0089469 A1 | 4/2011 | Merckling |
| 2011/0097901 A1 | 4/2011 | Banna et al. |
| 2011/0107512 A1 | 5/2011 | Gilbert |
| 2011/0108194 A1 | 5/2011 | Yoshioka et al. |
| 2011/0108741 A1 | 5/2011 | Ingram |
| 2011/0108929 A1 | 5/2011 | Meng |
| 2011/0117490 A1 | 5/2011 | Bae et al. |
| 2011/0117737 A1 | 5/2011 | Agarwala et al. |
| 2011/0124196 A1 | 5/2011 | Lee |
| 2011/0143032 A1 | 6/2011 | Vrtis et al. |
| 2011/0159202 A1 | 6/2011 | Matsushita |
| 2011/0159673 A1 | 6/2011 | Hanawa et al. |
| 2011/0175011 A1 | 7/2011 | Ehrne et al. |
| 2011/0180233 A1* | 7/2011 | Bera ............... F28F 7/02 165/47 |
| 2011/0183079 A1 | 7/2011 | Jackson et al. |
| 2011/0183269 A1 | 7/2011 | Zhu |
| 2011/0210468 A1 | 9/2011 | Shannon et al. |
| 2011/0220874 A1 | 9/2011 | Hanrath |
| 2011/0223334 A1* | 9/2011 | Yudovsky ......... C23C 16/45504 427/255.23 |
| 2011/0236600 A1 | 9/2011 | Fox et al. |
| 2011/0239936 A1 | 10/2011 | Suzuki et al. |
| 2011/0254052 A1 | 10/2011 | Kouvetakis |
| 2011/0256726 A1 | 10/2011 | Lavoie et al. |
| 2011/0256727 A1 | 10/2011 | Beynet et al. |
| 2011/0256734 A1 | 10/2011 | Hausmann et al. |
| 2011/0265549 A1 | 11/2011 | Cruse et al. |
| 2011/0265951 A1 | 11/2011 | Xu et al. |
| 2011/0275166 A1 | 11/2011 | Shero et al. |
| 2011/0281417 A1 | 11/2011 | Gordon et al. |
| 2011/0283933 A1 | 11/2011 | Makarov et al. |
| 2011/0294075 A1 | 12/2011 | Chen et al. |
| 2011/0308460 A1 | 12/2011 | Hong et al. |
| 2012/0003500 A1 | 1/2012 | Yoshida et al. |
| 2012/0006268 A1* | 1/2012 | Ozaki ............... C23C 16/4401 118/733 |
| 2012/0006489 A1 | 1/2012 | Okita |
| 2012/0024479 A1 | 2/2012 | Palagashvili et al. |
| 2012/0052681 A1 | 3/2012 | Marsh |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0100464 A1 | 4/2012 | Kageyama |
| 2012/0103264 A1 | 5/2012 | Choi et al. |
| 2012/0103939 A1 | 5/2012 | Wu et al. |
| 2012/0107607 A1 | 5/2012 | Takaki et al. |
| 2012/0114877 A1 | 5/2012 | Lee |
| 2012/0121823 A1 | 5/2012 | Chhabra |
| 2012/0128897 A1 | 5/2012 | Xiao et al. |

(56) References Cited

U.S. PATENT DOCUMENTS

| | | |
|---|---|---|
| 2012/0135145 A1 | 5/2012 | Je et al. |
| 2012/0156108 A1 | 6/2012 | Fondurulia et al. |
| 2012/0160172 A1 | 6/2012 | Wamura et al. |
| 2012/0164327 A1 | 6/2012 | Sato |
| 2012/0164837 A1 | 6/2012 | Tan et al. |
| 2012/0164842 A1 | 6/2012 | Watanabe |
| 2012/0171391 A1 | 7/2012 | Won |
| 2012/0171874 A1 | 7/2012 | Thridandam et al. |
| 2012/0207456 A1 | 8/2012 | Kim et al. |
| 2012/0212121 A1 | 8/2012 | Lin |
| 2012/0214318 A1 | 8/2012 | Fukazawa et al. |
| 2012/0220139 A1 | 8/2012 | Lee et al. |
| 2012/0225561 A1 | 9/2012 | Watanabe |
| 2012/0240858 A1 | 9/2012 | Taniyama et al. |
| 2012/0270339 A1 | 10/2012 | Xie et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0305196 A1 | 12/2012 | Mori et al. |
| 2012/0315113 A1 | 12/2012 | Hiroki |
| 2012/0318334 A1 | 12/2012 | Bedell et al. |
| 2012/0321786 A1 | 12/2012 | Satitpunwaycha et al. |
| 2012/0322252 A1 | 12/2012 | Son et al. |
| 2012/0325148 A1 | 12/2012 | Yamagishi et al. |
| 2012/0328780 A1 | 12/2012 | Yamagishi et al. |
| 2013/0005122 A1 | 1/2013 | Schwarzenbach et al. |
| 2013/0011983 A1 | 1/2013 | Tsai |
| 2013/0014697 A1 | 1/2013 | Kanayama |
| 2013/0014896 A1 | 1/2013 | Shoji et al. |
| 2013/0019944 A1 | 1/2013 | Hekmatshoar-Tabai et al. |
| 2013/0019945 A1 | 1/2013 | Hekmatshoar-Tabai et al. |
| 2013/0023129 A1 | 1/2013 | Reed |
| 2013/0048606 A1 | 2/2013 | Mao et al. |
| 2013/0068970 A1 | 3/2013 | Matsushita |
| 2013/0078392 A1 | 3/2013 | Xiao et al. |
| 2013/0081702 A1 | 4/2013 | Mohammed et al. |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0122712 A1 | 5/2013 | Kim et al. |
| 2013/0126515 A1 | 5/2013 | Shero et al. |
| 2013/0129577 A1 | 5/2013 | Halpin et al. |
| 2013/0134148 A1 | 5/2013 | Tachikawa |
| 2013/0180448 A1 | 7/2013 | Sakaue et al. |
| 2013/0183814 A1 | 7/2013 | Huang et al. |
| 2013/0210241 A1 | 8/2013 | Lavoie et al. |
| 2013/0217239 A1 | 8/2013 | Mallick et al. |
| 2013/0217240 A1 | 8/2013 | Mallick et al. |
| 2013/0217241 A1 | 8/2013 | Underwood et al. |
| 2013/0217243 A1 | 8/2013 | Underwood et al. |
| 2013/0224964 A1 | 8/2013 | Fukazawa |
| 2013/0230814 A1 | 9/2013 | Dunn et al. |
| 2013/0256838 A1 | 10/2013 | Sanchez et al. |
| 2013/0264659 A1 | 10/2013 | Jung |
| 2013/0292047 A1 | 11/2013 | Tian et al. |
| 2013/0292676 A1 | 11/2013 | Milligan et al. |
| 2013/0292807 A1 | 11/2013 | Raisanen et al. |
| 2013/0319290 A1 | 12/2013 | Xiao et al. |
| 2013/0323435 A1 | 12/2013 | Xiao et al. |
| 2013/0330165 A1 | 12/2013 | Wimplinger |
| 2013/0330911 A1 | 12/2013 | Huang et al. |
| 2014/0000843 A1 | 1/2014 | Dunn et al. |
| 2014/0014642 A1 | 1/2014 | Elliot et al. |
| 2014/0014644 A1 | 1/2014 | Akiba et al. |
| 2014/0020619 A1 | 1/2014 | Vincent et al. |
| 2014/0027884 A1 | 1/2014 | Tang et al. |
| 2014/0036274 A1 | 2/2014 | Marquardt et al. |
| 2014/0056679 A1 | 2/2014 | Yamabe et al. |
| 2014/0060147 A1 | 3/2014 | Sarin et al. |
| 2014/0062304 A1 | 3/2014 | Nakano et al. |
| 2014/0067110 A1 | 3/2014 | Lawson et al. |
| 2014/0073143 A1 | 3/2014 | Alokozai et al. |
| 2014/0077240 A1 | 3/2014 | Roucka et al. |
| 2014/0084341 A1 | 3/2014 | Weeks |
| 2014/0087544 A1 | 3/2014 | Tolle |
| 2014/0096716 A1 | 4/2014 | Chung et al. |
| 2014/0099798 A1 | 4/2014 | Tsuji |
| 2014/0103145 A1* | 4/2014 | White ............... H01J 37/32449 239/548 |
| 2014/0116335 A1 | 5/2014 | Tsuji et al. |
| 2014/0120487 A1 | 5/2014 | Kaneko |
| 2014/0127907 A1 | 5/2014 | Yang |
| 2014/0159170 A1 | 6/2014 | Raisanen et al. |
| 2014/0174354 A1 | 6/2014 | Arai |
| 2014/0175054 A1 | 6/2014 | Carlson et al. |
| 2014/0182053 A1 | 7/2014 | Huang |
| 2014/0217065 A1 | 8/2014 | Winkler et al. |
| 2014/0220247 A1 | 8/2014 | Haukka et al. |
| 2014/0225065 A1 | 8/2014 | Rachmady et al. |
| 2014/0227072 A1 | 8/2014 | Lee et al. |
| 2014/0251953 A1 | 9/2014 | Winkler et al. |
| 2014/0251954 A1 | 9/2014 | Winkler et al. |
| 2014/0283747 A1 | 9/2014 | Kasai et al. |
| 2014/0346650 A1 | 11/2014 | Raisanen et al. |
| 2014/0349033 A1 | 11/2014 | Nonaka et al. |
| 2014/0363980 A1 | 12/2014 | Kawamata et al. |
| 2014/0367043 A1 | 12/2014 | Bishara et al. |
| 2015/0004316 A1 | 1/2015 | Thompson et al. |
| 2015/0004317 A1 | 1/2015 | Dussarrat et al. |
| 2015/0007770 A1 | 1/2015 | Chandrasekharan et al. |
| 2015/0014632 A1 | 1/2015 | Kim et al. |
| 2015/0024609 A1 | 1/2015 | Milligan et al. |
| 2015/0048485 A1 | 2/2015 | Tolle |
| 2015/0078874 A1 | 3/2015 | Sansoni |
| 2015/0086316 A1 | 3/2015 | Greenberg |
| 2015/0091057 A1 | 4/2015 | Xie et al. |
| 2015/0096973 A1 | 4/2015 | Dunn et al. |
| 2015/0099072 A1 | 4/2015 | Takamure et al. |
| 2015/0132212 A1 | 5/2015 | Winkler et al. |
| 2015/0140210 A1 | 5/2015 | Jung et al. |
| 2015/0147483 A1 | 5/2015 | Fukazawa |
| 2015/0147877 A1 | 5/2015 | Jung |
| 2015/0167159 A1 | 6/2015 | Halpin et al. |
| 2015/0170954 A1 | 6/2015 | Agarwal |
| 2015/0174768 A1 | 6/2015 | Rodnick |
| 2015/0184291 A1 | 7/2015 | Alokozai et al. |
| 2015/0187568 A1 | 7/2015 | Pettinger et al. |
| 2015/0217456 A1 | 8/2015 | Tsuji et al. |
| 2015/0240359 A1 | 8/2015 | Jdira et al. |
| 2015/0267295 A1 | 9/2015 | Hill et al. |
| 2015/0267297 A1 | 9/2015 | Shiba |
| 2015/0267298 A1* | 9/2015 | Saitou ............... C23C 16/45565 118/725 |
| 2015/0267299 A1 | 9/2015 | Hawkins |
| 2015/0267301 A1 | 9/2015 | Hill et al. |
| 2015/0284848 A1 | 10/2015 | Nakano et al. |
| 2015/0287626 A1 | 10/2015 | Arai |
| 2015/0308586 A1 | 10/2015 | Shugrue et al. |
| 2015/0315704 A1 | 11/2015 | Nakano et al. |
| 2015/0376784 A1* | 12/2015 | Wu ................... C23C 16/45508 427/255.28 |

FOREIGN PATENT DOCUMENTS

| | | |
|---|---|---|
| CN | 101522943 | 9/2009 |
| CN | 101423937 | 9/2011 |
| EP | 2036600 | 3/2009 |
| EP | 2426233 | 7/2012 |
| JP | 03-044472 | 2/1991 |
| JP | 04115531 | 4/1992 |
| JP | 07-034936 | 8/1995 |
| JP | 7-272694 | 10/1995 |
| JP | 07283149 | 10/1995 |
| JP | 08-181135 | 7/1996 |
| JP | 08335558 | 12/1996 |
| JP | 10-064696 | 3/1998 |
| JP | 10-0261620 | 9/1998 |
| JP | 2845163 | 1/1999 |
| JP | 2004134553 | 4/2001 |
| JP | 2001342570 | 12/2001 |
| JP | 2004014952 A | 1/2004 |
| JP | 2004091848 | 3/2004 |
| JP | 2004294638 | 10/2004 |

(56) References Cited

FOREIGN PATENT DOCUMENTS

| | | |
|---|---|---|
| JP | 2004310019 | 11/2004 |
| JP | 2004538374 | 12/2004 |
| JP | 2005507030 | 3/2005 |
| JP | 2006186271 | 7/2006 |
| JP | 3140111 | 3/2008 |
| JP | 2008060304 | 3/2008 |
| JP | 2008527748 | 7/2008 |
| JP | 2008202107 | 9/2008 |
| JP | 2009016815 | 1/2009 |
| JP | 2009099938 | 5/2009 |
| JP | 2010097834 | 4/2010 |
| JP | 2010205967 | 9/2010 |
| JP | 2010251444 | 10/2010 |
| JP | 2012089837 | 5/2012 |
| TW | I226380 | 1/2005 |
| TW | 200701301 A | 1/2007 |
| WO | 1998032893 | 7/1998 |
| WO | 2004010467 | 1/2004 |
| WO | 2006054854 | 5/2006 |
| WO | 2006056091 A1 | 6/2006 |
| WO | 2006078666 | 7/2006 |
| WO | 2006080782 | 8/2006 |
| WO | 2006101857 | 9/2006 |
| WO | 2007140376 | 12/2007 |
| WO | 2010039363 | 4/2010 |
| WO | 2010118051 | 1/2011 |
| WO | 2011019950 | 2/2011 |
| WO | 2013078065 | 5/2013 |
| WO | 2013078066 | 5/2013 |

OTHER PUBLICATIONS

USPTO; Notice of Allowance dated Jul. 6, 2015 in U.S. Appl. No. 29/447,298.
USPTO; Office Action dated Aug. 27, 2010 in U.S. Appl. No. 12/118,596.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Restriction Requirement dated Jan. 15, 2013 in U.S. Appl. No. 12/754,223.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Final Office Action dated Jul. 14, 2014 in U.S. Appl. No. 12/754,223.
USPTO; Non-Final Office Action dated Mar. 25, 2015 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Office Action dated Oct. 8, 2014 in U.S. Appl. No. 12/763,037.
USPTO; Notice of Allowance dated Jan. 27, 2015 in U.S. Appl. No. 12/763,037.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Notice of Allowance dated Jul. 3, 2014 in U.S. Appl. No. 13/102,980.
USPTO; Non-Final Office Action dated Sep. 17, 2014 in U.S. Appl. No. 13/187,300.
USPTO; Final Office Action dated Apr. 15, 2015 in U.S. Appl. No. 13/187,300.
USPTO; Non-Final Office Action dated Jul. 2, 2014 in U.S. Appl. No. 13/283,408.
USPTO; Final Office Action dated Jan. 29, 2015 in U.S. Appl. No. 13/283,408.
USPTO; Non-Final Office Action dated Jun. 17, 2015 in U.S. Appl. No. 13/283,408.
USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jul. 30, 2014 in U.S. Appl. No. 13/284,642.
USPTO; Notice of Allowance dated Feb. 11, 2015 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Non-Final Office Action dated Nov. 26, 2014 in U.S. Appl. No. 13/312,591.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Office Action dated Jul. 31, 2014 in U.S. Appl. No. 13/411,271.
USPTO; Final Office Action dated Jan. 16, 2015 in U.S. Appl. No. 13/411,271.
USPTO; Restriction Requirement dated Oct. 29, 2013 in U.S. Appl. No. 13/439,528.
USPTO; Office Action dated Feb. 4, 2014 in U.S. Appl. No. 13/439,528.
USPTO; Final Office Action dated Jul. 8, 2014 in U.S. Appl. No. 13/439,528.
USPTO; Notice of Allowance dated Oct. 21, 2014 in U.S. Appl. No. 13/439,528.
USPTO; Office Action dated May 23, 2013 in U.S. Appl. No. 13/465,340.
USPTO; Final Office Action dated Oct. 30, 2013 in U.S. Appl. No. 13/465,340.

(56) References Cited

OTHER PUBLICATIONS

USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Notice of Allowance dated Jun. 12, 2015 in U.S. Appl. No. 13/563,066.
USPTO; Non-Final Office Action dated Oct. 15, 2014 in U.S. Appl. No. 13/597,043.
USPTO; Final Office Action dated Mar. 13, 2015 in U.S. Appl. No. 13/597,043.
USPTO; Non-Final Office Action dated Feb. 12, 2015 in U.S. Appl. No. 13/597,108.
USPTO; Final Office Action dated Jun. 1, 2015 in U.S. Appl. No. 13/597,108.
USPTO; Office Action dated Nov. 15, 2013 in U.S. Appl. No. 13/612,538.
USPTO; Office Action dated Jul. 10, 2014 in U.S. Appl. No. 13/612,538.
USPTO; Non-Final Office Action dated May 28, 2015 in U.S. Appl. No. 13/651,144.
USPTO; Non-Final Office Action dated Apr. 3, 2015 in U.S. Appl. No. 13/677,133.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Office Action dated Apr. 24, 2014 in U.S. Appl. No. 13/784,362.
USPTO; Notice of Allowance dated Aug. 13, 2014 in U.S. Appl. No. 13/784,362.
USPTO; Final Office Action dated Mar. 25, 2015 in U.S. Appl. No. 13/791,246.
USPTO; Restriction Requirement dated Jun. 26, 2014 in U.S. Appl. No. 13/874,708.
USPTO; Non-Final Office Action dated Oct. 9, 2014 in U.S. Appl. No. 13/874,708.
USPTO; Notice of Allowance dated Mar. 10, 2015 in U.S. Appl. No. 13/874,708.
USPTO; Restriction Requirement dated May 8, 2014 in U.S. Appl. No. 13/791,246.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Notice of Allowance dated Jan. 20, 2015 in U.S. Appl. No. 13/941,134.
USPTO; Restriction Requirement dated Apr. 30, 2015 in U.S. Appl. No. 13/941,216.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Restriction Requirement Action dated Jan. 28, 2015 in U.S. Appl. No. 14/018,345.
USPTO; Non-Final Office Action dated Apr. 7, 2015 in U.S. Appl. No. 14/018,345.
USPTO; Non-Final Office Action dated Apr. 28, 2015 in U.S. Appl. No. 14/040,196.
USPTO; Non-Final Office Action dated Mar. 19, 2015 in U.S. Appl. No. 14/079,302.
USPTO; Non-Final Office Action dated Mar. 19, 2015 in U.S. Appl. No. 14/166,462.
USPTO; Office Action dated May 29, 2014 in U.S. Appl. No. 14/183,187.
USPTO; Final Office Action dated Nov. 7, 2014 in U.S. Appl. No. 14/183,187.
USPTO; Non-Final Office Action dated Mar. 16, 2015 in U.S. Appl. No. 14/183,187.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
USPTO; Non-Final Office Action dated Mar. 16, 2015 in U.S. Appl. No. 29/447,298.
PCT; International Search report and Written Opinion dated Nov. 12, 2010 in Application No. PCT/US2010/030126.
PCT; International Preliminary Report on Patentability dated Oct. 11, 2011 Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in Application No. 201080015699.9.
Chinese Patent Office; Office Action dated Jan. 12, 2015 in Application No. 201080015699.9.
Chinese Patent Office; Notice on the First Office Action dated May 24, 2013 in Application No. 201080036764.6.
Chinese Patent Office; Notice on the Second Office Action dated Jan. 2, 2014 in Application No. 201080036764.6.
Chinese Patent Office; Notice on the Third Office Action dated Jul. 1, 2014 in Application No. 201080036764.6.
Chinese Patent Office; Notice on the First Office Action dated Feb. 8, 2014 in Application No. 201110155056.
Chinese Patent Office; Notice on the Second Office Action dated Sep. 16, 2014 in Application No. 201110155056.
Chinese Patent Office; Notice on the Third Office Action dated Feb. 9, 2015 in Application No. 201110155056.
Japanese Patent Office; Office Action dated Jan. 25, 2014 in Application No. 2012-504786.
Japanese Patent Office; Office Action dated Dec. 1, 2014 in Application No. 2012-504786.
Taiwan Patent Office; Office Action dated Jul. 4, 2014 in Application No. 099110511.
Taiwan Patent Office; Office Action dated Dec. 19, 2014 in Taiwan Application No. 099127063.
Bearzotti, et al., "Fast Humidity Response of a Metal Halide-Doped Novel Polymer," Sensors and Actuators B, 7, pp. 451-454, (1992).
Chang et al. "Small-Subthreshold-Swing and Low-Voltage Flexible Organic Thin-Film Transistors Which Use HfLaO as the Gate Dielectric," IEEE Electron Device Society, 30, pp. 133-135, (2009).
Crowell, "Chemical Methods of Thin Film Deposition: Chemical Vapor Deposition, Atomic Layer Deposition, and Related Technologies," Journal of Vacuum Science & Technology, S88-S95, (2003).
Koutsokeras et al., "Texture and Microstructure Evolution in Single-Phase TixTa1-xN Alloys of Rocksalt Structure" Journal of Applied Physics, 110, pp. 043535-1-043535-6, (2011).
Maeng et al., "Electrical Properties of Atomic Layer Disposition Hf02 and Hf0xNy on Si Substrates with Various Crystal Orientations," Journal of the Electrochemical Society, 155, pp. H267-H271, Department of Materials Science and Engineering, Pohang University of Science and Technology, Pohang, Korea (2008).
Novaro et al., "Theoretical Study on a Reaction Pathway of Ziegler-Natta-Type Catalysis," J. Chem. Phys., 68, pp. 2337-2351, (1978).
Varma, et al., "Effect of Metal Halides on Thermal, Mechanical, and Electrical Properties of Polypyromelitimide Films," Journal of Applied Polymer Science, 32, pp. 3987-4000, (1986).
USPTO; Non-Final Office Action dated Apr. 1, 2010 in U.S. Appl. No. 12/357,174.

(56) References Cited

OTHER PUBLICATIONS

USPTO; Final Office Action dated Sep. 1, 2010 in U.S. Appl. No. 12/357,174.
USPTO; Notice of Allowance dated Dec. 13, 2010 in U.S. Appl. No. 12/357,174.
USPTO; Non-Final Office Action dated Dec. 29, 2010 in U.S. Appl. No. 12/362,023.
USPTO; Non-Final Office Action dated Jul. 26, 2011 in U.S. Appl. No. 12/416,809.
USPTO; Final Office Action dated Dec. 6, 2011 in U.S. Appl. No. 12/416,809.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Non-Final Office Action dated Sep. 6, 2011 in U.S. Appl. No. 12/553,759.
USPTO; Notice of Allowance dated 01/247/2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Non-Final Office Action dated Feb. 16, 2012 in U.S. Appl. No. 12/618,419.
USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Notice of Allowance dated Apr. 12, 2013 in U.S. Appl. No. 12/618,419.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Final Office Action dated Aug. 12, 2015 in U.S. Appl. No. 12/754,223.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Notice of Allowance dated Jan. 16, 2014 in U.S. Appl. No. 12/847,848.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Notice of Allowance dated Sep. 13, 2012 in U.S. Appl. No. 13/085,968.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Non-Final Office Action dated Oct. 27, 2014 in U.S. Appl. No. 13/169,951.
USPTO; Final Office Action dated May 26, 2015 in U.S. Appl. No. 13/169,591.
USPTO; Non-Final Office Action dated Sep. 1, 2015 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.
USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Non-Final Office Action dated Aug. 10, 2015 in U.S. Appl. No. 13/184,351.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.

(56) References Cited

OTHER PUBLICATIONS

USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Notice of Allowance dated Oct. 6, 2015 in U.S. Appl. No. 13/411,271.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Notice of Allowance dated May 29, 2014 in U.S. Appl. No. 13/550,419.
USPTO; Notice of Allowance dated Jul. 16, 2015 in U.S. Appl. No. 13/563,066.
USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; USPTO; Notice of Allowance dated Aug. 28, 2015 in U.S. Appl. No. 13/597,043.
USPTO; Non-Final Office Action dated Dec. 8, 2015 in U.S. Appl. No. 13/597,108.
USPTO; Notice of Allowance dated Mar. 27, 2014 in U.S. Appl. No. 13/604,498.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Non-Final Office Action dated Dec. 16, 2014 in U.S. Appl. No. 13/646,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Nov. 19, 2015 in U.S. Appl. No. 13/651,144.
USPTO; Non-Final Office Action dated Nov. 19, 2015 in U.S. Appl. No. 14/659,437.
USPTO; Non-Final Office Action dated Jun. 18, 2015 in U.S. Appl. No. 13/665,366.
USPTO; Notice of Allowance dated Aug. 24, 2015 in U.S. Appl. No. 13/677,133.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance Mar. 13, 2015 dated in U.S. Appl. No. 13/749,878.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Non-Final Office Action dated Oct. 26, 2015 in U.S. Appl. No. 13/791,246.
USPTO; Non-Final Office Action dated Nov. 6, 2015 in U.S. Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Non-Final Office Action dated Jul. 8, 2015 in U.S. Appl. No. 13/901,400.
USPTO; Notice of Allowance dated Aug. 5, 2015 in U.S. Appl. No. 13/901,372.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Non-Final Office Action dated Dec. 16, 2014 in U.S. Appl. No. 13/915,732.
USPTO; Final Office Action dated Apr. 10, 2015 in U.S. Appl. No. 13/915,732.
USPTO; Notice of Allowance dated Jun. 19, 2015 in U.S. Appl. No. 13/915,732.

(56) References Cited

OTHER PUBLICATIONS

USPTO; Notice of Allowance dated Mar. 17, 2015 in U.S. Appl. No. 13/923,197.
USPTO; Non-Final Office Action dated Jul. 30, 2015 in U.S. Appl. No. 13/941,216.
USPTO; Non-Final Office Action dated Jun. 29, 2015 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; USPTO; Final Office Action dated Sep. 14, 2015 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Notice of Allowance dated Sep. 11, 2015 in U.S. Appl. No. 14/040,196.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Non-Final Office Action dated Oct. 7, 2015 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Sep. 9, 2015 in U.S. Appl. No. 14/090,750.
USPTO; Final Office Action dated Sep. 1, 2015 in U.S. Appl. No. 14/079,302.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Final Office Action dated Jul. 10, 2015 in U.S. Appl. No. 14/183,187.
USPTO; Non-Final Office Action dated Oct. 8, 2015 in U.S. Appl. No. 14/218,374.
USPTO; Non-Final Office Action dated Sep. 22, 2015 in U.S. Appl. No. 14/219,839.
USPTO; Non-Final Office Action dated Nov. 25, 2015 in U.S. Appl. No. 14/219,879.
USPTO; Non-Final Office Action dated Sep. 18, 2015 in U.S. Appl. No. 14/244,689.
USPTO; Non-Final Office Action dated Nov. 20, 2015 in U.S. Appl. No. 14/260,701.
USPTO; Non-Final Office Action dated Aug. 19, 2015 in U.S. Appl. No. 14/268,348.
USPTO; Non-Final Office Action dated Oct. 20, 2015 in U.S. Appl. No. 14/281,477.
USPTO; Final Office Action dated Jul. 14, 2015 in U.S. Appl. No. 14/457,058.
USPTO; Non-Final Office Action dated Nov. 6, 2015 in U.S. Appl. No. 14/457,058.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Final Office Action dated Jul. 16, 2015 in U.S. Appl. No. 14/563,044.
USPTO; Notice of Allowance dated Dec. 2, 2015 in U.S. Appl. No. 14/563,044.
USPTO; Non-Final Office Action dated Oct. 1, 2015 in U.S. Appl. No. 14/571,126.
USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Notice of Allowance dated Jan. 12, 2015 in U.S. Appl. No. 29/481,312.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
Bhatnagar et al., "Copper Interconnect Advances to Meet Moore's Law Milestones," Solid State Technology, 52, 10 (2009).
Buriak, "Organometallic Chemistry on Silicon and Germanium Surfaces," Chemical Reviews, 102, 5 (2002).
Cant et al., "Chemisorption Sites on Porous Silica Glass and on Mixed-Oxide Catalysis," Can. J. Chem. 46, 1373 (1968).
Chen et al., "A Self-Aligned Airgap Interconnect Scheme," IEEE International Interconnect Technology Conference, vol. 1-3, 146-148 (2009).
Choi et al., "Improvement of Silicon Direct Bonding using Surfaces Activated by Hydrogen Plasma Treatement," Journal of the Korean Physical Society, 37, 6, 878-881 (2000).
Choi et al., "Low Temperature Formation of Silicon Oxide Thin Films by Atomic Layer Deposition Using $NH_3/O_2$ Plasma," ECS Solid State Letters, 2(12) p. 114-p. 116 (2013).
Cui et al., "Impact of Reductive $N_2/H_2$ Plasma on Porous Low-Dielectric Constant SiCOH Thin Films," Journal of Applied Physics 97, 113302, 1-8 (2005).
Dingemans et al., "Comparison Between Aluminum Oxide Surface Passivation Films Deposited with Thermal Aid," Plasma Aid and Pecvd, 35th IEEE PVCS, Jun. 2010.
Drummond et al., "Hydrophobic Radiofrequency Plasma-Deposited Polymer Films: Dielectric Properties and Surface Forces," Colloids and Surfaces A, 129-130, 117-129 (2006).
Easley et al., "Thermal Isolation of Microchip Reaction Chambers for Rapid Non-Contact DNA Amplification," J. Micromech. Microeng. 17, 1758-1766 (2007).
Ge et al., "Carbon Nanotube-Based Synthetic Gecko Tapes," Department of Polymer Science, PNAS, 10792-10795 (2007).
George et al., "Atomic Layer Deposition: An Overview," Chem. Rev. 110, 111-131 (2010).
Grill et al., "The Effect of Plasma Chemistry on the Damage Induced Porous SiCOH Dielectrics," IBM Research Division, RC23683 (W0508-008), Materials Science, 1-19 (2005).
Heo et al., "Structural Characterization of Nanoporous Low-Dielectric Constant SiCOH Films Using Organosilane Precursors," NSTI-Nanotech, vol. 4, 122-123 (2007).
Jung et al., "Double Patterning of Contact Array with Carbon Polymer," Proc. Of SPIE, 6924, 69240C, 1-10 (2008).
Katamreddy et al., "ALD and Characterization of Aluminum Oxide Deposited on Si(100) using Tris(diethylamino) Aluminum and Water Vapor," Journal of the Electrochemical Society, 153 (10) C701-C706 (2006).
Kim et al., "Passivation Effect on Low-k S/OC Dielectrics by $H_2$ Plasma Treatment," Journal of the Korean Physical Society, "40, 1, 94-98 (2002).
Kim et al., "Characteristics of Low Temperaure High Quality Silicon Oxide by Plasma Enhanced Atomic Layer Deposition with In-Situ Plasma Densification Process," The Electrochemical Society, ECS Transactions, *College of Information and Communication Engineerign, Sunakvunkwan University,* 53(1).
King, Plasma Enhanced Atomic Layer Deposition of SiNx: H and $SiO_2$, J. Vac. Sci. Technol., A29(4) (2011).
Koo et al., "Characteristics of $Al_2O_3$ Thin Films Deposited Using Dimethylaluminum Isopropoxide and Trimethylaluminum Precursors by the Plasma-Enhanced Atomic-Layer Deposition Method," Journal of Physical Society, 48, 1. 131-136 (2006).

(56) References Cited

OTHER PUBLICATIONS

Kurosawa et al., "Synthesis and Characterization of Plasma-Polymerized Hexamethyldisioxane Films," Thin Solid Films, 506-507, 176-179 (2006).

Lieberman, et al., "Principles of Plasma Discharges and Materials Processing," Second Edition, 368-381.

Lim et al., "Low-Temperature Growth of SiO2 Films by Plasma-Enhanced Atomic Layer Deposition," ETRI Journal, 27 (1), 118-121 (2005).

Liu et al., "Research, Design, and Experimen of End Effector for Wafer Transfer Robot," Industrial Robot: An International Journal, 79-91 (2012).

Mackus et al., "Optical Emission Spectroscopy as a Tool for Studying Optimizing, and Monitoring Plasma-Assisted Atomic Layer Deposition Processes," Journal of Vacuum Science and Technology, 77-87 (2010).

Maeno, "Gecko Tape Using Carbon Nanotubes," Nitto Denko Gihou, 47, 48-51.

Marsik et al., "Effect of Ultraviolet Curing Wavelength on Low-k Dielectric Material Proerties and Plasma Damage Resistance," Sciencedirect.com, 519, 11, 3619-3626 (2011).

Morishige et al., "Thermal Desorption and Infrared Studies of Ammonia Amines and Pyridines Chemisorbed on Chromic Oxide," J.Chem. Soc., Faraday Trans. 1, 78, 2947-2957 (1982).

Mukai et al., "A Study of CD Budget in Spacer Patterning Technology," Proc. Of SPIE, 6924, 1-8 (2008).

Nogueira et al., "Production of Highly Hydrophobic Films Using Low Frequency and High Density Plasma," Revista Brasileira de Aplicacoes de Vacuo, 25(1), 45-53 (2006).

Schmatz et al., "Unusual Isomerization Reactions in 1.3-Diaza-2-Silcyclopentanes," Organometallics, 23, 1180-1182 (2004).

Scientific and Technical Information Center EIC 2800 Search Report dated Feb. 16, 2012.

Shamma et al., "PDL Oxide Enabled Doubling," Proc. Of SPIE, 6924, 69240D, 1-10 (2008).

Wirths, et al, "SiGeSn Growth tudies Using Reduced Pressure Chemical Vapor Deposition Towards Optoeleconic Applications," This Soid Films, 557, 183-187 (2014).

Yun et al., "Behavior of Various Organosilicon Molecules in PECVD Processes for Hydrocarbon-Doped Silicon Oxide Films," Solid State Phenomena, vol. 124-126, 347-350 (2007).

\* cited by examiner

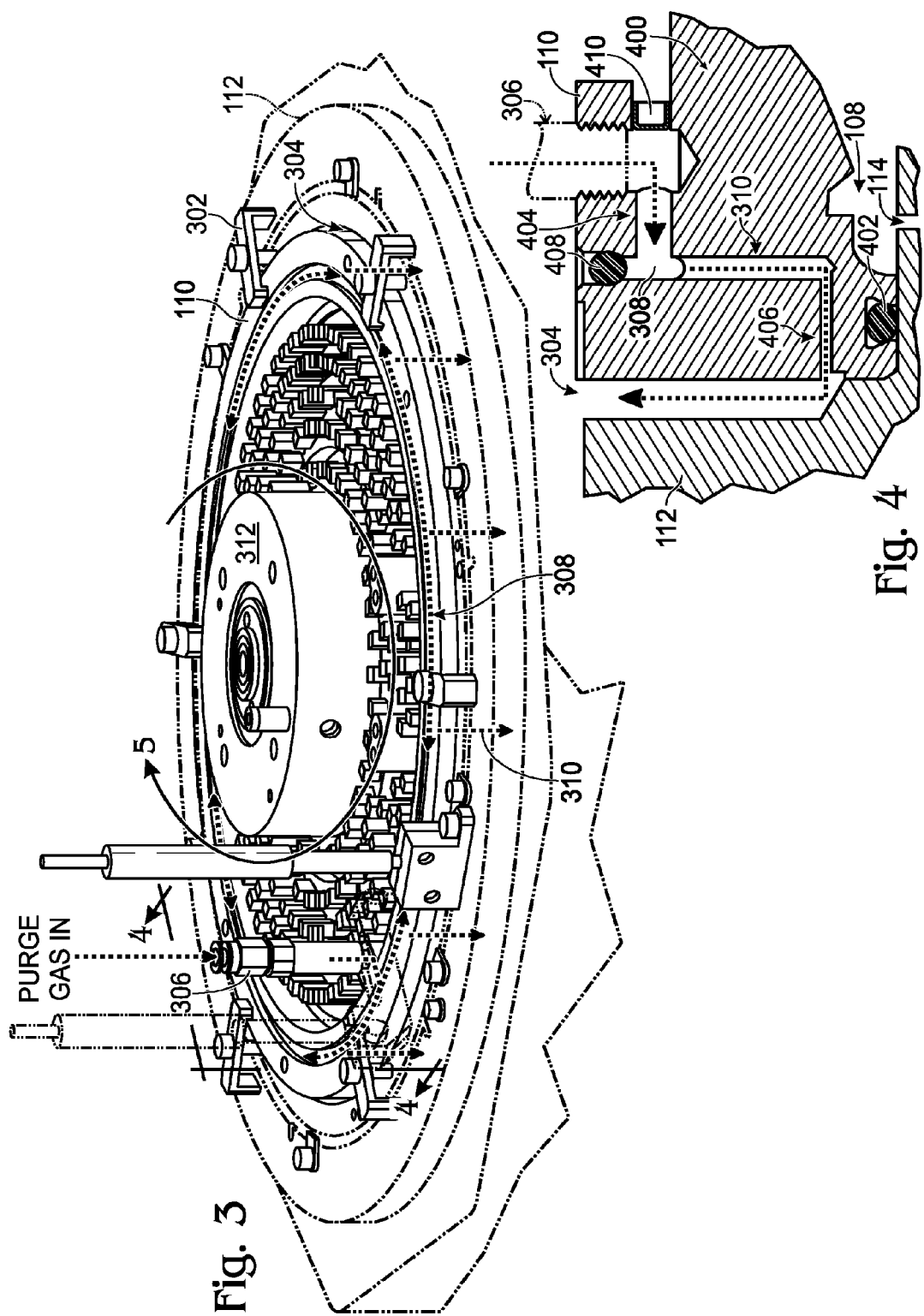

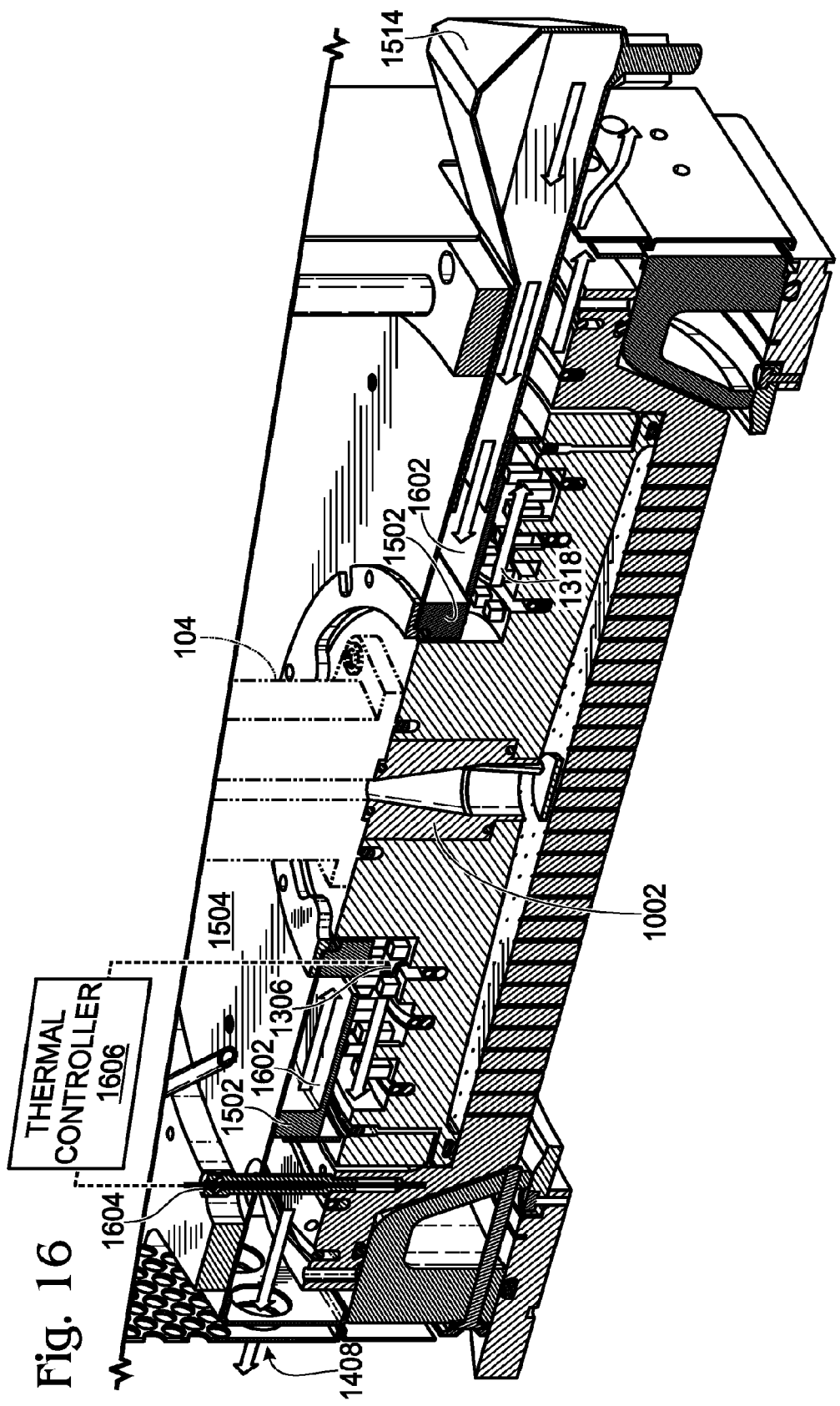

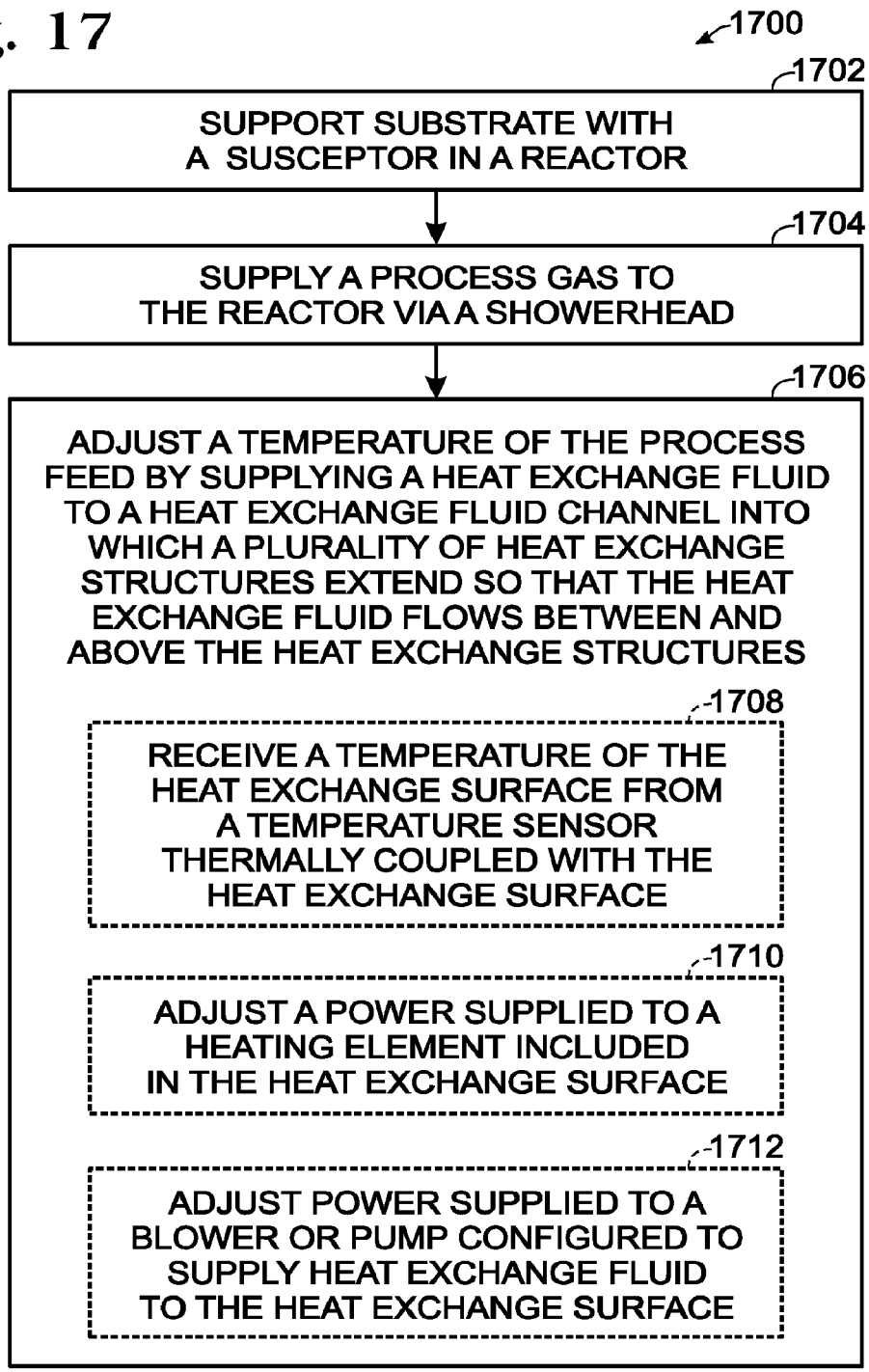

PROCESS FEED MANAGEMENT FOR SEMICONDUCTOR SUBSTRATE PROCESSING

CROSS-REFERENCE TO RELATED APPLICATIONS

This application is a continuation of and claims priority to U.S. patent application Ser. No. 13/284,642 entitled "PROCESS FEED MANAGEMENT FOR SEMICONDUCTOR SUBSTRATE PROCESSING," filed Oct. 28, 2011, the disclosure of which is hereby incorporated herein by reference.

BACKGROUND

Supplying process reactants to semiconductor processing tools can be difficult. For example, ambient gases may diffuse into low pressure portions of the process tool, potentially contaminating process reactants. Further, some process reactants may condense on various process tool surfaces under some processing conditions. Contamination and/or condensation of process reactants may lead to substrate quality problems as well as potential process control problems.

SUMMARY

Various embodiments are disclosed herein that relate to managing the process feed conditions for a semiconductor process module. For example, one embodiment provides a gas channel plate for a semiconductor process module. The example gas channel plate includes a heat exchange surface including a plurality of heat exchange structures separated from one another by intervening gaps. The example gas channel plate also includes a heat exchange fluid director plate support surface for supporting a heat exchange fluid director plate above the plurality of heat exchange structures so that at least a portion of the plurality of heat exchange structures are spaced from the heat exchange fluid director plate.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 3 schematically shows a larger isometric view taken along line 3 of the portion of the semiconductor process module shown in FIG. 2.

FIG. 4 schematically shows a cross-section taken along line 4 of the portion of the semiconductor process module shown in FIG. 3.

FIG. 16 schematically shows a sectioned isometric view of air flow distribution from a heat exchange plenum assembly to a heat exchange fluid channel formed above a gas channel plate according to an embodiment of the present disclosure.

FIG. 17 shows a flowchart for a method of processing a semiconductor substrate in a semiconductor process module according to an embodiment of the present disclosure.

DETAILED DESCRIPTION

Figure 1:
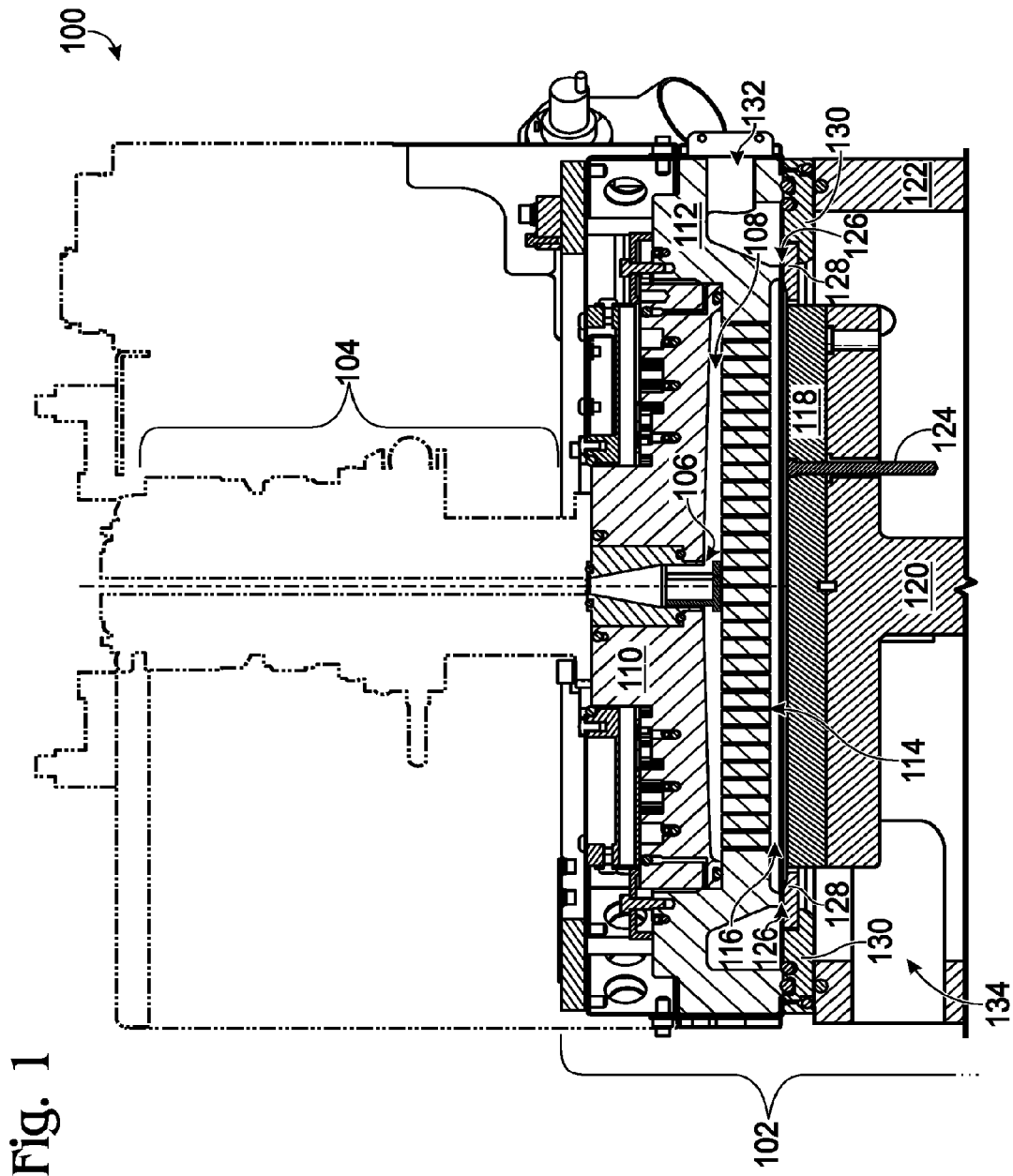
FIG. 1 schematically shows a semiconductor process module according to an embodiment of the present disclosure.

Modern semiconductor devices may include integrated structures formed by the deposition of films in high-aspect ratio cavities or under low thermal budget conditions. Typical chemical vapor deposition (CVD), thermal growth, and/or physical vapor deposition (PVD) approaches may not be suited to the process integration constraints for such structures. Atomic layer deposition (ALD) processes are sometimes used to address these challenges. In ALD processes, thin layers of film are deposited by alternately adsorbing two or more reactants to the substrate without supplying the reactants to the substrate process environment concurrently. By supplying each reactant separately, only deposited film layers and the surface active species of one reactant chemisorbed to those film layers are present on the substrate when the other reactant is supplied. Consequently, highly conformal films may be formed on the substrate surface, even in high-aspect ratio features.

The layer-by-layer nature of ALD processes may present challenges to enhance substrate throughput during manufacturing. For example, some approaches to increase throughput include selecting process reactants based on reactivity characteristics that may enhance surface decomposition reactions on the substrate relative to other process reactants. However, the presence of ambient gases, such as oxygen and/or water vapor, may lead to increases in gas phase decomposition as the reactivity of process reactants increases, potentially leading to substrate non-uniformity defects, small particle defects that may decorate the substrate surface, and/or film composition contamination.

Other approaches to enhance throughput include supplying the substrate with a quantity of reactant suitable to provide acceptable substrate coverage of surface active species in a short-duration, high-concentration pulse. However, because some process reactants, such as those including metals, may have higher molecular weights than the carrier gases with which they may be mixed, it may be more difficult to distribute the process reactant on the substrate surface with suitable coverage as pulse duration decreases. Consequently, cross-substrate concentration gradients may form in the gas phase above the substrate during process reactant exposure phases that may lead to substrate non-uniformity defects. In some settings, process reactants may condense on process surfaces even under vacuum conditions. Such reactant condensation upstream of the substrate may lead to small particle defect decoration on the substrate surface. Additionally or alternatively, some process reactants may undergo gas phase or surface decomposition upstream of the substrate, potentially leading to film contamination or other process quality problems. While the problems that may result from process reactants like those described above, such as organometallic reactants having low vapor pressures, are described herein in the context of ALD processes, it will be understood that similar issues may exist for some process reactants used m some low-pressure CVD deposition processes, low-pressure etch processes, and so on.

The disclosed embodiments relate to hardware and methods for managing the process feed conditions for a semiconductor process module. For example, one embodiment provides a network of purge gas channels included in a gas channel plate or a showerhead for a semiconductor process module. The example purge gas channels fluidly communicate with an ambient environment via gaps positioned between the ambient environment and a gasket sealing the gas channel plate or the showerhead to another portion of the semiconductor process module. Consequently, ambient gas diffusion or permeation across the gasket and into the low pressure reactor may be mitigated, potentially reducing film impurities and/or particle defects.

Another embodiment provides a semiconductor process module including a showerhead volume upstream of a substrate. The example showerhead volume includes contours configured to form a radially symmetric profile within the showerhead volume with respect to an axial centerline of a process feed inlet opening into the showerhead volume. The example showerhead volume contours are shaped so that opposing surfaces of the semiconductor process module forming the outer edges of the showerhead volume are closer to one another than those same surfaces at a central region of the showerhead volume. Thus, though process feed is distributed to the substrate via showerhead gas distribution holes distributed across the showerhead, the process feed velocity may remain approximately constant as the radial distance from the process feed inlet increases, potentially enhancing substrate uniformity.

Another embodiment provides a heat exchanger for a showerhead volume of a semiconductor process module. The example heat exchanger includes a heat exchanger fluid director plate and a gas channel plate. The example gas channel plate includes a plurality of heat exchange structures separated from one another by intervening gaps. The example heat exchange fluid director plate is supported above a heat exchange surface of the gas channel plate to form a heat exchange fluid channel into which the plurality of heat exchange structures protrude so that heat exchange fluid may flow between and above a portion of the heat exchange structures. Consequently, condensation of process reactants within the showerhead volume may potentially be reduced, as may gas phase and/or surface reaction of process reactants upstream of the substrate. In turn, defect generation caused by gas phase and/or condensed phase reactions may potentially be avoided. It will be understood that the various embodiments described herein are not intended to be limited to solving the example problems referenced within this disclosure, which are provided for illustrative purposes.

The disclosed embodiments may be fabricated from virtually any suitable materials. For example, various structural portions may be fabricated from aluminum, titanium, and/or stainless steel that may provide suitable mechanical, thermal, and/or chemical properties relevant to a particular portion of a selected embodiment. Other portions may be made from suitable ceramics or polymers. For example, various gaskets may include synthetic elastomer and/or fluoroelastomer materials that may provide enhanced chemical resistance to some the process feeds, such as halogenated inorganic compounds, relative to alternative sealing materials. Accordingly, it will be understood that descriptions of example materials or fabrication techniques are provided for illustrative purposes alone. Such descriptions are not intended to be limiting.

FIG. 1 schematically shows a cross-section of an embodiment of a semiconductor process module 100. Semiconductor process module 100 may be used for processing semiconductor substrates via any suitable process, e.g., film deposition, film etch, and the like. While the embodiment of semiconductor process module 100 depicted in FIG. 1 shows a single module, it will be appreciated that any suitable number of process modules may be included in a processing tool so that substrates may be transferred between process modules without being exposed to ambient conditions. For example, some processing tools may include just one module while other processing tools may include two or more modules. While not shown in FIG. 1, various load locks, load ports, and substrate transfer handling robots may be used to transfer substrates between ambient conditions and semiconductor process module 100 before, during, and after substrate processing.

As shown in FIG. 1, semiconductor process module 100 includes a low pressure reactor 102 for processing semiconductor substrates. The process feed is supplied to reactor 102 via a pulse valve manifold 104. Pulse valve manifold 104 delivers the process feeds, including reactant gases and/or inert gases, to reactor 102 via suitable valves and distribution plumbing that manage the flow of the process feed during various portions of substrate processing and/or module maintenance processing events. The process feed is supplied from pulse valve manifold 104 to reactor 102 via a process feed inlet 106.

Process feed inlet 106 opens into a central region of showerhead volume 108 formed between a gas channel plate 110 and a showerhead 112. For example, in some embodiments, an axial centerline of process feed inlet 106 may be aligned with a central axis of showerhead volume 108, so that process feed may potentially be uniformly distributed radially within showerhead volume 108. Showerhead volume 108 provides a space for the process feed flow to develop upon exit from process feed inlet 106, potentially providing time and space for the velocity and flow of the process feed to adjust from the higher velocity conditions likely present within pulse valve manifold 104 to the comparatively lower velocity conditions likely selected for substrate processing. In some embodiments, showerhead volume 108 may enclose a volume of between 100,000 and 800,000 mm$^3$. In one non-limiting example, showerhead volume 108 may enclose a volume of between 300,000 and 500,000 mm$^3$ upstream of a single 300-mm diameter substrate.

In the embodiment shown in FIG. 1, the process feed flows radially from process feed inlet 106 toward the outer edges of showerhead volume 108 while being drawn downward toward showerhead distribution holes 114. In some embodiments, the showerhead volume contours may be shaped so that opposing surfaces of gas channel plate 110 and showerhead 112 that form showerhead volume 108 are closer to one another at the outer edges of showerhead volume 108 than those same surfaces at a central region of showerhead volume 108.

Showerhead distribution holes 114 direct the process feed toward substrate process environment 116 where substrate processing occurs. A susceptor 118 supports a substrate (not shown) within substrate process environment 116 during processing operations. Susceptor 118 may include a heater used to adjust a temperature of the substrate before, during, and/or after substrate processing. Susceptor 118 is mounted on an elevator 120 so that the substrate may be raised and lowered within lower reactor 122 to facilitate substrate transfer in and out of semiconductor process module 100. A lift pin 124 is included to raise and lower the substrate from susceptor 118 during substrate transfer operations.

Portions of unreacted process feed, carrier gases, and gases produced during substrate processing are exhausted from substrate process environment 116 via process exhaust outlet 126. In the embodiment shown in FIG. 1, the process exhaust outlet 126 is formed at least in part by a gap extending around an outer circumference of substrate process environment 116 between showerhead 112 and flow control ring 128. Thus, in the depicted embodiment, a portion of process exhaust flows in radial direction away from a center of substrate process environment 116 toward the process exhaust outlet 126. Other portions of the process exhaust may also flow into lower reactor 122, sealed to showerhead 112 via purge plate 130 with a gasket, via a gap formed between a susceptor 120 and flow control ring 128.

Pressure within reactor 102 is controlled at least in part by one or more pressure control devices (not shown), such as a throttle valve, fluidly coupled with upper reactor exhaust 132 and lower reactor exhaust 134. However, it will be appreciated that pressure within reactor 102 may also be controlled by suitable manipulation of various gas feeds to and bypasses around reactor 102. Accordingly, such feeds and bypasses may also be considered pressure control devices within the scope of the present disclosure.

Figure 2:
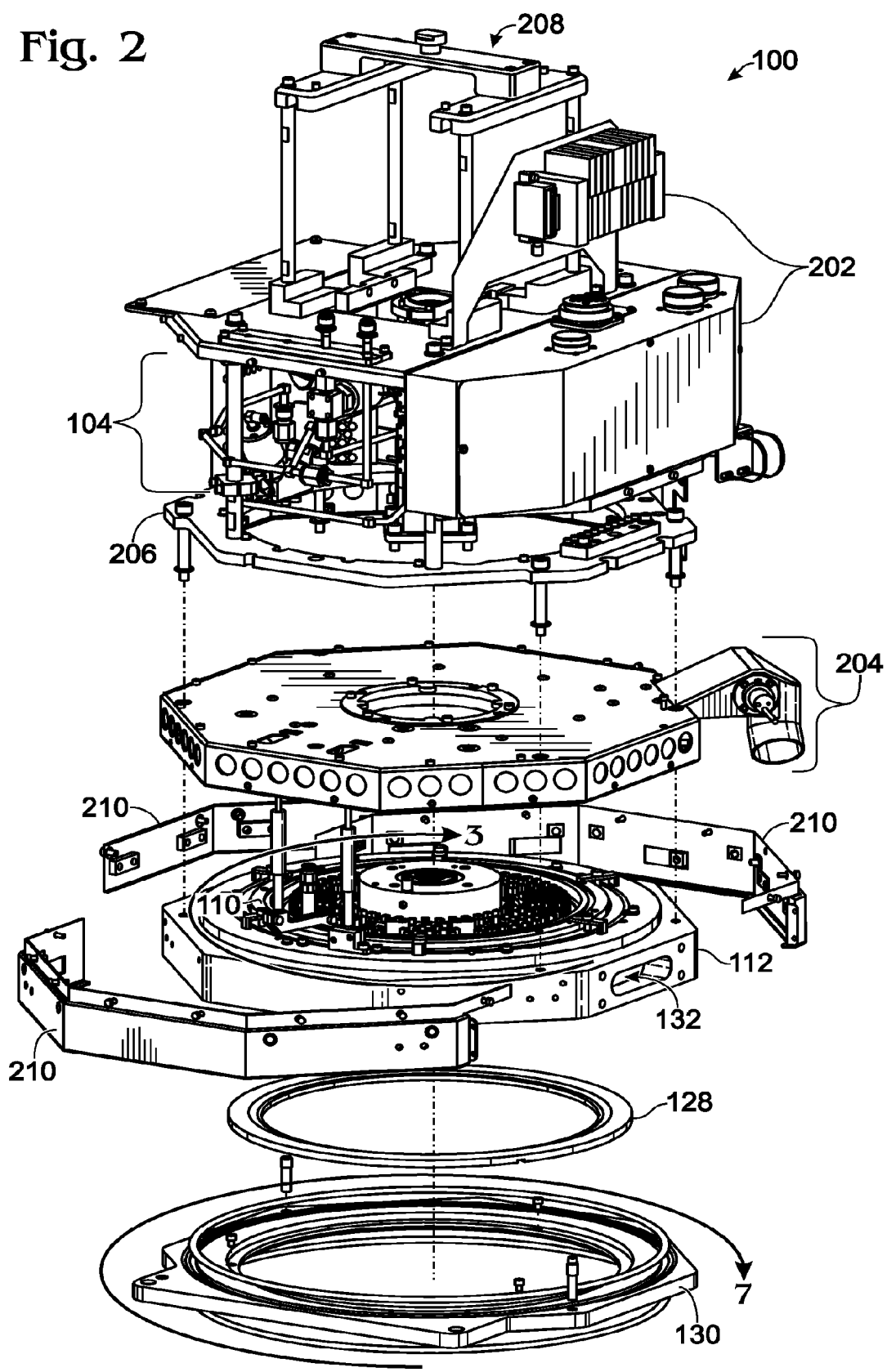
FIG. 2 schematically shows an exploded isometric view of a portion of the semiconductor process module of FIG. 1

FIG. 2 schematically shows an exploded isometric view of portions of the embodiment of semiconductor process module 100 shown in FIG. 1. As shown in FIG. 2, a system process controller 202 (described in more detail below) for controlling various aspects of semiconductor process module 100 is provided. System process controller 202 and pulse valve manifold 104 are shown in FIG. 2 as being mounted above gas channel plate 110, showerhead 112, and a heat exchange plenum assembly 204 (described in more detail below) via a support plate 206. A lift point 208 is provided for raising portions of semiconductor process module 100, such as pulse valve manifold 104, for maintenance procedures.

FIG. 2 also shows a plurality of showerhead access covers 210 positioned around showerhead 112. Though not shown in FIG. 2, it will be appreciated that other suitable covers may be provided to shield access to portions of pulse valve manifold 104, portions of upper reactor 104, and/or portions of lower reactor 102. Such access covers may include ventilation ports to permit the passage of air while generally restricting casual tool and/or user access.

FIG. 3 schematically shows a sectioned isometric view of gas channel plate 110 and showerhead 112 taken along line 3 of the embodiment shown in FIG. 2. As shown in FIG. 3, gas channel plate 110 is connected to showerhead 112 by a plurality of clips 302 adapted to maintain a predetermined gap 304 between gas channel plate 110 and showerhead 112. Retaining gas channel plate 110 and showerhead 112 with clips 302 may help to maintain a relative position between the respective parts when semiconductor process module 100 is at ambient pressure.

When semiconductor process module 100 is under vacuum, ambient gases, such as oxygen and water vapor, may diffuse into low pressure environments like showerhead volume 108 and/or process environment 116, potentially contaminating the process feed, generating small particle defects, causing film contamination, impurity incorporation, and/or substrate non-uniformity defects. As used herein, a low pressure environment refers to portions of semiconductor process module 100 that experience sub-ambient pressure during process and/or maintenance operations. For example, showerhead volume 108 may exhibit a pressure within a range of 0.5 to 20 Torr in some non-limiting process settings. As another example, process environment 116 may experience a pressure within a range of 0.5 to 5 Torr in some non-limiting process settings. By reducing the pressure below an ambient pressure within showerhead volume 108 or process environment 116, a low pressure environment is created within that respective portion of semiconductor process module 100.

In some embodiments, gap 304 may act as an exit path for purge gases used to dilute the concentration of ambient gases, reducing their chemical potential for permeation from the outer perimeter (e.g., from an ambient side) of a gasket positioned between showerhead 112 and gas channel plate 110. For example, FIG. 3 shows a purge gas inlet 306 fluidly connected to a network of purge gas channels that that supply purge gas to gap 304. As shown in FIG. 3, a suitable purge gas, like nitrogen, argon, helium, or the like, may be delivered via an annular purge channel 308 and a plurality of vertical purge channels 310 to form a near-continuous annular curtain of dry gas emerging from gap 304. Consequently, moisture and/or oxygen permeation across a seal between showerhead 112 and gas channel plate 110 into reactor 102 may be mitigated, potentially reducing film impurities and/or particle defects.

FIG. 4 shows a cross-section taken along line 4 of the embodiment of FIG. 3 illustrating a portion of a purge gas channel 400. Purge gas channel 400 fluidly communicates with an ambient environment via gap 304 at a location between the ambient environment and a gasket 402 disposed between showerhead 112 and gas channel plate 110. So positioned, a positive flow of purge gas from purge gas inlet 306 toward gap 304 may prevent the diffusion of ambient gas toward and/or across gasket 402 and into substrate process environment 116.

As shown in FIG. 4, purge gas channel 400 receives purge gas via a horizontal purge feed 404 from purge gas inlet 306 and distributes the purge gas around gas channel plate 110 via annular purge channel 308. Portions of the purge gas are diverted to vertical purge channels 310 formed at intervals around the outer edge of gas channel plate 110. Vertical purge channels 310 are connected to horizontal purge channels 406 at preselected intervals. Almost any suitable number of vertical purge channels 310 may be provided at virtually any suitable interval. In some embodiments, eighteen vertical purge channels 310 may be evenly spaced around annular purge channel 308. Horizontal purge channels direct the purge gas to gap 304, where the gas emerges into the ambient environment.

The purge gas channels described herein may be formed in almost any suitable manner. Non-limiting examples of techniques for forming the various annular purge gas channels include milling and/or casting. The various vertical purge gas channels may also be formed by drilling, casting, or other suitable techniques. It will be understood that the fabrication of the purge gas channels may leave openings that may result in fugitive emissions of purge gas, potentially leading to pressure drop within the purge system and/or reduced flow rate from gap 304. In some embodiments, some or all of these openings may be fitted with removable and/or permanent closures or seals. For example, FIG. 4 depicts a flexible cord or gasket 408 that may seal an opening above annular purge channel 308 and a cap 410 used to seal horizontal purge feed 404 in some embodiments. Such seals and caps may avoid or reduce fugitive emissions of purge gas from openings used to fabricate the purge gas channels.

Ambient gases may also contaminate the low pressure environment by diffusion from confined spaces after maintenance activity. Such "virtual leaks" can be difficult to trace, as the ambient gas results from gas trapped in so-called "dead volumes," or volumes that are exposed to the low pressure environment but that are not readily purged or pumped down. Thus, in some embodiments, some seals and gaskets may be positioned within a preselected distance of a low pressure environment such as showerhead volume 108, process environment 116, suitable portions of the process feed upstream of showerhead volume 108 and suitable portions of the process exhaust downstream of process environment 116.

For example, FIG. 4 schematically shows gasket 402 positioned near showerhead volume 108 so that a low pressure environment formed within showerhead volume 108 may pump away residual ambient gases that may be trapped between mating surfaces of showerhead 112 and gas channel plate 110 on a low pressure side of gasket 402. In some embodiments, a seal or gasket may be positioned within a range of 0.5 to 20 mm of a low pressure environment. For example, in some non-limiting scenarios, a gasket may be positioned within a range of 0.5 to 20 mm from a nearest outer edge of showerhead volume 108. In some other scenarios, a gasket may be positioned within 4 mm of a nearest outer edge of showerhead volume 108, within an acceptable tolerance.

As another example, in some embodiments, a seal or gasket sealing showerhead volume 108 may be positioned within a preselected distance of a showerhead distribution hole 114. In the embodiment shown in FIG. 4, gasket 402 is shown positioned near showerhead distribution hole 114. Positioning a gasket near showerhead distribution hole 114 may allow the low pressure environment to rapidly pump away residual ambient gases that may be trapped between mating surfaces of showerhead 112 and gas channel plate 110 on a low pressure side of gasket 402. In some embodiments, a seal or gasket may be positioned within a range of 0.5 to 20 mm of a showerhead distribution hole 114. For example, in some non-limiting scenarios, a gasket may be positioned 5 mm from a nearest showerhead distribution hole 114, within an acceptable tolerance.

It will be appreciated that the approaches to managing ambient gas exposure to the low pressure environment may also be applied to other portions of semiconductor process module 100. For example, purge gas channels may also be included in other portions of semiconductor process module 100 to prevent ambient gas diffusion into substrate process environment 116 and/or low pressure environments. For example, in some embodiments, gas channel plate 110 may include a purge gas channel fluidly communicating with an ambient environment at a location between the ambient environment and a gasket disposed between the gas channel plate and a pulse valve manifold positioned upstream of the gas channel plate.

Figure 5:
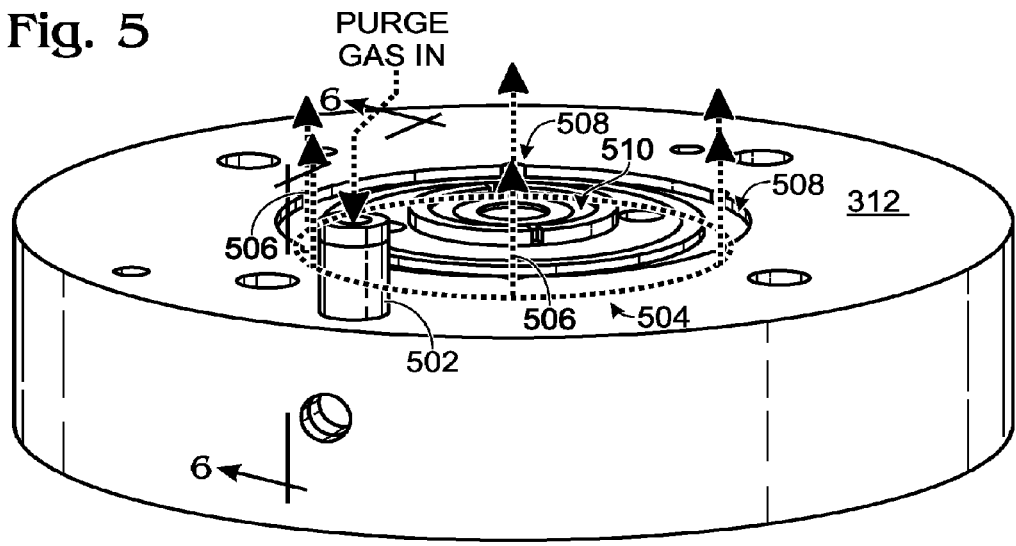
FIG. 5 schematically shows a larger isometric view taken along line 5 of the portion of the semiconductor process module shown in FIG. 3.

FIG. 5 schematically shows a sectioned isometric view taken along line 5 of the embodiment shown in FIG. 3. The embodiment shown in FIG. 5 shows an island 312 included in gas channel plate 110 used to mount pulse valve manifold 104 to gas channel plate 110. As shown in FIG. 5, island 312 includes a purge gas inlet 502 fluidly connected to a network of purge gas channels for distributing purge gas within island 312, including an annular purge channel 504 and a plurality of vertical purge channels 506 that supply purge gas to the ambient environment via scallop-shaped gaps 508. In the embodiment depicted in FIG. 5, gaps 508 positioned on an ambient side of a groove 510 adapted retain a gasket sealing island 312 to pulse valve manifold 104 potentially allow a purge gas to prevent ambient gases from permeating beyond the gasket and into the low pressure environment.

Figure 6:
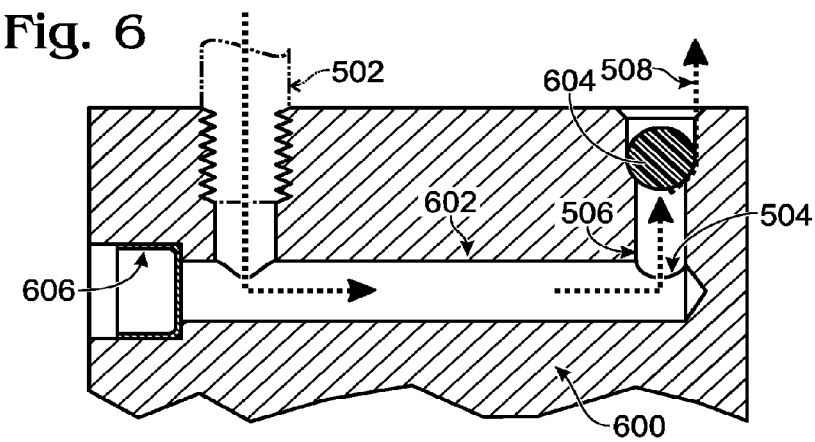
FIG. 6 schematically shows a cross-section taken along line 6 of the portion of the semiconductor process module shown in FIG. 5.

FIG. 6 shows a cross-section taken along line 6 of the embodiment shown in FIG. 5, illustrating a portion of a purge gas channel 600. In the embodiment depicted, purge gas enters purge gas channel 600 via purge gas inlet 502 and is distributed to annular purge channel 504 via a horizontal purge feed 602. Annular purge channel 504 distributes the purge gas around island 312 to vertical purge channels 506, which divert portions of the purge gas toward gaps 508 at preselected intervals. Virtually any suitable number of vertical purge channels 506 may be provided at almost any suitable interval. In some embodiments, six vertical purge channels 506 may be evenly spaced around annular purge channel 504 within island 312. As shown in FIG. 6, gaps 508 opening on to each vertical purge channel 506 permit purge gas to flow from purge gas channel 600 into the ambient environment at a position between the ambient environment and sealing groove 510. FIG. 6 also depicts a flexible cord or gasket 604 that may seal an opening above annular purge channel 504 and a cap 606 used to seal horizontal purge feed 602 in some embodiments. Such closures may avoid or reduce fugitive emissions of purge gas from openings used to fabricate the purge gas channels.

Figure 7:
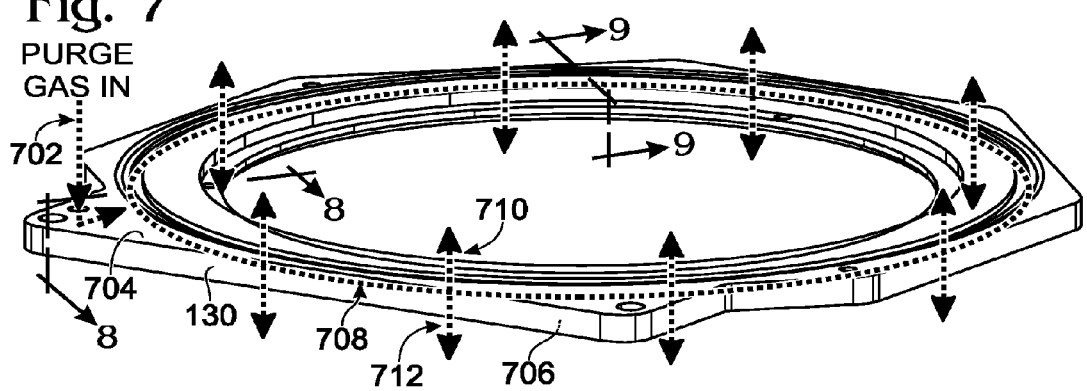
FIG. 7 schematically shows a larger isometric view taken along line 7 of the portion of the semiconductor process module shown in FIG. 2.

As another example, in some embodiments, a purge plate 130 may include purge gas channels configured to prevent diffusion of ambient gases across gaskets sealing showerhead 112 to purge plate 130 and/or lower reactor 122 to purge plate 130. For example, FIG. 7 shows a close-up of the embodiment of purge plate 130 shown in FIG. 2 taken along line 7. As shown in FIG. 7, purge plate 130 includes a purge gas inlet 702 fluidly connected to a purge gas channel for distributing purge gas within purge plate 130. For reference, the embodiment of purge plate 130 shown in FIG. 7 includes an upper surface 704 that interfaces with showerhead 112 and a lower surface 706 that interfaces with lower reactor 122.

The purge gas channel shown in FIG. 7 includes an annular purge channel 708 that is fluidly connected with a plurality of upwardly extending vertical purge channels 710 that purge an ambient environment around a gasket that seals upper surface 704 to showerhead 112. Annular purge channel 708 is also fluidly connected with a plurality of downwardly extending vertical purge channels 712 that purge an ambient environment around a gasket that seals lower surface 706 to lower reactor 122.

Figure 8:
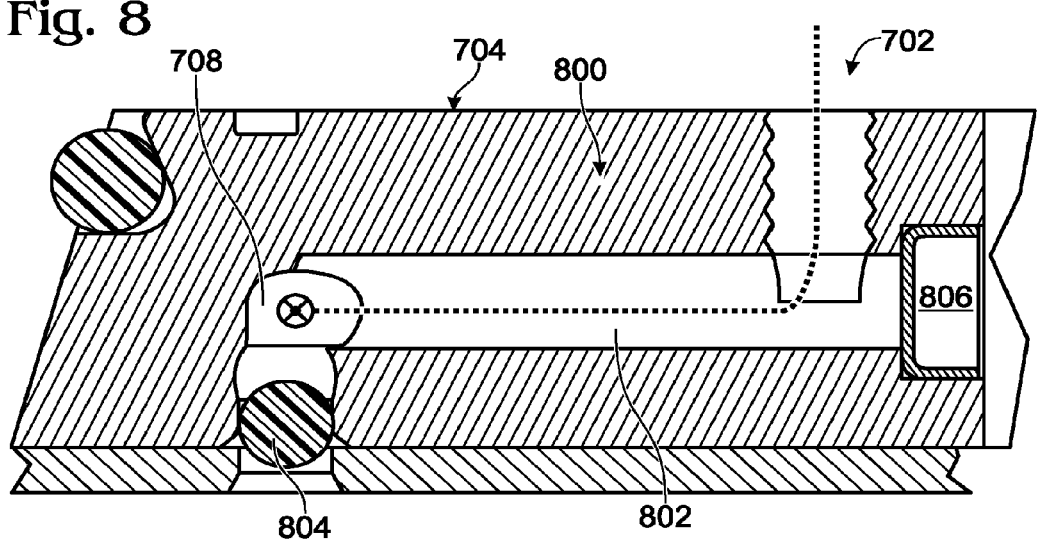
FIG. 8 schematically shows a cross-section taken along line 8 of the portion of the semiconductor process module shown in FIG. 7.
Figure 9:
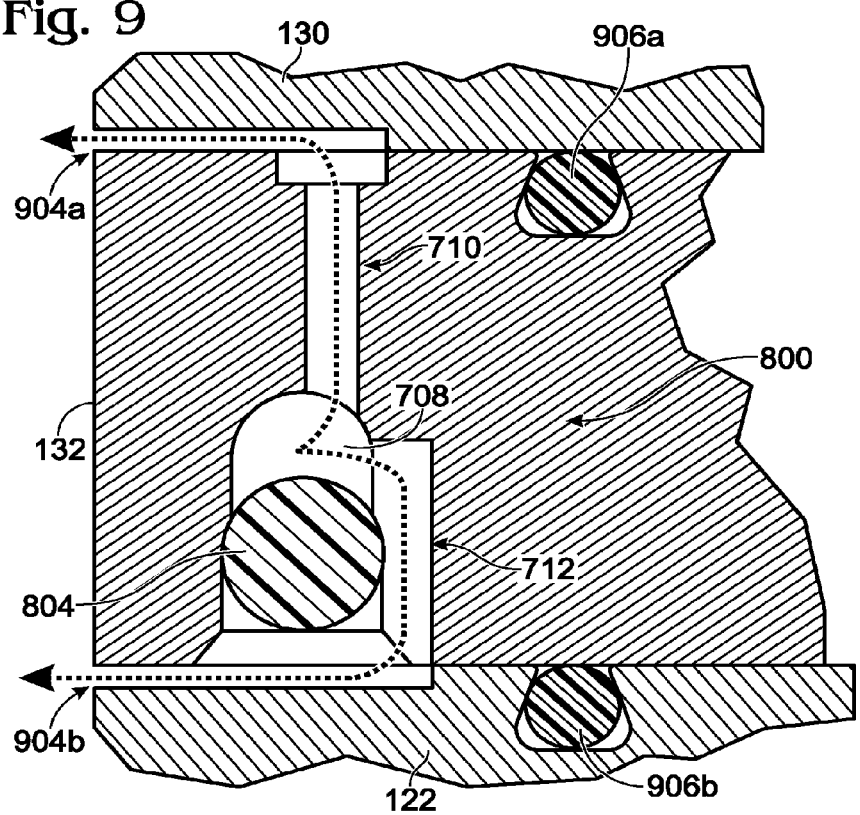
FIG. 9 schematically shows a cross-section taken along line 9 of the portion of the semiconductor process module shown in FIG. 7.

FIGS. 8 and 9 show cross-sections of the embodiment shown in FIG. 7 taken along lines 8 and 9, respectively, illustrating portions of a purge gas channel 800. As shown in FIG. 8, purge gas enters purge gas channel 800 via purge gas inlet 702 and is distributed to annular purge channel 708 via a horizontal purge feed 802. Annular purge channel 708 distributes the purge gas around purge plate 130 to vertical purge channels 710 and 712, which divert portions of the purge gas toward gaps 904, shown in FIG. 9 as 904*a* and 904*b*, at preselected intervals. Virtually any suitable number of vertical purge channels 710 and 712 may be provided at almost any suitable interval. In some embodiments, fourteen pairs of vertical purge channels 710 and 712 may be evenly spaced around annular purge channel 708 within purge plate 130.

The embodiment shown in FIG. 9 shows gaps 904*a* and 904*b* coupling vertical purge channels 710 and 712 with the ambient environment at positions between the ambient environment and gaskets provided to seal purge plate 130 to adjacent surfaces. So positioned, gaps 904*a* and 904*b* allow purge gas to sweep ambient gases away from the gaskets, potentially reducing permeation of ambient gases across those gaskets. Thus, purge gas flowing toward showerhead 112 will flow into gap 904*a* at a position between the ambient environment and gasket 906*a*, and purge gas flowing toward lower reactor 122 will flow into gap 904*b* at a position between the ambient environment and gasket 906*b*. FIGS. 8 and 9 also depict a flexible cord or gasket 804 that may be used to seal an opening above annular purge channel 708 and a cap 806 that may be used to seal horizontal purge feed 802 in some embodiments. Such closures may avoid or reduce fugitive emissions of purge gas from openings used to fabricate the purge gas channels.

Process feed conditions within pulse valve manifold 104 may be adapted to high speed, high pressure delivery of various process feed species to enhance substrate throughput and process speed. However, the rapid expansion of process feed from these conditions into lower pressure conditions within showerhead volume 108 may potentially contribute to substrate process control problems and/or substrate quality excursions. For example, the process feed may experience transient cooling as process feed pressure drops in the vicinity of process feed inlet 106, potentially cooling surfaces surrounding process feed inlet 106. In turn, this may cause condensation of some species of the process feed onto gas channel plate 110 near process feed inlet 106. Further, in some settings, rapid expansion of the process feed may alter fluid mixing of various reactants and inert species included in the process feed. Accordingly, in some embodiments, flow expansion structures may be provided upstream of process feed inlet 106 to transition flow conditions within the process feed.

Figure 10:
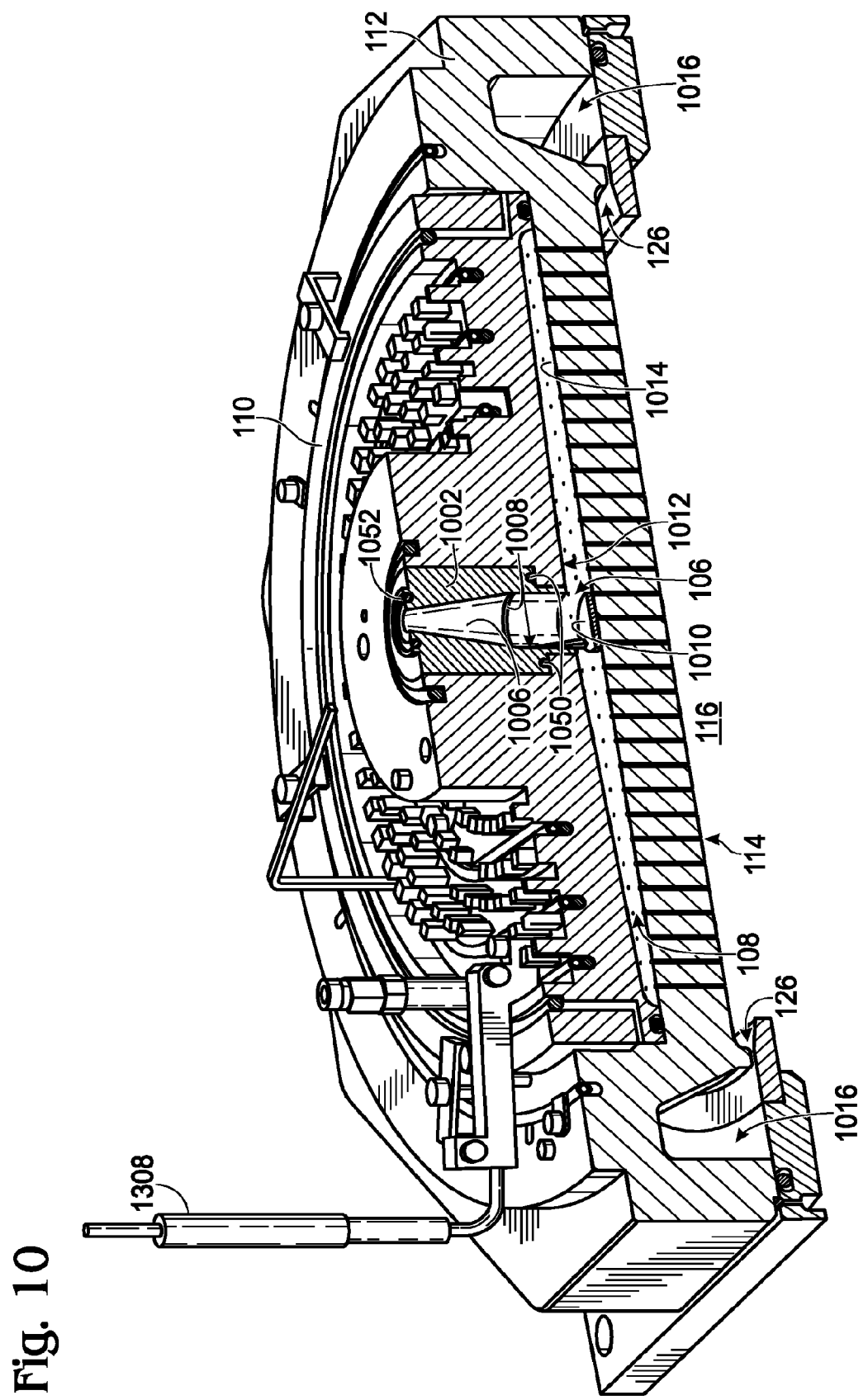
FIG. 10 schematically shows a sectioned isometric view of a showerhead volume profile according to an embodiment of the present disclosure.

FIG. 10 schematically shows a sectioned isometric view of an embodiment of showerhead volume 108 formed between a diffusion surface 1012 of gas channel plate 110 and showerhead 112. As shown in FIG. 10, an optional flow expansion structure 1002 is provided upstream of process feed inlet 106. In some embodiments, flow expansion structure 1002 may assist in transitioning and mixing higher velocity process feed flows exiting pulse valve manifold 104 (shown in FIG. 1) into slower velocity flows within showerhead volume 108 prior to distribution to process environment 116 via showerhead distribution holes 114. For example, in embodiments used in ALD processes, higher velocity pulse trains provided from pulse valve manifold 104 may be transitioned to a slower flow velocity, at least in part, by transmission of the pulse train through flow expansion structure 1002 before a subsequent expansion at the process feed inlet 106.

In the embodiment shown in FIG. 10, a centerline of a flow path included in flow expansion structure 1002 is aligned with a centerline of process feed inlet 106, so that fluid flow within flow expansion structure 1002 may transition smoothly between a smaller upstream diameter and a larger downstream diameter of flow expansion structure 1002. In some embodiments, an upstream diameter of flow expansion structure 1002 may be approximately ⅝ of an inch and a downstream diameter may be approximately 1 inch.

Virtually any suitable manner of expanding fluid flow within flow expansion structure 1002 may be employed without departing from the scope of the present disclosure. As shown in FIG. 10, flow expansion structure 1002 includes a concentric conical expansion shape formed on an inner surface 1006 of the flow expansion structure. Other non-limiting examples of expansion shapes that may be formed on inner surface 1006 include bell-shaped expansion shapes, spiral expansion shapes, and the like, implementations of which may have upstream and downstream diameters that may be concentric or eccentric with one another.

In the embodiment shown in FIG. 10, flow expansion structure 1002 is retained in gas channel plate 110 by a support ledge. A gasket 1050 forms a seal between the support ledge and flow expansion structure 1002. In some embodiments, gasket 1050 may be provided within a predetermined distance, such as a predetermined vertical distance, of showerhead volume 108. This may reduce an interfacial volume formed between mating surfaces of flow expansion structure 1002 and gas channel plate 110 on a low pressure side of gasket 1050, so that residual ambient gases within that interfacial volume may be rapidly pumped away.

The example shown in FIG. 10 also depicts a gasket 1052 for sealing flow expansion structure 1002 to pulse valve manifold 104 (not shown). In some embodiments, gasket 1052 may be provided within a predetermined distance of inner surface 1006. This may reduce an interfacial volume formed between mating surfaces of flow expansion structure 1002 and pulse valve manifold 104 on a low pressure side of gasket 1052, which may potentially have the effect of rapidly pumping away residual ambient gases within that interfacial volume.

An optional impingement plate 1010 is shown in FIG. 10 that may protect showerhead 108 from particles entrained in the process feed and/or assist in redirecting flow of process feed toward outer edges of showerhead volume 108. In some embodiments, impingement plate 1010 may include holes aligned with showerhead distribution holes 114 to avoid formation of a shadow on center portion of a substrate disposed beneath impingement plate 1010. As shown in FIG. 10, impingement plate may be fastened to flow expansion structure 1002 by attachment to a retaining position formed on inner surface 1006 and supported by one or more mounting structures 1008. In embodiments that exclude flow expansion structure 1002, impingement plate 1010 may be attached to a suitable retaining position formed on an inner surface of process feed inlet 106.

As the process feed entering showerhead volume 108 via process feed inlet 106 expands, the velocity and flow orientation of the process feed changes. In the embodiment shown in FIG. 10, the process feed spreads radially from process feed inlet 106 toward outer edges of showerhead volume 108 and showerhead distribution holes 114. Without wishing to be bound by theory, a radial pressure distribution may develop within the embodiment of showerhead volume 108 depicted in FIG. 10. This pressure distribution may result from frictional forces as the process feed flows across a diffusion surface 1012 and along an upper surface 1014 of showerhead 112. Radial pressure variation may also result from flow of the process feed out of showerhead volume 108 via showerhead distribution holes 114. In turn, the process feed velocity may diminish as the distance from the process feed inlet 106 increases. Further, because various species within the process feed, such as reactant gases and carrier gases, may have different molecular weights, diffusion rates of those species within showerhead volume 108 may also be affected by local changes in pressure and gas density. Consequently, process feed distribution to the substrate may be time and position variant, potentially leading to substrate non-uniformity defects.

Accordingly, in some embodiments, showerhead volume 108 may be contoured to enhance the flow of the process feed toward the radial edges of showerhead volume 108. In the embodiment shown in FIG. 10, diffusion surface 1012 includes a radially symmetric profile with respect to an axial centerline of the process feed inlet 106, so that diffusion surface 1012 becomes closer to showerhead 112 as a distance from the axial centerline of the process feed inlet 106 increases. In other words, the surfaces of gas channel plate 110 and showerhead 112 are closer together at the outer edges of showerhead volume 108 than they are at a central region of showerhead volume 108. Thus, as portions of the process feed are distributed via showerhead distribution holes 114, the process feed pressure within a fluid element moving radially outward in showerhead volume 108 may remain approximately constant (within an acceptable tolerance). In turn, the velocity and concentration characteristics of that fluid element may remain approximately constant.

Figure 11:
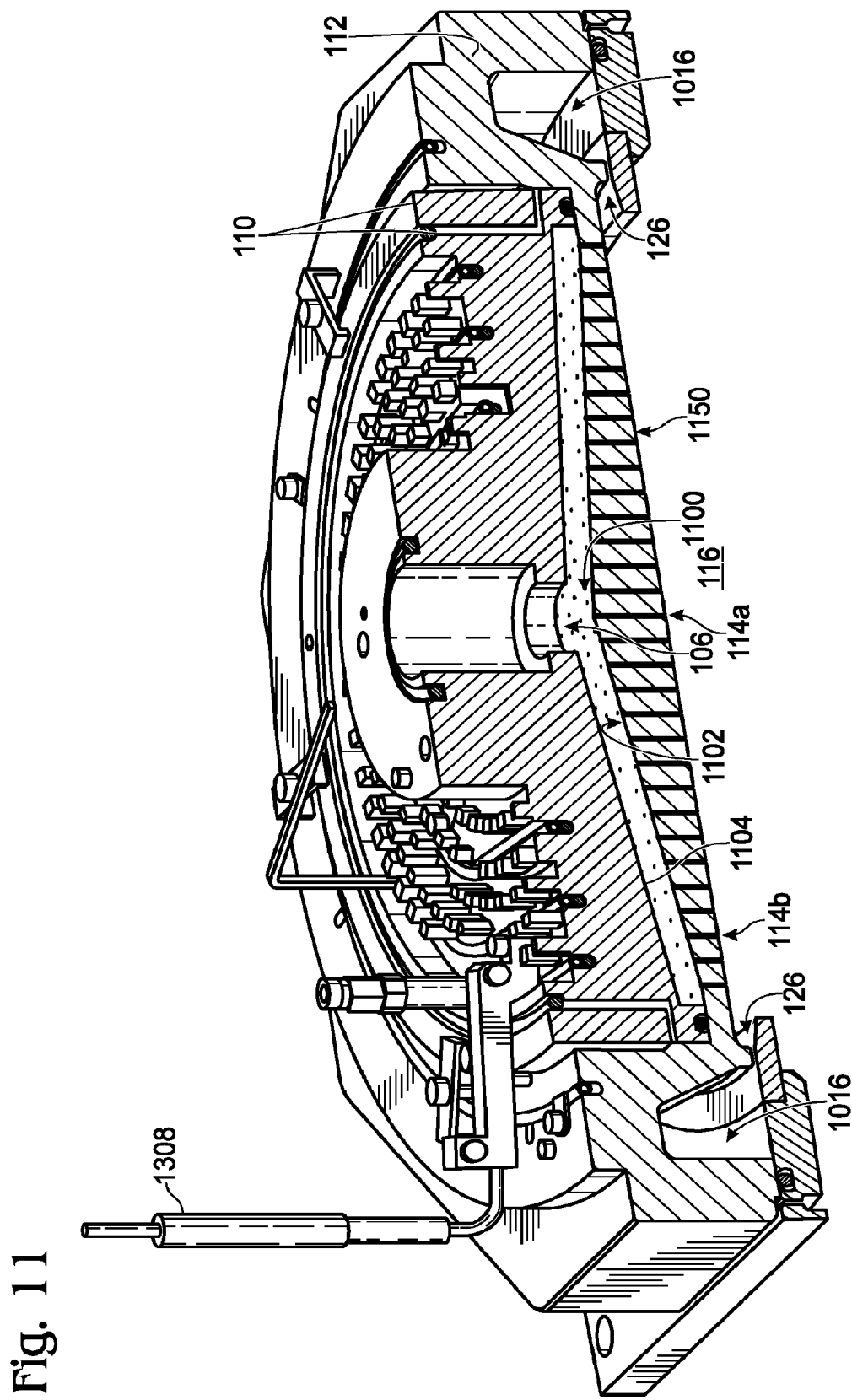
FIG. 11 schematically shows a sectioned isometric view of a showerhead volume profile according to another embodiment of the present disclosure.

While the embodiment in FIG. 10 shows contours of showerhead volume 108 formed by diffusion surface 1012 of gas channel plate 110, it will be appreciated that some embodiments of showerhead volume 108 may include contours formed in gas channel plate 110 and/or showerhead 112. For example, FIG. 11 schematically shows a sectioned isometric view of another embodiment of a showerhead volume 1100 formed between an upper surface 1102 of showerhead 112 and a diffusion surface 1104 of gas channel plate 110. In the embodiment shown in FIG. 11, upper surface 1102 and diffusion surface 1104 are depicted as being parallel with one another, each surface including a radially symmetric profile with respect to an axial centerline of the process feed inlet 106, so that the surfaces remain the same distance apart as a distance from the axial centerline of the process feed inlet 106 increases. For example, in some embodiments, the distance between upper surface 1102 and a lower surface 1150 of showerhead 112 defining an upper surface of process environment 116 may be contoured to provide a preselected residence time distribution of fluid flowing through showerhead distribution holes 114. In one non-limiting scenario, the distance between upper surface 1102 and lower surface 1150 may be configured so that a residence time of a fluid element flowing through a showerhead distribution hole 114 at the center of showerhead 112 (shown in FIG. 11 at 114a) may be within ten percent of a residence time of a fluid element flowing through a showerhead distribution hole 114 positioned at an outer edge of showerhead 112 (shown at 114b). In some settings, providing a constant residence time (within an acceptable tolerance) for fluid flowing within showerhead distribution holes 114 may provide an approximately constant delivery of reactive process feed to the surface of the substrate. In turn, film deposition on the substrate may have enhanced thickness uniformity. In still other embodiments, the diffusion surface of gas channel plate 110 may be configured as a plane surface while a surface of showerhead 112 exposed to showerhead volume 108 may be contoured.

It will be appreciated that almost any suitable contour may be applied to the showerhead volumes described herein without departing from the scope of the present disclosure. In some embodiments, a linearly-shaped radially symmetric profile may be formed on a portion of diffusion surface 1012 and/or upper surface 1014 of the showerhead exposed to showerhead volume 108, the linearly-shaped portion being disposed at an angle of between 0 and 5 degrees with respect to a reference plane positioned parallel with the substrate, such as a reference plane defining a widest portion of showerhead volume 108. For example, where diffusion surface 1012 of gas channel plate 110 is contoured, the linearly shaped portion may be formed at a negative angle of between 0 and −5 degrees with respect to the reference plane. Where upper surface 1014 of showerhead 112 is contoured, the linearly-shaped portion may be formed at a positive angle of between 0 and 5 degrees with respect to the reference plane. Thus, in the embodiment shown in FIG. 10, diffusion surface 1012 may have linear portion being disposed at an angle of between 0 and −5 degrees with respect to a reference plane defining a widest portion of showerhead volume 108. In the embodiment shown in FIG. 11, diffusion surface 1104 may have linear portion being disposed at an angle of between 0 and −5 degrees and upper surface 1102 may have linear portion being disposed at an angle of between 0 and +5 degrees with a reference plane defining a widest portion of showerhead volume 108.

In some other embodiments, non-linear shapes may be formed into portions of a diffusion surface and/or surfaces of a showerhead exposed to a showerhead volume. For example, a portion of a diffusion surface may exhibit a Gaussian-shaped or bell-shaped profile when viewed in cross-section with respect to a reference plane positioned parallel to a substrate, such as a reference plane defining a widest portion of a showerhead volume. The various contours described herein may be formed over any suitable portion of the surfaces on which they are formed. For example, a contour formed on gas channel plate 110 and/or showerhead 112 may be formed so that more than 95% of a surface of respective part exhibits a contour as described herein. Such contours may be formed in almost any suitable manner. For example, the contours may be formed by milling, casting, water jet cutting and/or laser cutting.

While the embodiments illustrated in the figures depict contoured surfaces of example showerheads 112 and gas channel plates 110 that are integrated into those respective items, it will be understood that in some embodiments contoured surfaces may be prepared as separate parts that may be installed into and removed from their respective parts. For example, a first set of contours configured for a first process chemistry may be fitted to a gas channel plate 110 and/or a showerhead 112 and later removed and replaced by a second set of contours configured for a second process chemistry. This may allow for the rapid development and testing of various contours, for example using suitable three-dimensional printing technology, without the replacement of entire showerhead and/or gas channel plate assemblies.

As shown in FIGS. 10 and 11, showerhead 112 includes an annular exhaust passage 1016 integrated within a single body. Annular exhaust passage 1016 conducts the process exhaust from substrate process environment 116 via process exhaust outlet 126 toward upper reactor exhaust 132 (as shown in FIG. 1).

Figure 12:
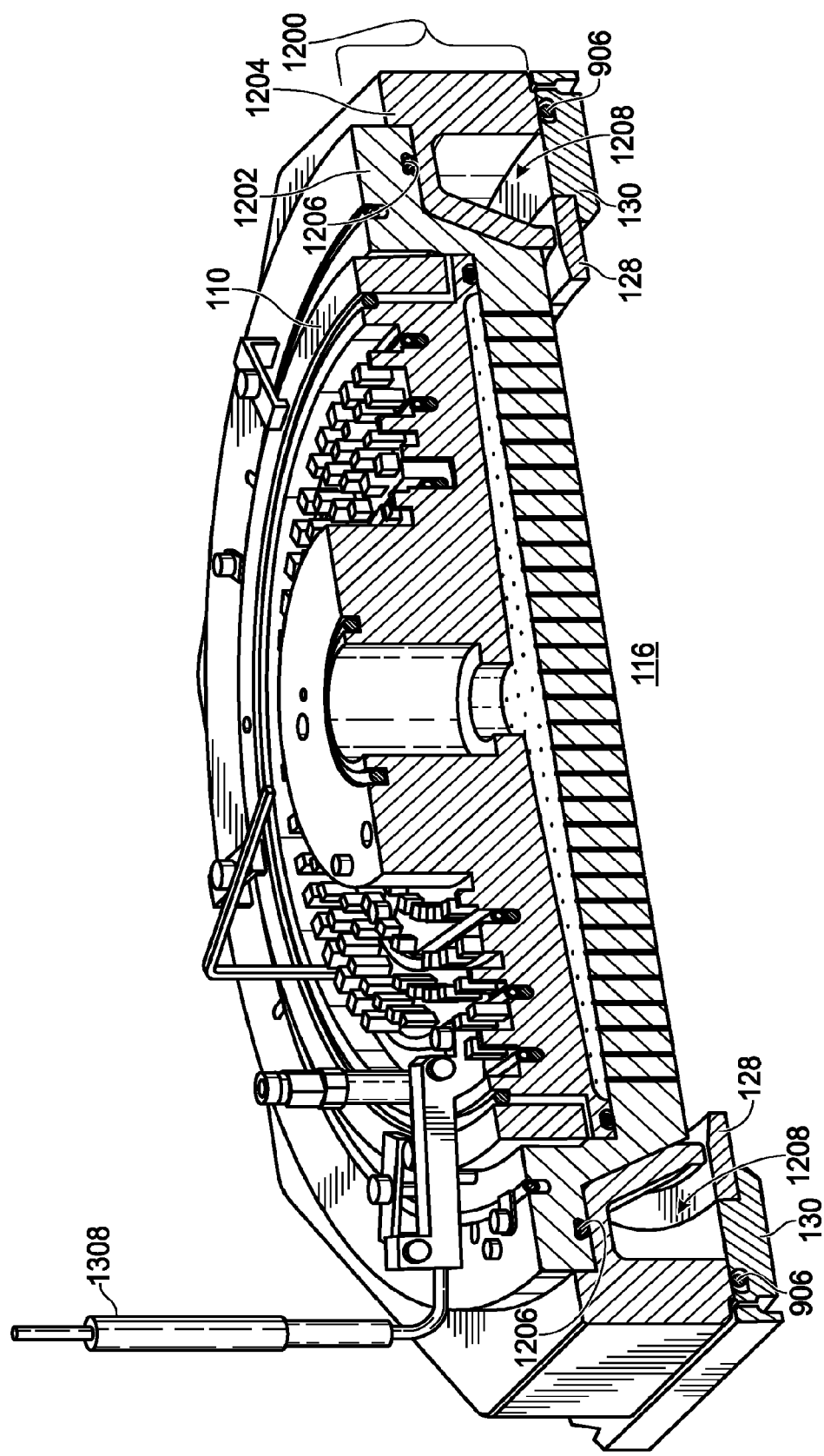
FIG. 12 schematically shows a sectioned isometric view of a two-piece showerhead according to an embodiment of the present disclosure.

In some embodiments, showerhead 112 may comprise an exhaust body configured to gather process exhaust that is separate from a body that distributes the process feed to the substrate. While a single-body showerhead may potentially avoid some dead volumes formed near the outer region of process environment 116, it will be appreciated that a two-piece showerhead may offer other advantages. For example, a two-piece showerhead 112 may allow differently profiled gas distribution bodies to be retrofitted to semiconductor process module 100 without moving the exhaust collection body. In turn, re-calibration of a gap included in the process exhaust outlet 126 may be minor relative to procedures for replacement of a single-body showerhead. FIG. 12 schematically shows a section isometric view of an embodiment of a two-piece showerhead 1200 including a gas distribution body 1202 and an annularly-shaped exhaust passage body 1204. As shown in FIG. 12, gas distribution body 1202 includes a plurality of showerhead distribution holes 114 that distribute process feed to substrate process environment 116. In the embodiment illustrated in FIG. 12, gas distribution body 1202 is sealed to gas channel plate 110 via gasket 402 and to exhaust passage body 1204 via gasket 1206. In some embodiments, gasket 1206 may be positioned within a predetermined distance of process environment 116, which may reduce the potential to trap ambient gases between gas distribution body 1202 and exhaust passage body 1204. Exhaust passage body 1204 is depicted as being sealed to purge plate 130 via gasket 906. Exhaust passage body 1204 includes an annular exhaust passage 1208 that conducts process exhaust from process environment 116 via a gap formed between exhaust passage body 1204 and flow control ring 128.

Some low vapor pressure species included in process feeds supplied to a substrate during substrate processing may condense on process surfaces under some process conditions. For example, some species may condense on surfaces within showerhead volume 108. Accordingly, in some embodiments, semiconductor process module 100 may include heat exchange structures thermally coupled with showerhead volume 108 to adjust a temperature of showerhead volume 108. As used herein, being thermally coupled means that causing a change in temperature of at a heat exchange structure will cause in a change in temperature at a surface of showerhead volume 108 and vice-versa. Such temperature changes may be determined by various suitable techniques, such as infrared- or thermocouple-based temperature measurement techniques.

Such heat exchange structures may be included on a heat exchange surface of gas channel plate 110 that project into a heat exchange fluid. Other heat exchange mechanisms, such as heaters, may also be thermally coupled with showerhead volume 108. In turn, the temperature of showerhead volume 108 may be adjusted during substrate processing so that process feed condensation might potentially be avoided.

Figure 13:
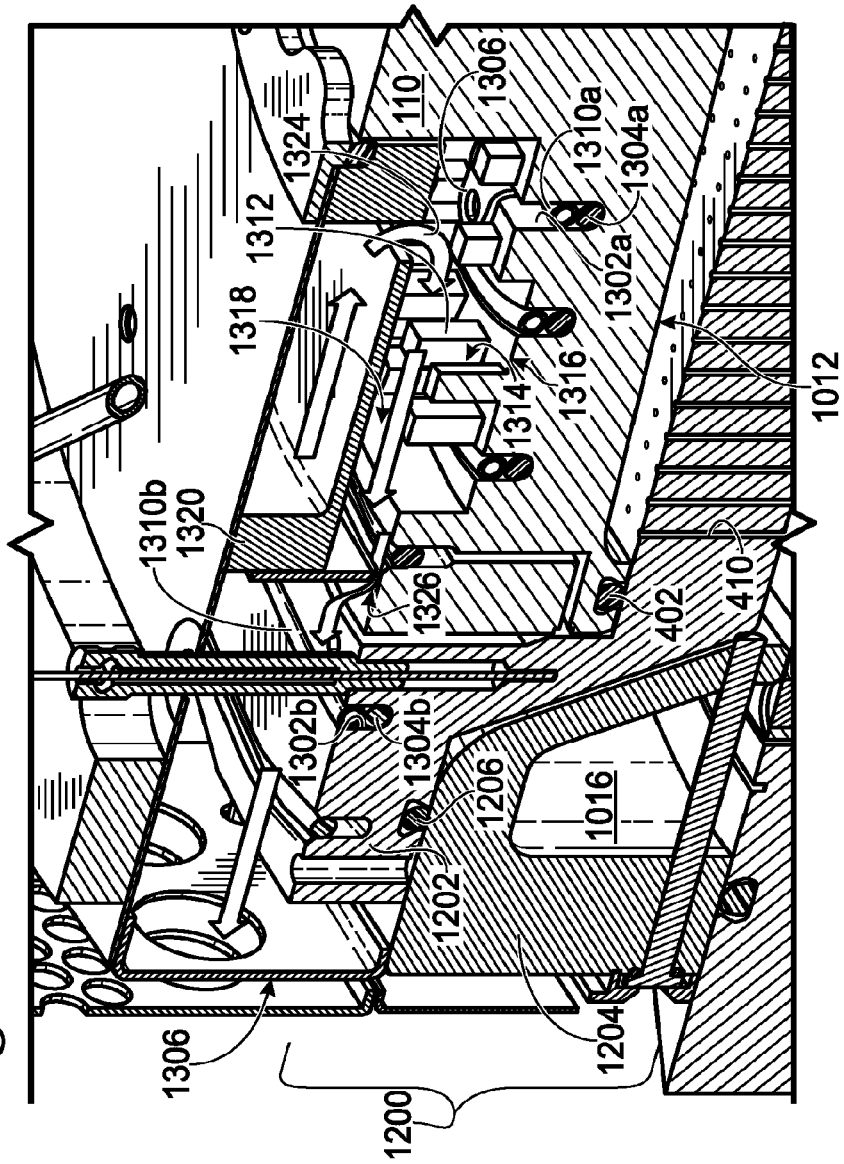
FIG. 13 schematically shows a heat exchange fluid channel formed above a gas channel plate according to an embodiment of the present disclosure.

FIG. 13 schematically shows a close-up sectioned isometric view of a portion of an embodiment of gas channel plate 110. The embodiment shown in FIG. 13 depicts a heater groove included in gas channel plate 110, shown as heater groove 1302*a*. A heater is included in the heater groove, shown as heater 1304*a*. Heater 1304*a* provides heat to gas channel plate 110 and to various surfaces in thermal contact with gas channel plate 110, such as diffusion surface 1012, showerhead 112, and so on. In turn, condensation of process feed on diffusion surface 1012, flow expansion structure 1002 (shown in FIG. 10), and/or surfaces of showerhead volume 108 may potentially be avoided.

In some embodiments, a plurality of heaters may be provided in gas channel plate 110 and showerhead 112, each controlled and powered independently from one another. For example, FIG. 13 shows a heater 1304*b* included in a heater groove 1302*b* included in showerhead 112, heater 1304*b* being independent from and controlled separately from heater 1304*a*. Such an arrangement may be used to provide locational "zone" heating to different portions of gas channel plate 110 and/or showerhead 112. In combination with suitable heater control, zone heating permit the creation of various temperature profiles within showerhead volume 108, showerhead 112, and gas channel plate 110. For example, gas channel plate 110 may be maintained at a lower temperature than showerhead 112, potentially preventing the accumulation of reaction byproducts in exhaust passage 1016. As another example, an arrangement of annularly-nested independently-zoned heaters provided within gas channel plate 110 may allow the creation of a radial temperature profile extending from process feed inlet 106 toward the outer edges of showerhead volume 108. In turn, a central region of showerhead volume 108 may be maintained at a comparatively higher temperature than the outer edges. This approach may potentially prevent condensation of a low-vapor pressure process species near process feed inlet 106, where the partial pressure of that species may be higher.

It will be understood that almost any suitable heater may be employed without departing from the scope of the present disclosure. In some embodiments, a flexible, cable-style heater may be provided that is configured to fit into a heater groove cut into gas channel plate 110. In some embodiments, a heater may include positive temperature coefficient materials configured to exhibit an increase in electrical resistance as temperature increases beyond a predetermined threshold, potentially reducing a risk of damage from temperature excursions exceeding a predetermined ceiling relative to alternate style heaters. In the embodiment shown in FIG. 13, a heater is powered by electricity supplied via a heater power connection 1306 which receives power from a heater controller via a heater power lead (shown as heater power lead 1308 in FIGS. 10-12).

As introduced above, a heater groove is formed into gas channel plate 110 and/or showerhead 112 to receive heat from a heater. Viewed as a cross-section, the sidewalls and bottom of a heater groove may make contact with a heater at several locations, potentially improving heat transfer from heater relative to configurations where a heater makes contact on one side only, such as a heater resting on a surface. It will be understood that the heater groove may be formed into gas channel plate 110 and/or showerhead 112 in virtually any suitable manner. For example, a heater groove may be milled and/or cast in some embodiments. Further, the heater groove may be shaped into virtually any suitable form. Non-limiting examples of shapes for a heater groove include annular, serpentine paths having twists in at least two directions, and spiral paths that may or may not include branches. Such shapes may be arranged in almost any suitable position within gas channel plate 110 and/or showerhead 112. For example, in some embodiments, heater grooves may be positioned around a center of gas channel plate 110 and/or showerhead 112 in a radially-symmetric arrangement.

In some embodiments, a retainer, shown as retainers 1310a and 1310b in FIG. 13, may be provided above heater 1304a and 1304b, respectively to apply a downward force to the heaters, potentially enhancing conduction between the heater groove and the heater. Further, in some of such embodiments, the retainer may have heat transfer properties that further enhance heat transfer from the heater to gas channel plate 110 and/or showerhead 112. For example, the retainer may be formed from a flexible aluminum wire that may help conduct heat from a top surface of the heater to upper sidewalls of the heater groove.

Additionally or alternatively, in some embodiments, a temperature of gas channel plate 110 may be adjusted using a suitable heat exchange fluid supplied to heat exchange surfaces thereon. For example, in one scenario, cool air may be provided to moderate heating provided by the heater. In another scenario, warm air may be provided in place of or to supplement heating provided by the heater. In each scenario, use of a heat exchange fluid may potentially smooth a thermal profile within gas channel plate 110, so that hot and/or cold spots may be avoided. Virtually any suitable heat exchange fluid may be employed without departing from the scope of the present disclosure. Example suitable heat exchange fluids include, but are not limited to, gases like air and nitrogen, and liquids like water and heat transfer oils.

The embodiment depicted in FIG. 13 shows a plurality of heat exchange structures 1312 separated from one another by gaps 1314 on a heat exchange surface 1316 of gas channel plate 110. Heat exchange structures 1312 and gaps 1314 provide surface area for heat transfer and flow space, respectively, for the heat exchange fluid.

It will be understood that heat exchange structures 1312 may have almost any suitable shape. The embodiment shown in FIG. 13 illustrates heat exchange structures 1312 as rectangularly-shaped, block-like structures projecting outward from heat exchange surface 1316. In some embodiments, heat exchange structures 1312 may be rectangular prisms that are 4 mm wide by 6 mm deep, within an acceptable tolerance, and that may have heights that vary between 12 mm and 5 mm, so that the volume of heat exchange structures 1312 may vary with position as described in more detail below. In some embodiments, gaps 1314 between heat exchange structures 1312 may be approximately 6-7 mm wide. Additionally or alternatively, in some embodiments, gaps 1314 may be sized so that they are no wider than one-half of a thickness of gas channel plate 110 at a location on gas channel plate 110 where heat exchange structures 1312 are positioned on gas channel plate 110. For example, in some embodiments, gaps 1314 may be sized according to a preselected ratio defined as of a distance from a base of heat exchange structure 1312 to diffusion surface 1012 divided by a distance between adjacent heat exchange structures 1312. In some embodiments, the ratio may be greater than 2. For example, in some non-limiting scenarios, the ratio may be in a range between 3 and 5. Spacing heat exchange structures 1312 in this way may avoid the formation of local hot and/or cold spots on diffusion surface 1012. Other non-limiting heat exchange structures may include outwardly projected fin- or vane-shaped structures, honeycomb or mesh type baffled structures, and stacked plates.

In some embodiments, the volume of heat exchange structures 1312 may vary according to a radial position on heat exchange surface 1316. By varying the volume according to radial position, it is possible that the amount of heat exchanged with the heat exchange fluid may be regulated. In the embodiment shown in FIG. 13, volume of heat exchange structures 1312 increases with radial distance from a center of gas channel plate 110. In one scenario according to this embodiment, less heat may be transferred to the heat exchange fluid near the center of the gas channel plate relative to an amount of heat transferred near the outer edge. As a result, the center region of the diffusion surface may be maintained at a comparatively higher temperature than the outer region. This approach may potentially prevent condensation of a low-vapor pressure process species near the process feed inlet, where the partial pressure of that species may be higher. Further, by transitioning to a lower temperature near the outer edge of the diffusion surface, the defect generation caused by gas phase reactions may potentially be avoided.

Heat exchange structures 1312 may be formed in any suitable manner and from any suitable material. For example, in some embodiments, heat exchange structures 1312 may be formed from aluminum, stainless steel, or titanium. Heat exchange structures 1312 may also be formed during fabrication of gas channel plate 110 or added at a later time. For example, in some embodiments, heat exchange structures 1312 may be machined into gas channel plate 110. In some other embodiments, heat exchange structures 1312 may be separate parts that may be added, subtracted, and rearranged on heat exchange surface 1316.

Heat exchange structures 1312 may be distributed in virtually any suitable arrangement on gas channel plate 110. In the embodiment shown in FIG. 13, heat exchange structures 1312 are distributed in an annular region, being radially arranged about a centerline of gas channel plate 110. FIG. 3 and FIGS. 10-12 also show examples of heat exchange structures 1312 arranged in circular patterns around process feed inlet 106 in an annular region of gas channel plate 110.

As shown in FIG. 13, heat exchange structures 1312 project into a heat exchange fluid channel 1318 formed between heat exchange surface 1316 and a heat exchange fluid director plate 1320 supported by a heat exchange fluid director plate support surface of gas channel plate 110. Thus, heat exchange fluid director plate 1320 and gas channel plate 110 form a heat exchanger in the region of heat exchange fluid channel 1318, where heat exchange fluid director plate 1320 directs heat exchange fluid in between of heat exchange structures 1312 and also across the tops of at least a portion of heat exchange structures 1312.

The broad flow direction arrows illustrated in FIG. 13 depict an example flow of heat exchange fluid from an inlet 1324 into heat exchange fluid channel 1318 where heat is exchanged with heat exchange structures 1312 and then exhausted via an outlet 1326. By arranging heat exchange structures 1312 in circular patterns around a center of gas channel plate 110 and directing the heat exchange fluid radially outward from inlet 1324, the heat exchange fluid flowing in heat exchange fluid channel 1318 may flow co-currently with process feed flowing within showerhead volume 108. Consequently, a temperature of the process feed at the edge of showerhead volume 108 may be at least as great as a temperature of the heat exchange fluid exiting outlet 1326. This may potentially avoid decomposition reactions within the process feed or on the various surfaces defining showerhead volume 108.

While the flow direction arrows in FIG. 13 depict a flow of heat exchange fluid flowing radially outward in a circularly symmetric flow, it will be appreciated that virtually any suitable flow of heat exchange fluid may be employed without departing from the scope of the present disclosure. For example, in some embodiments, heat exchange fluid may be directed radially inward from an outer edge of gas channel plate 110 toward island 312. In some of such embodiments, the locations of inlet 1324 and outlet 1326 may be reversed or otherwise suitable relocated. In still other embodiments, heat exchange fluid may be directed in other directions around and/or across heat exchange surface 1316 so that it flows around and/or above heat exchange structures 1312.

Figure 14:
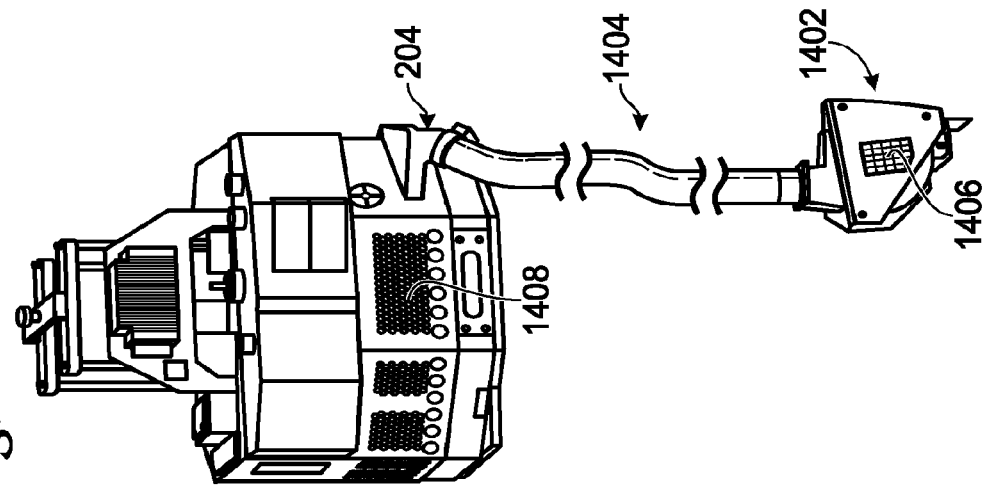
FIG. 14 schematically shows a blower and duct for providing air to a heat exchange plenum assembly according to an embodiment of the present disclosure.

In some embodiments, heat exchange fluid director plate 1320 may be included in heat exchange plenum assembly 204. Heat exchange plenum assembly 204 may provide ambient air as a heat exchange fluid to heat exchange surface 1316 via heat exchange fluid channel 1318 and then exhaust the air back into the ambient environment. FIG. 14 schematically shows heat exchange plenum assembly 204 fluidly coupled to an embodiment of a blower 1402 by a flexible duct 1404. As shown in FIG. 14, blower 1402 draws ambient air into intake 1406. The air is delivered by flexible duct 1404 to heat exchange plenum assembly 204. After passing over the heat exchange surface of the gas channel plate (not shown), the air is exhausted via exhaust holes 1408 into the ambient environment.

Figure 15:
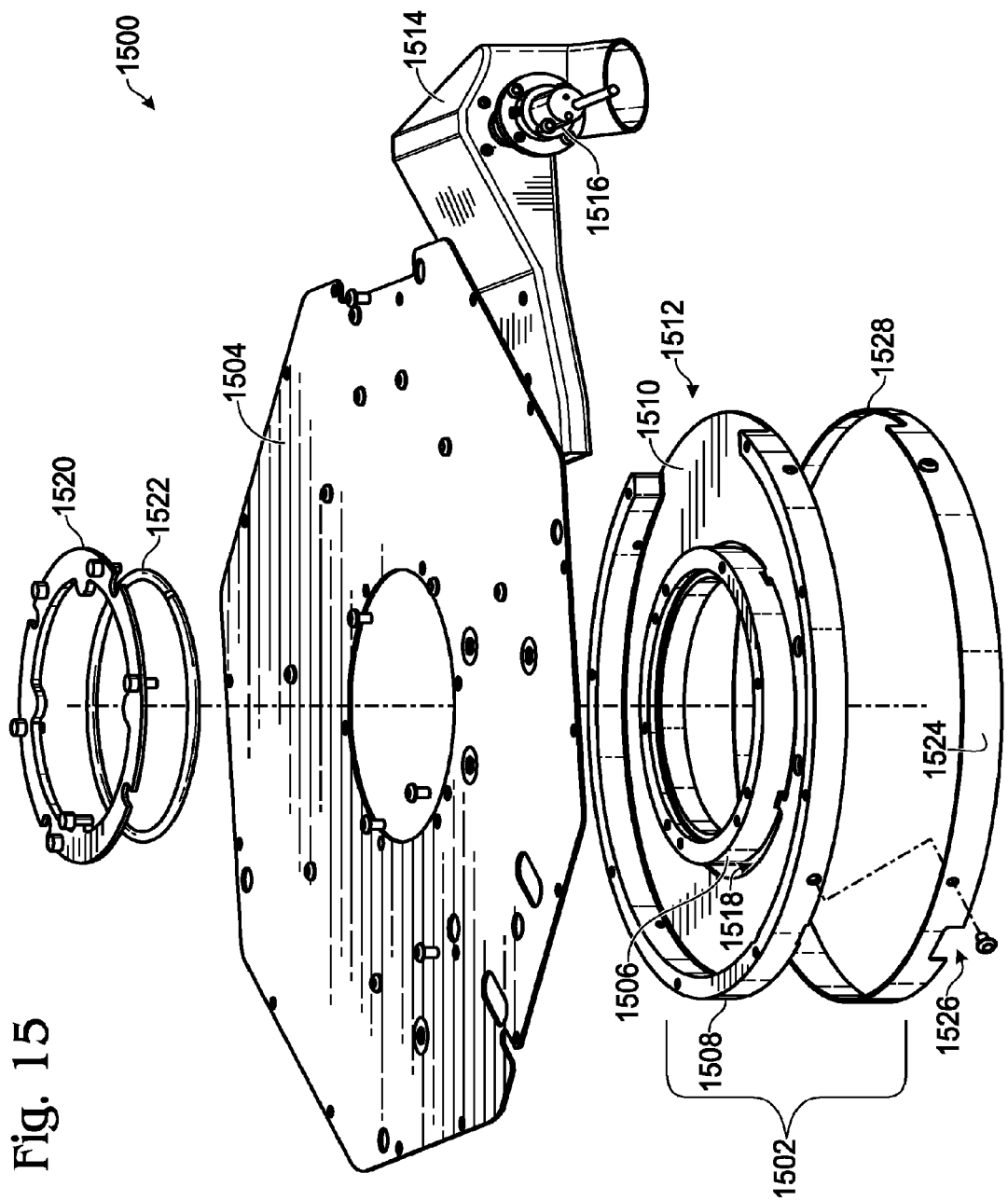
FIG. 15 schematically shows an exploded isometric view of a heat exchange plenum assembly according to an embodiment of the present disclosure.

FIG. 15 schematically shows an exploded isometric view of an embodiment of a heat exchange plenum assembly 1500. As shown in FIG. 15, heat exchange plenum assembly 1500 includes a heat exchange fluid director plate 1502 and a cover plate 1504. Heat exchange fluid director plate 1502 includes a ring-shaped inner wall 1506, a ring-shaped outer wall 1508 having a larger diameter than inner wall 1506, and a floor ring 1510 that connects inner wall 1506 and outer wall 1508. Outer wall 1508 includes opening 1512 to receive an inlet duct 1514 coupled to a blower (not shown). Inlet duct 1514 may include an optional switch 1516 used to control the blower. Floor ring 1510 includes one or more openings adjacent to inner wall 1506 that form inlets 1518.

In some embodiments, heat exchange fluid director plate 1502 is configured to be supported by a heat exchange fluid director plate support surface included on gas channel plate 110. For example, in some embodiments, inner wall 1506 may be sized to fit snugly about and/or be physically connected with island 312 of gas channel plate 110 for supporting heat exchange fluid director plate 1502. Additionally or alternatively, in some embodiments, heat exchange fluid director plate 1502 may be supported by island 312 via retainer 1520 and/or cover plate 1504. By supporting heat exchange fluid director plate 1502 on island 312, floor ring 1510 of heat exchange fluid director plate 1502 may be spaced from heat exchange surface 1316 of gas channel plate 110 so that heat exchange fluid channel 1318 is formed above heat exchange structures 1312. In turn, heat exchange fluid flowing in heat exchange fluid channel 1318 may flow between and above heat exchange structures 1312 while flowing from inlet 1324 to outlet 1326, as shown in FIG. 13. Consequently, heat exchange fluid channel 1318 may accommodate heat exchange structures 1312 of varying heights as described above, and may also exchange heat along top surfaces of heat exchange structures 1312 in contact with the heat exchange fluid.

Returning to FIG. 15, in some embodiments, one or more inlets 1518 may be distributed around a base of inner wall 1506, so that heat exchange fluid may be supplied in an annular flow to gas channel plate 110. In such embodiments, the assembly of heat exchange fluid director plate 1502 to cover plate 1504 via retainer 1520 and gasket 1522 forms an annular fluid flow space between inner wall 1506, outer wall 1508, cover plate 1504, and floor ring 1510. Thus, a heat exchange fluid may enter via opening 1512, travel around the annular flow space, and be distributed to heat exchange fluid channel 1318 via inlets 1518 where it may be redirected to travel radially outward toward the edges of gas channel plate 110. For example, FIG. 16 schematically shows a sectioned isometric view of an embodiment of a portion of inlet duct 1514 directing air toward an annular region 1602 formed between heat exchange fluid director plate 1502 and cover plate 1504. In the embodiment shown in FIG. 16, air flows radially outward from annular region 1602 via heat exchange fluid channel 1318 where it is exhausted from semiconductor process module 100 via exhaust holes 1408.

In some embodiments, heat exchange plenum assembly 1500 may include a flow restrictor positioned at outlet 1326 of heat exchange fluid channel 1318 and configured to adjust the flow of heat exchange fluid therein. For example, FIG. 15 shows an embodiment of a flow restrictor ring 1524 coupled to heat exchange fluid director plate 1502. As shown in FIG. 15, flow restrictor ring 1524 includes at least one restriction orifice 1526 positioned to restrict flow through outlet 1326 and a clearance opening 1528 configured to receive inlet duct 1514.

In some embodiments, the height of flow restrictor ring 1524 may be adjusted to vary the heat exchange characteristics of heat exchange fluid channel 1318. For example, given constant inlet and outlet cross-sectional areas, increasing the height of flow restrictor ring 1524 may increase the residence time of the heat exchange fluid within the heat exchange fluid channel 1318, potentially varying the radial temperature profile of the gas channel plate. It will be appreciated that adjustments to the cross-sectional areas of the inlet and outlet may have a similar effect.

It will be appreciated that thermal management of showerhead volume 108 may be systematically controlled by suitable temperatures sensors and heater and/or heat exchanger controllers in some embodiments. Thus, a temperature of gas channel plate 110, showerhead 112, flow expansion structure 1002 and/or other portions of semiconductor process module 100 thermally coupled with showerhead volume 108 may be adjusted during substrate processing, potentially avoiding condensation and/or gas phase reactions of the process feed.

For example, FIG. 16 shows a temperature sensor 1604 included in showerhead 112 and thermally coupled with showerhead volume 108. While temperature sensor 1604 is physically positioned in showerhead 112 in the embodiment shown in FIG. 16, it will be appreciated that one or more temperature sensors 1604 may be provided at suitable locations in showerhead 112 and/or gas channel plate 110. In some embodiments, a plurality of temperature sensors 1604 may be provided in various locations around showerhead 112 and/or gas channel plate 110 to provide a thermal map of those parts and nearby portions of showerhead volume 108. Virtually any suitable temperature sensor 1604 may be employed without departing from the scope of the present disclosure. Non-limiting examples include bi-junction thermocouples and resistance thermometers.

Temperature information collected by one or more temperature sensors 1604 may be provided to a thermal controller 1606 with which the temperature sensors 1604 are electrically connected. In some embodiments, thermal controller 1606 may include a heater controller for controlling heaters 1304 and/or a blower controller for controller blower 1402. In some embodiments, thermal controller 1606 may be included in system controller 202. In turn, thermal controller 1606 may adjust power supplied to heater 1304 via heater power connection 1306. Additionally or alternatively, in some embodiments, thermal controller 1606 may adjust operation of blower 1402 in response to temperature information provided by temperature sensors 1604. For example, thermal controller 1606 may turn blower 1402 off or on or vary the blower speed to adjust an amount of air delivered.

It will be understood that the hardware described herein may be used to adjust the temperature of the process feeds a showerhead volume in a semiconductor processing module and, in turn, deliver the process feeds from the showerhead volume to the substrate to process a substrate within the module.

FIG. 17 shows a flow chart for an embodiment of a method 1700 for processing a substrate in a processing environment of a reactor included in semiconductor processing module. Method 1700 may be performed by any suitable hardware and software. It will be appreciated that portions of the processes described in method 1700 may be omitted, reordered, and/or supplemented without departing from the scope of the present disclosure.

Method 1700 includes, at 1702, supporting the substrate with a susceptor within the reactor and, at 1704, supplying process feed to the reactor via a showerhead positioned above the substrate. For example, in an ALD process, the process feed may be supplied to the reactor via the showerhead so that a suitable coverage of a surface active species derived from the process feed is generated on a process surface of the substrate.

At 1706, method 1700 includes adjusting a temperature of the process feed within a showerhead volume upstream of the showerhead by supplying a heat exchange fluid to a heat exchange fluid channel into which a plurality of heat exchange structures extend so that the heat exchange fluid flows between and above the heat exchange structures within the heat exchange fluid channel, the heat exchange structures being thermally coupled with the showerhead volume.

In some embodiments, adjusting the temperature at 1706 may include, at 1708, receiving a temperature of a heat exchange surface from which the heat exchange structures extend from a temperature sensor thermally coupled with the heat exchange surface. For example, process feed temperature information may be received from one or more temperature sensors. If a temperature of the process feed is judged to be too low relative to a predetermined temperature, action may be taken to raise the temperature of the heat exchange surface so that a temperature of the process feed within the showerhead may be raised. Alternatively, if a temperature of the heat exchange surface is judged to be too high relative to a predetermined temperature, a different action may be taken to lower the temperature of the heat exchange surface so that the temperature of the process feed within the showerhead volume may be lowered.

For example, in some embodiments, method 1700 may include, at 1710, adjusting a power supplied to a heating element included in the heat exchange surface. In a scenario where the heat exchange surface exceeds the predetermined temperature, the power supplied to the heater may be reduced. Alternatively, in a scenario where the heat exchange surface is less than the predetermined temperature, the power supplied to the heater may be increased. It will be appreciated that almost any suitable method of controlling the heater power may be employed without departing from the scope of the present disclosure, including control schemes that include one or more of proportional, derivative, and integral elements.

As another example, in some embodiments, method 1700 may include, at 1712, adjusting power supplied to a blower or pump configured to supply heat exchange fluid to the heat exchange surface. In a scenario where the heat exchange surface exceeds the predetermined temperature, the power supplied to the blower or pump may be reduced. Alternatively, in a scenario where the heat exchange surface is less than the predetermined temperature, the power supplied to the blower or pump may be increased. It will be appreciated that almost any suitable method of controlling the blower or pump power may be employed without departing from the scope of the present disclosure, including control schemes that include one or more of proportional, derivative, and integral elements.

In some embodiments, the heater and the blower or pump may be operated concurrently. For example, in one scenario, a blower may provide cool air continuously while a heater power is adjusted to vary heat input to the heat exchange surface. In another scenario, a heater may provide a continuous heat input while a blower power is adjusted to vary cooling provided to the heat exchange surface. In yet another scenario, both heater and blower power may be adjusted concurrently to control heating and cooling of the heat exchange surface.

In some embodiments, method 1700 may be performed by a system process controller comprising a data-holding subsystem comprising instructions executable by a logic subsystem to perform the processes described herein. Virtually any suitable system process controller may be employed without departing from the scope of the present disclosure.

For example, FIG. 2 shows an embodiment of a system process controller 202 provided for controlling semiconductor process module 100. System process controller 202 may operate process module control subsystems, such as gas control subsystems, pressure control subsystems, temperature control subsystems, electrical control subsystems, and mechanical control subsystems. Such control subsystems may receive various signals provided by sensors, relays, and controllers and make suitable adjustments in response.

System process controller 202 comprises a computing system that includes a data-holding subsystem and a logic subsystem. The data-holding subsystem may include one or more physical, non-transitory, devices configured to hold data and/or instructions executable by the logic subsystem to implement the methods and processes described herein. The logic subsystem may include one or more physical devices configured to execute one or more instructions stored in the data-holding subsystem. The logic subsystem may include one or more processors that are configured to execute software instructions.

In some embodiments, such instructions may control the execution of process recipes. Generally, a process recipe includes a sequential description of process parameters used to process a substrate, such parameters including time, temperature, pressure, and concentration, etc., as well as various parameters describing electrical, mechanical, and environmental aspects of the tool during substrate processing. The instructions may also control the execution of various maintenance recipes used during maintenance procedures and the like. In some embodiments, such instructions may be stored on removable computer-readable storage media, which may be used to store and/or transfer data and/or instructions executable to implement the methods and processes described herein. It will be appreciated that any suitable removable computer-readable storage media may be employed without departing from the scope of the present disclosure. Non-limiting examples include DVDs, CD-ROMs, floppy discs, and flash drives.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A semiconductor process module comprising a reactor, wherein the reactor comprises:
    a gas channel plate, the gas channel plate comprising:
    a heat exchange surface including a plurality of heat exchange structures separated from one another by intervening gaps;
    a heat exchange fluid director plate support surface for supporting a heat exchange fluid director plate above the plurality of heat exchange structures so that at least a portion of the plurality of heat exchange structures are spaced from the heat exchange fluid director plate; and
    a purge gas channel fluidly communicating with an ambient environment at a location between the ambient environment and a gasket disposed between a showerhead and the gas channel plate.

2. The semiconductor process module of claim 1, further comprising a process feed inlet for supplying a process feed to a showerhead volume formed between a diffusion surface disposed opposite the heat exchange surface and the showerhead sealably coupled to the gas channel plate.

3. The semiconductor process module of claim 2, where the process feed inlet includes a flow expansion structure upstream of the process feed inlet, the flow expansion structure being aligned with a centerline of the process feed inlet.

4. The semiconductor process module of claim 3, where the flow expansion structure includes a concentric conical expansion formed on an inner surface of the flow expansion structure.

5. The semiconductor process module of claim 2, further comprising a pulse valve manifold positioned upstream of the gas channel plate.

6. The semiconductor process module of claim 2, where the diffusion surface has a radially symmetric profile with respect to a centerline of the gas channel plate, the diffusion surface becoming closer to the showerhead as distance from a centerline of the gas channel plate increases.

7. The semiconductor process module of claim 6, where the radially symmetric profile includes a portion of the diffusion surface being disposed at an angle of between 0 and 5 degrees with respect to a reference plane defining a widest portion of the showerhead volume.

8. The semiconductor process module of claim 2, where the diffusion surface has a radially symmetric profile with respect to a centerline of the gas channel plate, where the radially symmetric profile includes a portion of the diffusion surface disposed at an angle of between 0 and 5 degrees with respect to a reference plane defining a widest portion of the showerhead volume, and where an upper surface of the showerhead facing the showerhead volume is spaced from the portion of the diffusion surface so that the portion of the diffusion surface and a respective portion of the upper surface remain a constant distance apart as distance from a centerline of the gas channel plate increases.

9. The semiconductor process module of claim 2, where the gas channel plate is sealably coupled to the showerhead by a gasket positioned within 20 mm of a showerhead distribution hole included in the showerhead.

10. The semiconductor process module of claim 1, further comprising: a heating element disposed in a spiral groove included in the heat exchange surface; a temperature controller electrically connected with the heating element for adjusting a temperature of the heating element in response to a temperature of the heat exchange surface.

11. The semiconductor process module of claim 10, where the showerhead includes a heating element independent from the heating element included in the heat exchange surface.

12. A semiconductor reactor comprising a gas channel plate, wherein the gas channel plate comprises:
    a heat exchange surface including a plurality of heat exchange structures separated from one another by intervening gaps;
    a heat exchange fluid director plate support surface for supporting a heat exchange fluid director plate above the plurality of heat exchange structures so that at least a portion of the plurality of heat exchange structures are spaced from the heat exchange fluid director plate; and
    a purge gas channel fluidly communicating with an ambient environment at a location between the ambient environment and a gasket disposed between a showerhead and the gas channel plate.

13. The semiconductor reactor of claim 12, further comprising a process feed inlet for supplying a process feed to a showerhead volume formed between a diffusion surface disposed opposite the heat exchange surface and the showerhead sealably coupled to the gas channel plate.

14. The semiconductor reactor of claim 13, where the process feed inlet includes a flow expansion structure upstream of the process feed inlet, the flow expansion structure being aligned with a centerline of the process feed inlet.

15. The semiconductor reactor of claim 14, where the flow expansion structure includes a concentric conical expansion formed on an inner surface of the flow expansion structure.

16. A processing tool comprising the semiconductor process module of claim 1.

17. A gas channel plate for a semiconductor process module, the gas channel plate comprising:
    a heat exchange surface including a plurality of heat exchange structures separated from one another by intervening gaps;
    a heat exchange fluid director plate support surface for supporting a heat exchange fluid director plate above the plurality of heat exchange structures so that at least a portion of the plurality of heat exchange structures are spaced from the heat exchange fluid director plate; and
    a purge gas channel fluidly communicating with an ambient environment at a location between the ambient environment and a gasket disposed between a showerhead and the gas channel plate.

\* \* \* \* \*